US012751195B2

(12) United States Patent
Yamazaki et al.

(10) Patent No.: US 12,751,195 B2
(45) Date of Patent: Sep. 29, 2026

(54) DISPLAY DEVICE, METHOD FOR MANUFACTURING DISPLAY DEVICE, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Ryota Hodo, Atsugi (JP); Yasuhiro Jinbo, Isehara (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 444 days.

(21) Appl. No.: 18/283,511

(22) PCT Filed: Mar. 30, 2022

(86) PCT No.: PCT/IB2022/052921
§ 371 (c)(1),
(2) Date: Sep. 22, 2023

(87) PCT Pub. No.: WO2022/214916
PCT Pub. Date: Oct. 13, 2022

(65) Prior Publication Data

US 2024/0179935 A1 May 30, 2024

(30) Foreign Application Priority Data

Apr. 8, 2021 (JP) ................................ 2021-065971

(51) Int. Cl.
*H10K 71/13* (2023.01)
*H10K 50/00* (2023.01)
(Continued)

(52) U.S. Cl.
CPC ............ *H10K 71/13* (2023.02); *H10K 50/00* (2023.02); *H10K 50/13* (2023.02); *H10K 50/19* (2023.02);
(Continued)

(58) Field of Classification Search
CPC ...... H10K 71/13; H10K 71/233; H10K 71/60; H10K 59/00; H10K 59/873; H10K 50/00; H10K 50/13; H10K 50/19; H10K 50/844
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102738201 A 10/2012
CN 103311449 A 9/2013
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Anne M Hines
(74) *Attorney, Agent, or Firm* — Eric J. Robinson; Robinson Intellectual Property Law Office, P.C.

(57) ABSTRACT

A display device with high display quality and high reliability is provided. The display device includes a first light-emitting element, a second light-emitting element positioned to be adjacent to the first light-emitting element, a first protective layer, a second protective layer, and an insulating layer. The first light-emitting element includes a first pixel electrode, a first EL layer, and a common elec-
(Continued)

trode. The second light-emitting element includes a second pixel electrode, a second EL layer, and the common electrode. The first EL layer is provided over the first pixel electrode, and the second EL layer is provided over the second pixel electrode. The first protective layer includes a region overlapping with a side surface of the first pixel electrode, a side surface of the second pixel electrode, a side surface of the first EL layer, and a side surface of the second EL layer. The insulating layer is provided over the first protective layer, and the second protective layer is provided over the insulating layer. The common electrode is provided over the first EL layer, over the second EL layer, and over the second protective layer.

18 Claims, 39 Drawing Sheets

(51) Int. Cl.

| | |
|---|---|
| ***H10K 50/13*** | (2023.01) |
| ***H10K 50/19*** | (2023.01) |
| ***H10K 50/844*** | (2023.01) |
| ***H10K 59/00*** | (2023.01) |
| ***H10K 59/80*** | (2023.01) |
| ***H10K 71/20*** | (2023.01) |
| ***H10K 71/60*** | (2023.01) |
| *H10K 50/10* | (2023.01) |

(52) U.S. Cl.
CPC .......... *H10K 50/844* (2023.02); *H10K 59/00* (2023.02); *H10K 59/873* (2023.02); *H10K 71/233* (2023.02); *H10K 71/60* (2023.02); *H10K 50/10* (2023.02); *H10K 59/871* (2023.02); *H10K 59/8722* (2023.02); *H10K 59/8731* (2023.02)

(56) References Cited

U.S. PATENT DOCUMENTS

| | | | |
|---|---|---|---|
| 7,399,991 | B2 | 7/2008 | Seo et al. |
| 8,829,509 | B2 | 9/2014 | Nakatani |
| 8,877,532 | B2 | 11/2014 | Hiroki et al. |
| 8,963,170 | B2 | 2/2015 | Yokoyama et al. |
| 9,029,848 | B2 | 5/2015 | Hatakeyama et al. |
| 9,437,832 | B2 | 9/2016 | Sakuishi et al. |
| 10,079,353 | B2 | 9/2018 | Sakuishi et al. |
| 10,141,526 | B2 | 11/2018 | Sakuishi et al. |
| 11,678,550 | B2 | 6/2023 | Kato |
| 2002/0072139 | A1 | 6/2002 | Kashiwabara |
| 2011/0148290 | A1 | 6/2011 | Oota |
| 2012/0252149 | A1 | 10/2012 | Hiroki et al. |
| 2012/0252150 | A1 | 10/2012 | Hiroki et al. |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto. et al. |
| 2015/0069360 | A1 | 3/2015 | Sato |
| 2015/0076476 | A1 | 3/2015 | Odaka et al. |
| 2015/0236280 | A1 | 8/2015 | Sakuishi et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0006259 | A1 | 1/2018 | Paek et al. |
| 2018/0190908 | A1 | 7/2018 | Ke et al. |
| 2019/0181368 | A1 | 6/2019 | Kim et al. |
| 2019/0245021 | A1 | 8/2019 | Kim et al. |
| 2019/0288226 | A1 | 9/2019 | Li et al. |
| 2020/0203662 | A1 | 6/2020 | Mollard et al. |
| 2021/0265432 | A1 * | 8/2021 | Kato .................... H10K 59/873 |
| 2023/0301151 | A1 | 9/2023 | Kato |

FOREIGN PATENT DOCUMENTS

| | | | |
|---|---|---|---|
| CN | 112314056 | A | 2/2021 |
| JP | 2000-036385 | A | 2/2000 |
| JP | 2002-324673 | A | 11/2002 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2010-033936 | A | 2/2010 |
| JP | 2012-174356 | A | 9/2012 |
| JP | 2012-216501 | A | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2015-173104 | A | 10/2015 |
| JP | 2016-197494 | A | 11/2016 |
| JP | 2019-179696 | A | 10/2019 |
| JP | 2020-160305 | A | 10/2020 |
| KR | 2012-0112074 | A | 10/2012 |
| KR | 2016-0124756 | A | 10/2016 |
| TW | 201240077 | | 10/2012 |
| TW | 201539779 | | 10/2015 |
| WO | WO-2015/125046 | | 8/2015 |
| WO | WO-2018/087625 | | 5/2018 |
| WO | WO-2020/004086 | | 1/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56) References Cited

OTHER PUBLICATIONS

International Search Report (Application No. PCT/IB2022/052921) Dated Jun. 28, 2022.
Written Opinion (Application No. PCT/IB2022/052921) Dated Jun. 28, 2022.

* cited by examiner

FIG. 2A
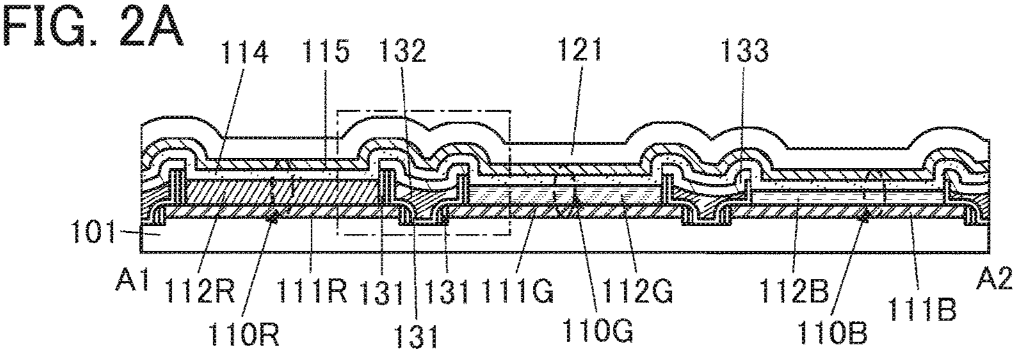
FIG. 2B
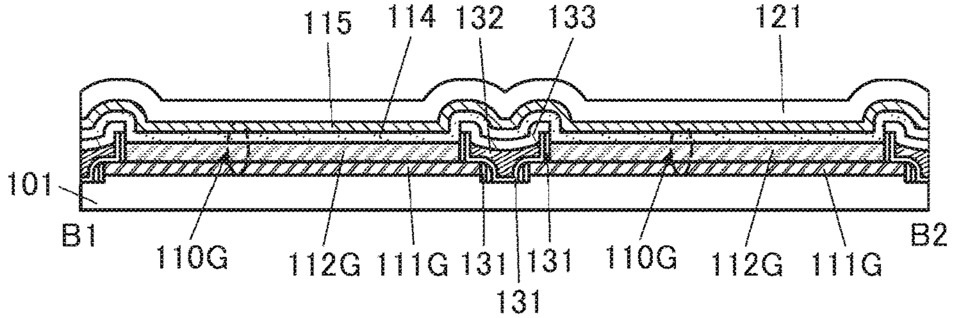
FIG. 2C1
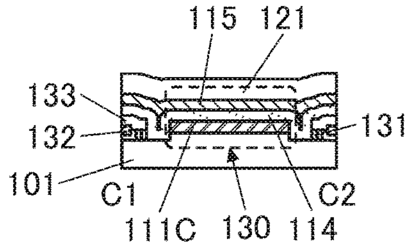
FIG. 2C2
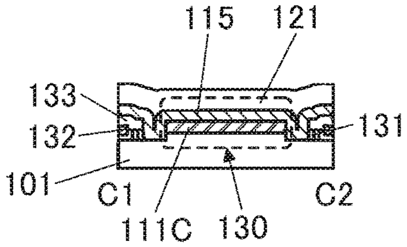
FIG. 2D
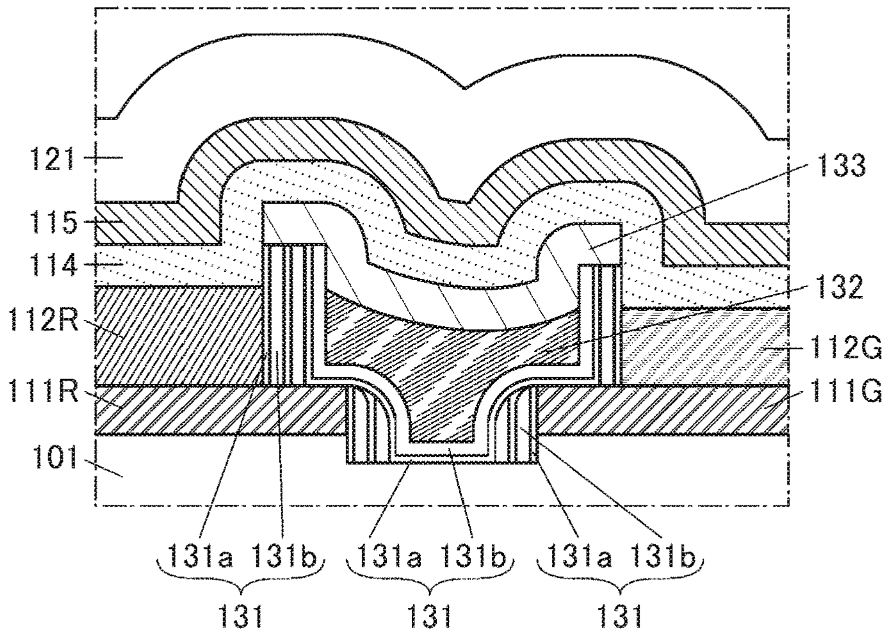

FIG. 7A1
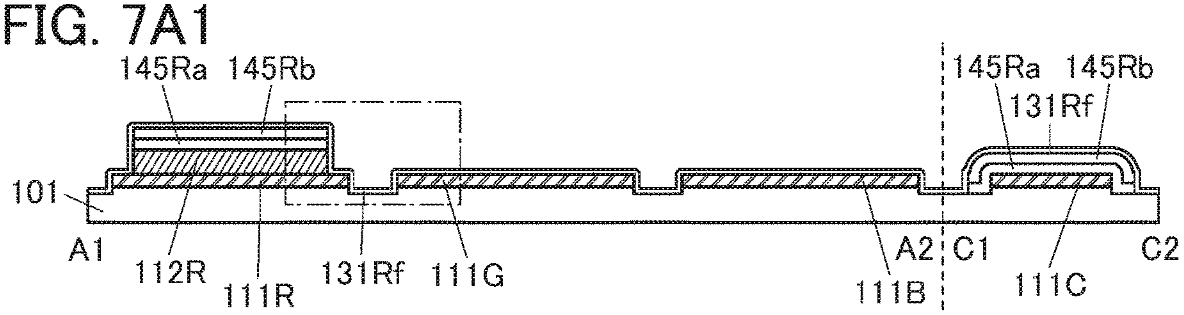
FIG. 7A2
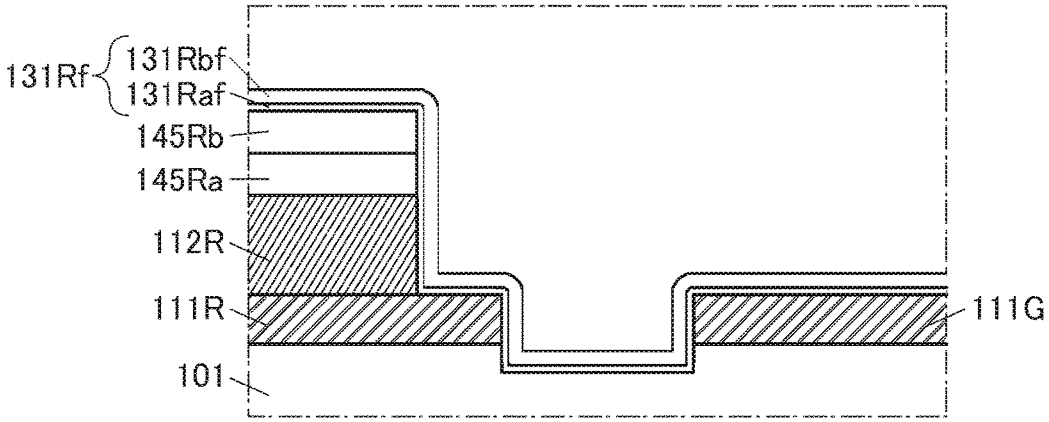
FIG. 7B1
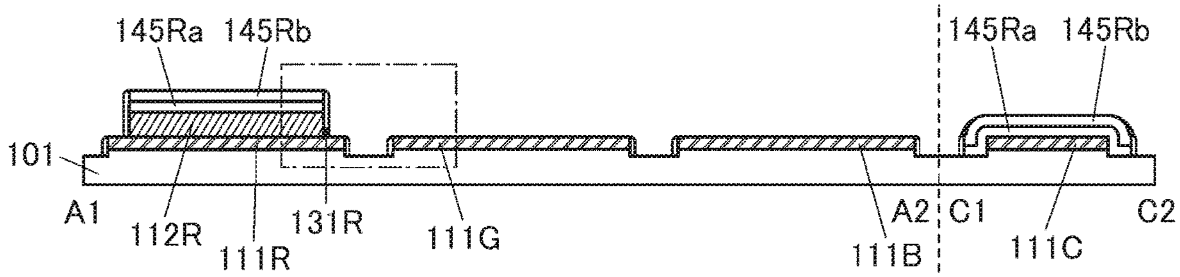
FIG. 7B2
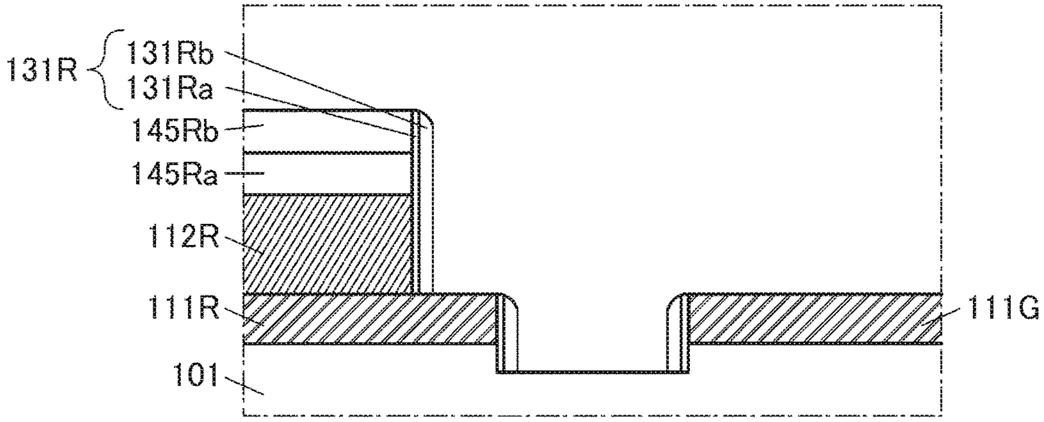

FIG. 9A1
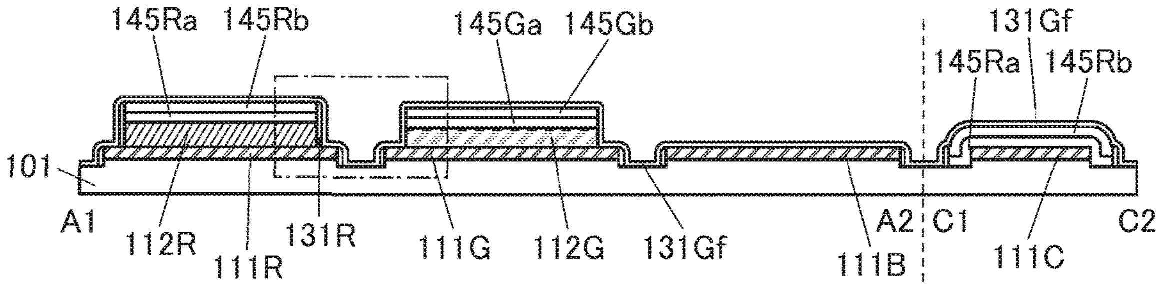
FIG. 9A2
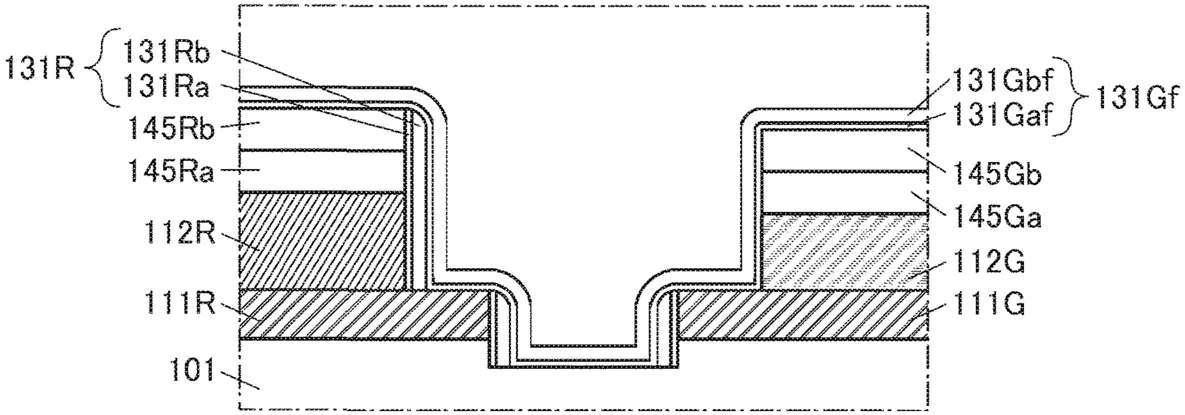
FIG. 9B1
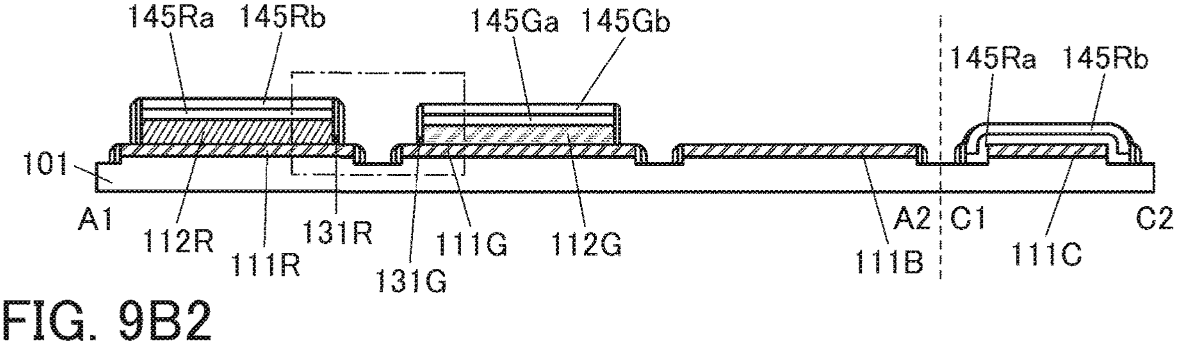
FIG. 9B2
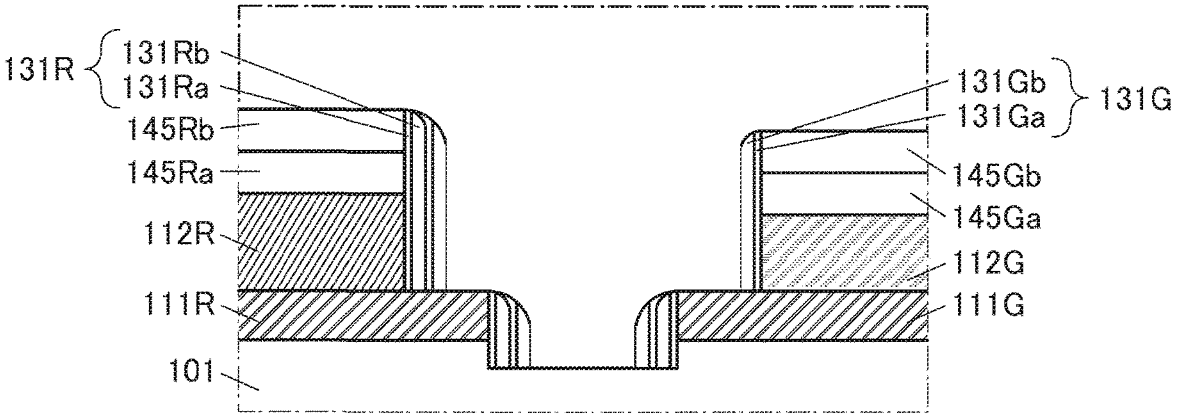

FIG. 12A
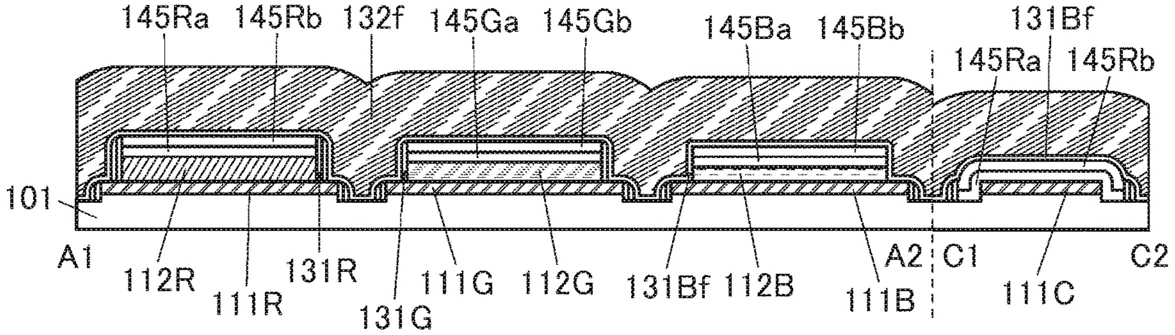
FIG. 12B1
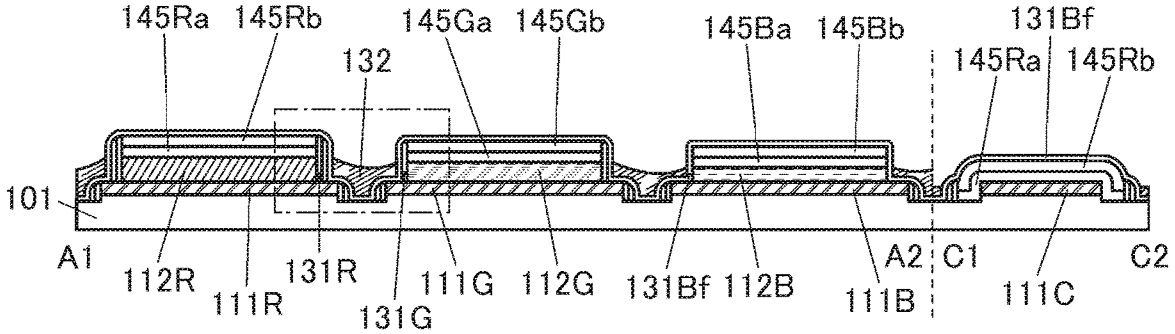
FIG. 12B2
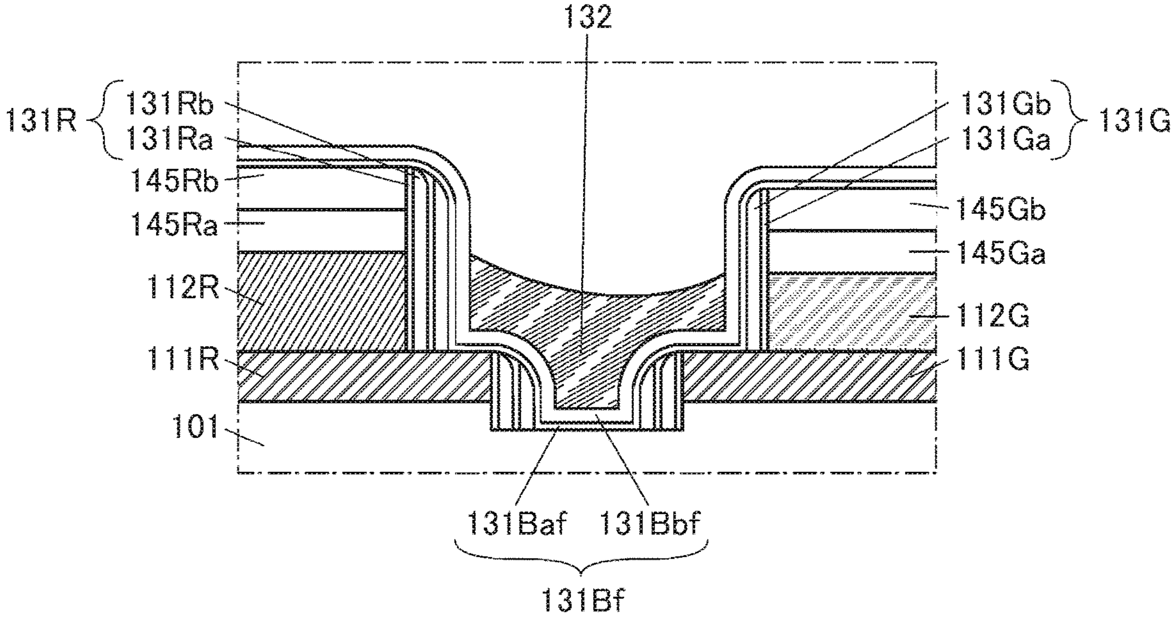

FIG. 14A
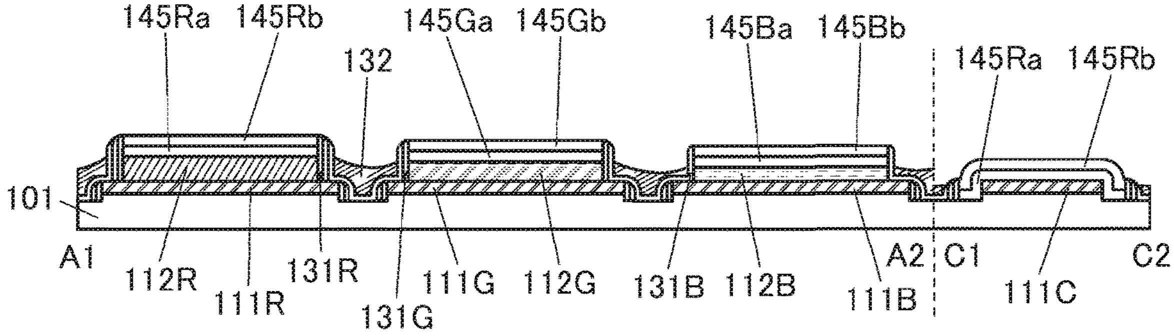
FIG. 14B1
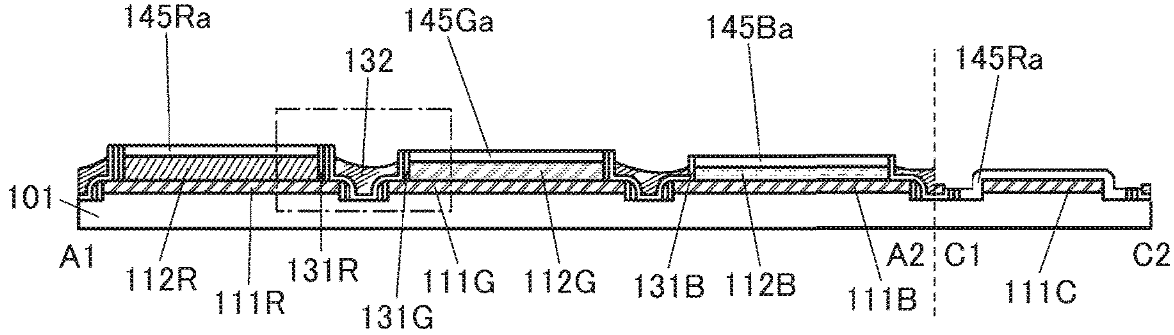
FIG. 14B2
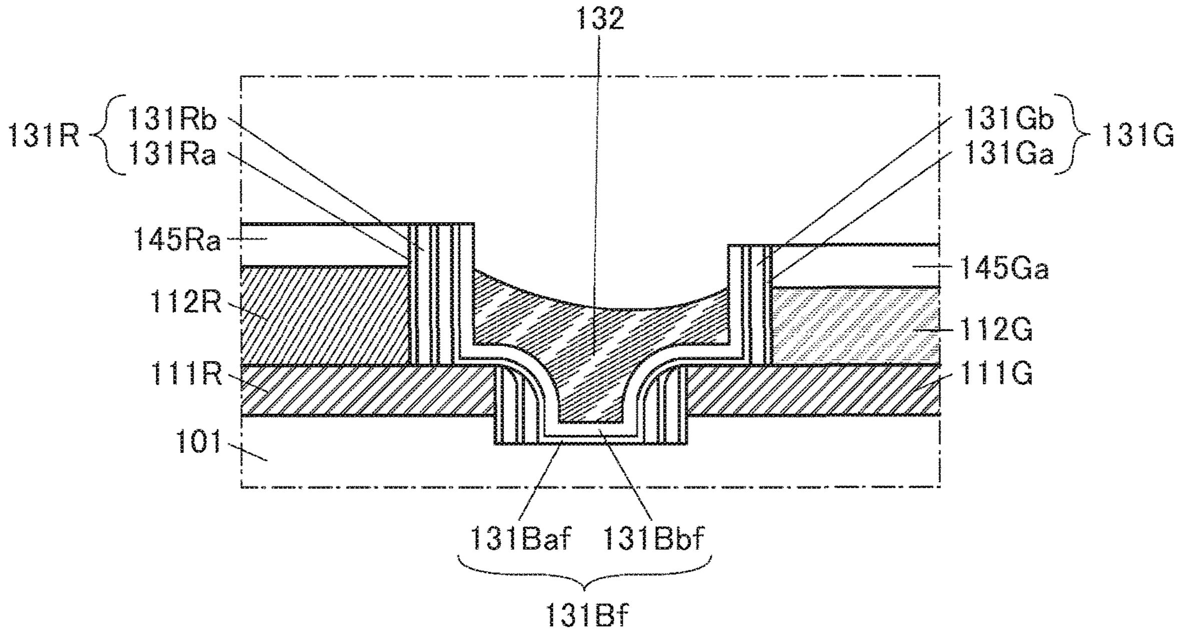

FIG. 15A
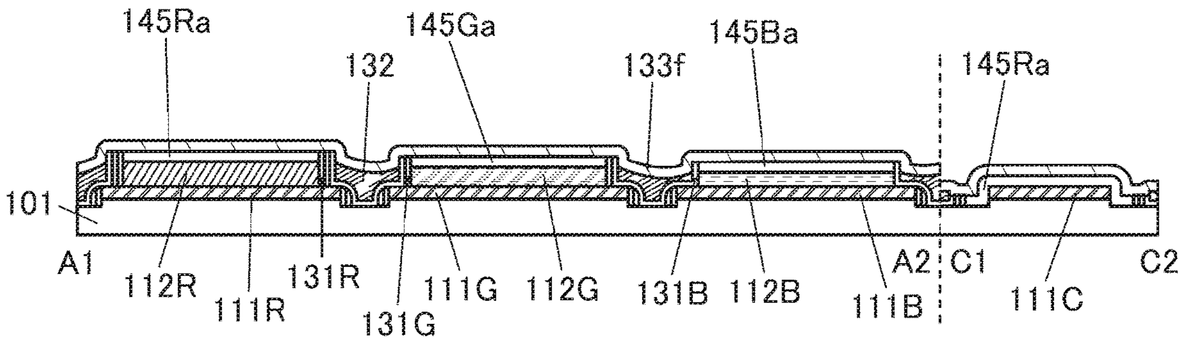
FIG. 15B1
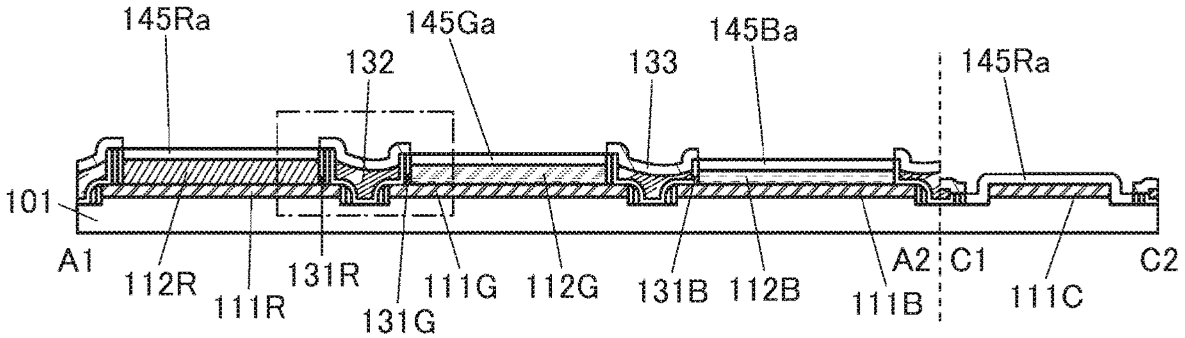
FIG. 15B2
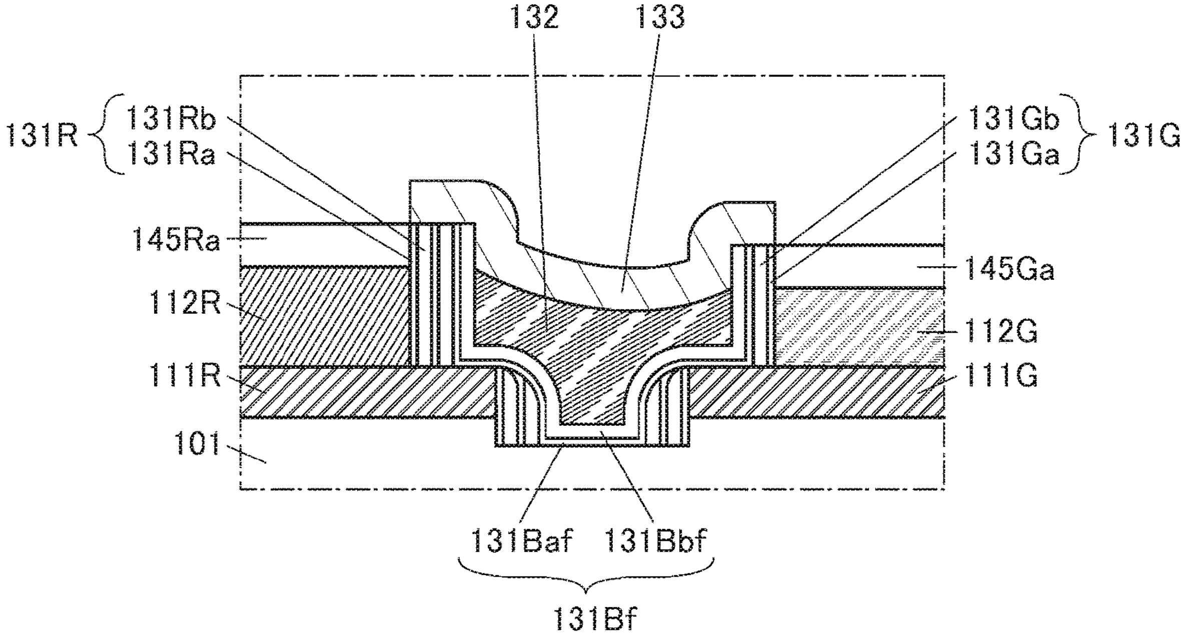

200A

200B

200C

112R

DISPLAY DEVICE, METHOD FOR MANUFACTURING DISPLAY DEVICE, DISPLAY MODULE, AND ELECTRONIC DEVICE

TECHNICAL FIELD

One embodiment of the present invention relates to a display device and a manufacturing method thereof. One embodiment of the present invention relates to a display module and an electronic device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with a higher definition. An example of a device required to have the highest resolution is a device for virtual reality (VR) or augmented reality (AR).

Examples of display devices that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device, for example; thus, a thin, lightweight, high-contrast, and low-power display device can be achieved. Patent Document 1, for example, discloses an example of a display device using an organic EL element.

Patent Document 2 discloses a display device using an organic EL element for VR.

REFERENCE

Patent Document

[Patent Document 1] Japanese Published Patent Application No. 2002-324673

[Patent Document 2] PCT International Publication No. 2018/087625

SUMMARY OF THE INVENTION

Problems to be Solved by the Invention

An object of one embodiment of the present invention is to provide a display device with high display quality. An object of one embodiment of the present invention is to provide a highly reliable display device. An object of one embodiment of the present invention is to provide a display device with low power consumption. An object of one embodiment of the present invention is to provide a display device that easily achieves higher resolution. An object of one embodiment of the present invention is to provide an inexpensive display device. An object of one embodiment of the present invention is to provide a display device with both high display quality and high resolution. An object of one embodiment of the present invention is to provide a high-contrast display device. An object of one embodiment of the present invention is to provide a display device having a novel structure.

An object of one embodiment of the present invention is to provide a method for manufacturing a display device with high display quality. An object of one embodiment of the present invention is to provide a method for manufacturing a highly reliable display device. An object of one embodiment of the present invention is to provide a method for manufacturing a display device with low power consumption. An object of one embodiment of the present invention is to provide a method for manufacturing a display device that easily achieves higher resolution. An object of one embodiment of the present invention is to provide a method for manufacturing a display device at low cost. An object of one embodiment of the present invention is to provide a method for manufacturing a display device with both high display quality and high resolution. An object of one embodiment of the present invention is to provide a method for manufacturing a high-contrast display device. An object of one embodiment of the present invention is to provide a method for manufacturing a display device having a novel structure.

Note that the description of these objects does not preclude the presence of other objects. Note that one embodiment of the present invention does not have to achieve all the objects. Note that other objects can be derived from the description of the specification, the drawings, the claims, and the like.

Means for Solving the Problems

One embodiment of the present invention is a display device including a first light-emitting element, a second light-emitting element positioned to be adjacent to the first light-emitting element, a first protective layer, a second protective layer, and an insulating layer. The first light-emitting element includes a first pixel electrode, a first EL layer, and a common electrode. The second light-emitting element includes a second pixel electrode, a second EL layer, and the common electrode. The first EL layer is provided over the first pixel electrode. The second EL layer is provided over the second pixel electrode. The first protective layer includes a region overlapping with a side surface of the first pixel electrode, a side surface of the second pixel electrode, a side surface of the first EL layer, and a side surface of the second EL layer. The insulating layer is provided over the first protective layer. The second protective layer is provided over the insulating layer. The common electrode is provided over the first EL layer, over the second EL layer, and over the second protective layer.

Alternatively, in the above embodiment, the insulating layer may be provided between the first EL layer and the second EL layer.

Alternatively, in the above embodiment, the display device may include a third protective layer, and the third protective layer may include a region in contact with a side surface and a bottom surface of the first protective layer.

Alternatively, in the above embodiment, the first to third protective layers may contain an inorganic material.

Alternatively, in the above embodiment, the first protective layer may include a region in contact with a side surface and a bottom surface of the insulating layer, the second protective layer may include a region in contact with a top surface of the insulating layer, and the first protective layer and the second protective layer may each contain nitride.

Alternatively, in the above embodiment, the first protective layer and the second protective layer may contain at least one of silicon nitride, aluminum nitride, and hafnium nitride. Alternatively, in the above embodiment, the insulating layer may contain an organic material.

Alternatively, in the above embodiment, a common layer may be provided between the first EL layer, the second EL layer, and the second protective layer, and the common electrode, and the common layer may include at least one of a hole-injection layer, a hole-transport layer, a hole-blocking layer, an electron-blocking layer, an electron-transport layer, and an electron-injection layer.

Alternatively, in the above embodiment, a space between the side surface of the first EL layer and the side surface of the second EL layer may include a region of 1 μm or smaller.

Alternatively, in the above embodiment, the space between the side surface of the first EL layer and the side surface of the second EL layer may include a region of 100 nm or smaller. A display module including the display device of one embodiment of the present invention and at least one of a connector and an integrated circuit is also one embodiment of the present invention.

An electronic device including the display module of one embodiment of the present invention and at least one of a battery, a camera, a speaker, and a microphone is also one embodiment of the present invention.

Alternatively, one embodiment of the present invention is a method for manufacturing a display device, which includes forming a first pixel electrode and a second pixel electrode over an insulating surface; forming a first EL film and a first sacrificial film in sequence over the first pixel electrode and over the second pixel electrode; processing the first sacrificial film and the first EL film to form a first sacrificial layer and a first EL layer, respectively, which include a region overlapping with the first pixel electrode; forming a first protective film covering at least a side surface of the first EL layer and a side surface and a top surface of the first sacrificial layer; processing the first protective film to form a first protective layer comprising a region overlapping with the side surface of the first EL layer; forming a second EL film and a second sacrificial film in sequence over the first sacrificial layer and over the second pixel electrode; processing the second sacrificial film and the second EL film to form a second sacrificial layer and a second EL layer, respectively, which include a region overlapping with the second pixel electrode; forming a second protective film covering at least a top surface of the first sacrificial layer, a top surface and a side surface of the second sacrificial layer, a side surface of the first protective layer, and a side surface of the second EL layer; forming an insulating film over the second protective film; processing the insulating film to form an insulating layer between the first EL layer and the second EL layer; processing the second protective film to form a second protective layer between the first protective layer and the insulating layer and between the second EL layer and the insulating layer; forming a third protective film over the first sacrificial layer, over the second sacrificial layer, and over the insulating layer; processing the third protective film to form a third protective layer over the insulating layer; removing the first sacrificial layer and the second sacrificial layer; and forming a common electrode over the first EL layer, over the second EL layer, and over the third protective layer.

Alternatively, in the above embodiment, a fourth protective film may be formed after the formation of the first protective film so as to include a region in contact with the first protective film, and a fifth protective film may be formed after the formation of the second protective film so as to include a region in contact with the second protective film.

Alternatively, in the above embodiment, the first protective film and the second protective film may be formed by an ALD method, and the third to fifth protective films may be formed by a sputtering method or a CVD method.

Alternatively, in the above embodiment, the insulating film may be formed by a spin coating method, a spraying method, a screen printing method, or a painting method.

Alternatively, in the above embodiment, the insulating film may be processed by a photolithography method.

Alternatively, in the above embodiment, the first protective film, the second protective film, the fourth protective film, and the fifth protective film may be processed by a dry etching method.

Alternatively, in the above embodiment, before the formation of the common electrode, at least one of a hole-injection layer, a hole-transport layer, a hole-blocking layer, an electron-blocking layer, an electron-transport layer, and an electron-injection layer may be formed as a common layer over the first EL layer, over the second EL layer, and over the insulating layer.

Effect of the Invention

According to one embodiment of the present invention, a display device with high display quality can be provided. According to one embodiment of the present invention, a highly reliable display device can be provided. According to one embodiment of the present invention, a display device with low power consumption can be provided. According to one embodiment of the present invention, a display device that easily achieves higher resolution can be provided. According to one embodiment of the present invention, a display device with both high display quality and high resolution can be provided. According to one embodiment of the present invention, an inexpensive display device can be provided. According to another embodiment of the present invention, a high-contrast display device can be provided. According to one embodiment of the present invention, a display device having a novel structure can be provided.

According to one embodiment of the present invention, a method for manufacturing a display device with high display quality can be provided. According to one embodiment of the present invention, a method for manufacturing a highly reliable display device can be provided. According to one embodiment of the present invention, a method for manufacturing a display device with low power consumption can be provided. According to one embodiment of the present invention, a method for manufacturing a display device that easily achieves higher resolution can be provided. According to one embodiment of the present invention, a method for manufacturing a display device with both high display quality and high resolution can be provided. According to one embodiment of the present invention, a method for manufacturing a display device at low cost can be provided.

According to one embodiment of the present invention, a method for manufacturing a high-contrast display device can be provided. According to one embodiment of the present invention, a method for manufacturing a display device having a novel structure can be provided.

Note that the description of these effects does not preclude the presence of other effects. Note that one embodiment of the present invention does not necessarily have all of these effects. Note that other effects can be derived from the description of the specification, the drawings, and the claims.

BRIEF DESCRIPTION OF THE DRAWINGS

FIG. 2A, FIG. 2B, FIG. 2C1, FIG. 2C2, and FIG. 2D are cross-sectional views illustrating a structure example of a display device.

FIG. 7A1, FIG. 7A2, FIG. 7B1, and FIG. 7B2 are cross-sectional views illustrating an example of a method for manufacturing a display device.

FIG. 9A1, FIG. 9A2, FIG. 9B1, and FIG. 9B2 are cross-sectional views illustrating an example of a method for manufacturing a display device.

FIG. 12A, FIG. 12B1, and FIG. 12B2 are cross-sectional views illustrating an example of a method for manufacturing a display device.

FIG. 14A, FIG. 14B1, and FIG. 14B2 are cross-sectional views illustrating an example of a method for manufacturing a display device.

FIG. 15A, FIG. 15B1, and FIG. 15B2 are cross-sectional views illustrating an example of a method for manufacturing a display device.

MODE FOR CARRYING OUT THE INVENTION

Figure 1:
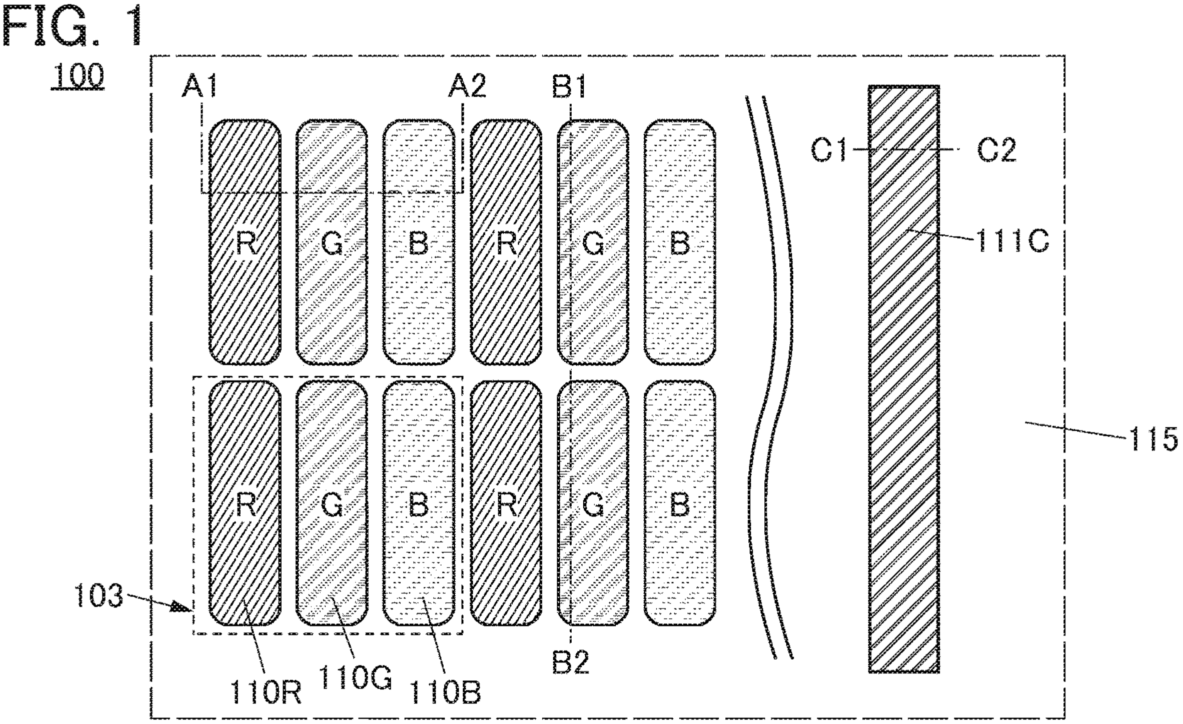
FIG. 1 is a top view illustrating a structure example of a display device.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the description of the embodiments below.

Note that in structures of the present invention described below, the same reference numerals are commonly used for the same portions or portions having similar functions in different drawings, and a repeated description thereof is omitted. Furthermore, the same hatch pattern is used for the portions having similar functions, and the portions are not especially denoted by reference numerals in some cases.

Note that in each drawing described in this specification and the like, the size, the layer thickness, or the region of each component is exaggerated for clarity in some cases. Therefore, the size, the layer thickness, or the region is not limited to the illustrated scale.

Note that ordinal numbers such as “first” and “second” in this specification are used in order to avoid confusion among components and do not limit the number of components.

In this specification and the like, the terms “film” and “layer” can be interchanged with each other depending on the case or circumstances. For example, in some cases, the term “conductive layer” or “insulating layer” can be interchanged with the term “conductive film” or “insulating film.”

Note that in this specification and the like, an EL layer refers to a layer that contains at least a light-emitting substance (also referred to as a light-emitting layer) or a stack including the light-emitting layer provided between a pair of electrodes of a light-emitting element.

In this specification and the like, a display panel that is one embodiment of a display device has a function of displaying (outputting), for example, an image on (to) the display surface. Thus, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a structure example of a display device of one embodiment of the present invention and an example of a method for manufacturing the display device will be described.

One embodiment of the present invention is a display device including a light-emitting element (also referred to as a light-emitting device). The display device includes at least two light-emitting elements which emit light of different colors. The light-emitting elements each include a pair of electrodes and an EL layer therebetween. As the light-emitting elements, electroluminescent elements such as organic EL elements or inorganic EL elements can be used. Besides, light-emitting diodes (LEDs) can be used. The light-emitting elements of one embodiment of the present invention are preferably organic EL elements (organic electroluminescent elements). Two or more light-emitting elements emitting different colors include respective EL layers containing different materials. For example, when three kinds of light-emitting elements that emit red (R) light, green (G) light, and blue (B) light are included, a full-color display device can be achieved.

Here, as a way of forming EL layers separately between light-emitting elements of different colors, it is known that the EL layers are formed by an evaporation method using a shadow mask such as a metal mask. However, this method causes a deviation from the designed shape and position of an island-shaped organic film due to various influences such as the accuracy of the metal mask, the positional deviation between the metal mask and a substrate, a warp of the metal mask, and expansion of the outline of a deposited film due to vapor scattering, for example; accordingly, it is difficult to achieve high resolution and high aperture ratio. In addition, dust derived from a material attached to the metal mask in evaporation is generated in some cases. Such dust might cause defective patterning of the light-emitting elements. In addition, a short circuit derived from the dust may occur. A step of cleaning the material attached to the metal mask is necessary. Thus, a measure has been taken for pseudo increase in resolution (also referred to as pixel density) by employing unique pixel arrangement such as PenTile arrangement, for example.

In one embodiment of the present invention, fine patterning of an EL layer is performed without a shadow mask such as a metal mask. This can achieve a display device with high resolution and a high aperture ratio, which has been difficult to achieve. Moreover, EL layers can be separately formed, enabling the display device to perform extremely clear display with high contrast and high display quality.

In this specification and the like, a device manufactured using a metal mask or an FMM (a fine metal mask or a high-resolution metal mask) is sometimes referred to as a device having an MM (metal mask) structure. In addition, in this specification and the like, a device manufactured without using a metal mask or an FMM is sometimes referred to as a device having an MML (metal maskless) structure.

Here, a description is made on a case where light-emitting elements of two colors (a first light-emitting element and a second light-emitting element) are separately formed, for simplicity. First, a first pixel electrode and a second pixel electrode are formed over a substrate. Next, a first EL film and a first sacrificial film are formed in this order over the first pixel electrode and over the second pixel electrode. Subsequently, a resist mask is formed over the first sacrificial film. Next, the first sacrificial film and the first EL film are processed with use of the resist mask, whereby a first sacrificial layer and a first EL layer each of which includes a region overlapping with the first pixel electrode are formed. Note that in this specification and the like, a sacrificial film may be referred to as a mask film, and a sacrificial layer may be referred to as a mask layer.

Next, a first protective film that covers the side surface of the first EL layer, the side surface and top surface of the first sacrificial layer, and the side surface and top surface of the second pixel electrode is formed. Then, the first protective film is processed, whereby a first protective layer including a region overlapping with the side surface of the first EL layer is formed. The first protective film can be processed by anisotropic etching such as a dry etching method.

Subsequently, a second EL film and a second sacrificial film are formed in this order over the first sacrificial layer and over the second pixel electrode. Next, a resist mask is formed over the second sacrificial film. Then, the second sacrificial film and the second EL film are processed with use of the resist mask, whereby a second sacrificial layer and a second EL layer each of which includes a region overlapping with the second pixel electrode are formed.

Next, a second protective film that covers the top surface and the side surface of the first sacrificial layer, the top surface and the side surface of the second sacrificial layer, the side surface of the first protective layer, and the side surface of the second EL layer is formed.

Then, an insulating film is formed over the second protective film. Subsequently, the insulating film is processed to form an insulating layer between the first EL layer and the second EL layer. A photosensitive material, for example, a photosensitive resin, can be used for the insulating film. In this case, the insulating film can be processed by a photolithography method to be formed between the first EL layer and the second EL layer.

Next, the second protective film is processed, whereby a second protective layer is formed between the first protective layer and the insulating layer, between the second EL layer and the insulating layer, and between the substrate and the insulating layer. Like the first protective film, the second protective film can be processed by anisotropic etching such as a dry etching method.

Then, a third protective film is formed over the first sacrificial layer, over the second sacrificial layer, and over the insulating layer. After that, the third protective film is processed, whereby a third protective layer is formed over the insulating layer.

Next, the first sacrificial layer and the second sacrificial layer are removed. Lastly, a common electrode is formed over the first EL layer, the second EL layer, and the third protective layer, whereby light-emitting elements of two colors can be separately formed. Specifically, a first light-emitting element including the first pixel electrode, the first EL layer, and the common electrode and a second light-emitting element including the second pixel electrode, the second EL layer, and the common electrode can be formed separately.

Furthermore, processes from the formation of the first EL layer to the formation of the first protective layer are repeated after the formation of the first protective layer, whereby light-emitting elements of three or more colors can be separately formed; thus, a display device including light-emitting elements of three or more colors can be achieved.

As described above, in the display device of one embodiment of the present invention, the insulating layer is provided between the first EL layer and the second EL layer. The insulating layer can fill a gap between the first light-emitting element and the second light-emitting element. Therefore, unevenness on the plane where the common electrode is provided can be small, and thus, disconnection (breakage) of the common electrode can be inhibited. Consequently, the display device of one embodiment of the present invention can be a highly reliable display device.

Here, in the case where an organic insulating material such as a photosensitive resin is used for the insulating layer provided between the first EL layer and the second EL layer, the insulating layer contains oxygen, water, or the like in some cases. Entry of oxygen, water, or the like to the EL layer might degrade the light-emitting element including the EL layer. In view of this, a protective layer having a high barrier property against oxygen, water, and the like is provided so as to surround the insulating layer provided between the first EL layer and the second EL layer in the display device of one embodiment of the present invention. Accordingly, entry of impurities such as oxygen and water to the EL layers can be inhibited. Therefore, the display device of one embodiment of the present invention can be a highly reliable display device. In the above-described example, a second protective layer is provided so as to cover the side surface and the bottom surface of the insulating layer provided between the first EL layer and the second EL layer, and a third protective layer is provided so as to cover the top surface of the insulating layer. Thus, the insulating layer provided between the first EL layer and the second EL layer can be surrounded by the second protective layer and the third protective layer. For the protective layer having a high barrier property against oxygen, water, and the like, an inorganic insulating material can be used; for example, an inorganic nitride film can be used. As the inorganic nitride, at least one of silicon nitride, aluminum nitride, and hafnium nitride can be used, for example.

In the above manufacturing method, the first protective film and the second protective film can each have a stacked-layer structure of two or more layers. For example, the first protective film and the second protective film can each be a film with a stacked-layer structure of two layers, which is formed by depositing the first film by a method with high coverage and depositing the second film by a method with low coverage. For example, the first protective film and the second protective film can each be a film with a stacked-layer structure of two layers, which is formed by depositing the first film by an ALD method and depositing the second film by a sputtering method or a chemical vapor deposition (CVD) method. In this case, the first protective layer and the second protective layer can have larger thicknesses as well as covering steps and thus can favorably inhibit the entry of impurities such as oxygen and water to the first EL layer and the second EL layer. Consequently, the display device of one embodiment of the present invention can be a highly reliable display device.

As described above, it is preferable to inhibit impurities from entering the EL layers in view of the reliability of the display device. Here, if impurities are attached to the surface of the EL layers, the impurities might enter the inside of the EL layers, leading to a decrease in reliability of the display device. Thus, after the formation of the first EL layer, impurities attached to the surface of the first EL layer are preferably removed before the formation of the first protective film covering the first EL layer, in which case the reliability of the display device can be increased. Similarly, after the formation of the second EL layer, impurities attached to the surface of the second EL layer are preferably removed before the formation of the second protective film covering the second EL layer. For example, impurities attached to the surface of the first EL layer can be removed when the substrate where the first EL layer is formed is put in an inert gas atmosphere. Moreover, impurities attached to the surface of the second EL layer can be removed when the substrate where the second EL layer is formed is put in an inert gas atmosphere. As the inert gas, one or more selected from Group 18 elements (typically, helium, neon, argon, xenon, krypton, and the like) and nitrogen can be used, for example.

In addition, for example, when the EL layer is exposed to the air, impurities such as oxygen and water contained in the air might enter the inside of the EL layer. Here, after the formation of the first EL layer, the surface of the first EL layer is exposed until the first protective film is formed. Therefore, the steps from processing of the first EL film to formation of the first protective film are preferably performed in the same apparatus. Thus, after the first EL layer is formed by processing the first EL film, the first protective film covering the first EL layer can be formed while the first EL layer is not exposed to the air. Similarly, processing of the second EL film and formation of the second protective film are preferably performed in the same apparatus. In this manner, impurities contained in the air are inhibited from entering the inside of the EL layer, whereby the reliability of the display device can be improved. Note that other processes are also preferably performed in the same apparatus, in which case components of the display device can be prevented from being exposed to, for example, the air in the manufacturing process of the display device and the throughput in manufacturing of the display device can be increased.

In the case where EL layers for different colors are adjacent to each other, it is difficult to set the space between the EL layers adjacent to each other to be less than 10 μm with a formation method using a metal mask, for example; however, with use of the above method, the space can be narrowed to be less than or equal to 3 μm, less than or equal to 2 μm, or less than or equal to 1 μm. For example, with use of an exposure apparatus for LSI, the space can be narrowed to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern, causing a reduction in effective area that can be used for a light-emitting region with respect to the entire pattern area. In contrast, in the above manufacturing method, a pattern is formed by processing a film deposited to have a uniform thickness, which enables a uniform thickness in the pattern; thus, even in the case of a fine pattern, almost the entire area can be used for a light-emitting region. Therefore, the above manufacturing method makes it possible to achieve both high resolution and a high aperture ratio.

As described above, with the above fabrication method, a display device in which minute light-emitting elements are integrated can be obtained, and it is not necessary to conduct a pseudo improvement in resolution with a unique pixel arrangement method such as PenTile arrangement, for example. Accordingly, it is possible to achieve a display device that employs what is called a stripe arrangement in which R, G, and B pixels are arranged in one direction and has definition higher than or equal to 500 ppi, higher than or equal to 1000 ppi, higher than or equal to 2000 ppi, higher than or equal to 3000 ppi, or higher than or equal to 5000 ppi.

More specific structure examples and manufacturing method examples of a display device of one embodiment of the present invention will be described below with reference to drawings.

Structure Example_1

FIG. 1 is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1, light-emitting regions of the light-emitting elements are denoted by R, G, and B to easily differentiate the light-emitting elements.

In this specification and the like, for example, a light-emitting element 110R, a light-emitting element 110G, and a light-emitting element 110B are collectively referred to as a light-emitting element 110 in some cases. For example, the light-emitting element 110 refers to part or all of the light-emitting element 110R, the light-emitting element 110G, and the light-emitting element 110B. The same applies to the other components.

The light-emitting elements 110R, the light-emitting elements 110G, and the light-emitting elements 110B are arranged in a matrix. A pixel 103 illustrated in FIG. 1 employs what is called a stripe arrangement, in which light-emitting elements of the same color are arranged in one direction. Note that the arrangement method of the light-emitting elements is not limited thereto; another arrangement method such as a delta arrangement, a zigzag arrangement, or a PenTile arrangement may also be used.

As the light-emitting elements 110R, the light-emitting elements 110G, and the light-emitting elements 110B, EL elements such as organic EL elements or inorganic EL elements are preferably used.

FIG. 1 illustrates a connection electrode 111C and a common electrode 115, and the common electrode 115 is indicated by a dashed line. The connection electrode 111C is supplied with a potential (e.g., an anode potential or a cathode potential) that is to be supplied to the common electrode 115. The connection electrode 111C is provided, for example, outside a display region where the light-emitting elements 110R are arranged. For example, the connection electrode 111C can be provided along the outer periphery of the display region. The connection electrode 111C may be provided along one side of the outer periphery of the display region or two or more sides of the outer periphery of the display region, for example. That is, when the display region has a rectangular top surface, the top surface shape of the connection electrode 111C can be a band shape, an L shape, a square bracket shape, a frame-like shape, or the like.

FIG. 2A is a schematic cross-sectional view taken along the dashed-dotted line A1-A2 in FIG. 1. FIG. 2B is a schematic cross-sectional view taken along the dashed-dotted line B1-B2 in FIG. 1. FIG. 2C1 is a schematic cross-sectional view taken along the dashed-dotted line C1-C2 in FIG. 1.

FIG. 2A illustrates a cross-sectional structure example of the light-emitting element 110R, the light-emitting element 110G, and the light-emitting element 110B. FIG. 2B illustrates a cross-sectional structure example of the light-emitting element 110G. The light-emitting elements 110 are provided over a layer 101 including transistors. The layer 101 including transistors is provided over a substrate (not illustrated).

The layer 101 including transistors can employ a stacked-layer structure in which a plurality of transistors are provided and an insulating layer is provided so as to cover these transistors, for example. Here, as illustrated in FIG. 2A, FIG. 2B, and the like, the layer 101 including transistors may have a recessed portion between the adjacent light-emitting elements 110. For example, an insulating layer positioned on the outermost surface of the layer 101 including transistors may have a recessed portion. Note that the layer 101 including transistors includes no recessed portion between the adjacent light-emitting elements 110 in some cases.

In the layer 101 including transistors, a pixel circuit, a scan line driver circuit (gate driver), and a signal line driver circuit (source driver), for example, are preferably formed. In addition to the above, an arithmetic circuit, a memory circuit, or the like may be formed.

The light-emitting element 110R includes a pixel electrode 111R and an EL layer 112R over the pixel electrode 111R. The light-emitting element 110G includes a pixel electrode 111G and an EL layer 112G over the pixel electrode 111G. The light-emitting element 110B includes a pixel electrode 111B and an EL layer 112B over the pixel electrode 111B. The light-emitting element 110R, the light-emitting element 110G, and the light-emitting element 110B include a common layer 114 over the EL layer 112R, over the EL layer 112G, and over the EL layer 112B, and the common electrode 115 over the common layer 114. The common layer 114 and the common electrode 115 are each provided as a continuous layer shared by the light-emitting elements 110.

The EL layer 112R, the EL layer 112G, and the EL layer 112B each include a light-emitting layer. The light-emitting layer is a layer containing a light-emitting substance. The light-emitting layer can include one or more kinds of light-emitting substances. As the light-emitting substance, a substance that exhibits an emission color of blue, violet, bluish violet, green, yellowish green, yellow, orange, red, or the like is used as appropriate. Alternatively, as the light-emitting substance, a substance that emits near-infrared light can be used. For example, the light-emitting layer of the EL layer 112R can contain a light-emitting substance exhibiting red. The light-emitting layer of the EL layer 112G can contain a light-emitting substance exhibiting green. The light-emitting layer of the EL layer 112B can contain a light-emitting substance exhibiting blue.

Examples of the light-emitting substance include a fluorescent material, a phosphorescent material, a TADF material, and a quantum dot material.

As the quantum dot material, a colloidal quantum dot material, an alloyed quantum dot material, a core-shell quantum dot material, a core quantum dot material, or the like can be used. Moreover, a material containing elements belonging to Groups 12 and 16, elements belonging to Groups 13 and 15, or elements belonging to Groups 14 and 16 may be used. Alternatively, a quantum dot material containing an element such as cadmium, selenium, zinc, sulfur, phosphorus, indium, tellurium, lead, gallium, arsenic, or aluminum may be used.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (a host material, an assist material, and the like) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of a lowest-energy-side absorption band of the light-emitting substance, energy can be transferred smoothly and light emission can be obtained efficiently. With this structure, the high efficiency, low-voltage driving, and long lifetime of the light-emitting element can be achieved at the same time.

In addition to the light-emitting layer, the EL layer 112R, the EL layer 112G, and the EL layer 112B may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the light-emitting element, and an inorganic compound may also be contained. Each of the layers included in the light-emitting element can be formed by an evaporation method (including a vacuum evaporation method), a transfer method, a printing method, an inkjet method, a coating method, or the like.

For example, the EL layer 112R, the EL layer 112G, and the EL layer 112B may each include one or more of a hole-injection layer, a hole-transport layer, a hole-blocking layer, an electron-blocking layer, an electron-transport layer, and an electron-injection layer.

The EL layer 112R, the EL layer 112G, and the EL layer 112B each preferably include a light-emitting layer and a carrier-transport layer over the light-emitting layer. Accordingly, the light-emitting layer is inhibited from being exposed on the outermost surface during the manufacturing process of the display device 100, so that damage to the light-emitting layer can be reduced. As a result, the reliability of the light-emitting element can be increased. Accordingly, the display device 100 can be a highly reliable display device.

The hole-injection layer is a layer injecting holes from an anode to a hole-transport layer and containing a material with a high hole-injection property. Examples of the material with a high hole-injection property include an aromatic amine compound, a composite material containing a hole-transport material and an acceptor material (an electron-accepting material), and the like.

The hole-transport layer is a layer transporting holes, which are injected from the anode by the hole-injection layer, to the light-emitting layer. The hole-transport layer is a layer containing a hole-transport material. For the hole-transport material, a substance having a hole mobility greater than or equal to $1\times10^{-6}$ $cm^2/Vs$ is preferable. Note that other substances can also be used as long as they have a hole-transport property higher than an electron-transport property. As the hole-transport material, a material with a high hole-transport property, such as a π-electron rich heteroaromatic compound (e.g., a carbazole derivative, a thiophene derivative, a furan derivative, or the like) or an aromatic amine (a compound having an aromatic amine skeleton), is preferable.

The electron-transport layer is a layer that transports electrons, which are injected from a cathode by an electron-injection layer, to a light-emitting layer. The electron-transport layer is a layer containing an electron-transport material. For the electron-transport material, a substance having an electron mobility greater than or equal to $1\times10^{-6}$ $cm^2/Vs$ is preferable. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound. Note that other substances can also be used as long as they have an electron-transport property higher than a hole-transport property.

The electron-injection layer is a layer injecting electrons from a cathode to the electron-transport layer and containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

For the electron-injection layer, it is possible to use, for example, an alkali metal, an alkaline earth metal, or a compound thereof, such as lithium, cesium, ytterbium, lithium fluoride (LiF), cesium fluoride (CsF), calcium fluoride ($CaF_X$, where X is a given number), 8-(quinolinolato) lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_X$), or cesium carbonate. The electron-injection layer may have a stacked-layer structure of two or more layers. In the stacked-layer structure, for example, lithium fluoride can be used for a first layer and ytterbium can be used for a second layer.

Alternatively, for the electron-injection layer, an electron-transport material may be used. For example, a compound having an unshared electron pair and an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a:2',3'-c]phenazine (abbreviation: HATNA), 2,4,6-tris [3'-(pyridin-3-yl)biphenyl-3-yl]-1,3,5-triazine (abbreviation: TmPPPyTz), or the like can be used for the organic compound having an unshared electron pair. Note that NBPhen has a higher glass transition temperature (Tg) than BPhen and thus has high heat resistance.

The common layer 114 is preferably a layer including one or more of, for example, a hole-injection layer, a hole-transport layer, a hole-blocking layer, an electron-blocking layer, an electron-transport layer, and an electron-injection layer. For example, in the light-emitting element in which the pixel electrode 111 serves as an anode and the common electrode serves as a cathode, a structure including an electron-injection layer or a structure including an electron-injection layer and an electron-transport layer can be used as the common layer 114. In the light-emitting element in which the pixel electrode 111 serves as a cathode and the common electrode serves as an anode, a structure including a hole-injection layer or a structure including a hole-injection layer and a hole-transport layer can be used as the common layer 114. Here, for example, in the case where the common layer 114 includes an electron-injection layer, the EL layer 112R, the EL layer 112G, and the EL layer 112B do not necessarily include an electron-injection layer. For example, the EL layer 112R, the EL layer 112G, and the EL layer 112B can each have a structure including a hole-injection layer, a hole-transport layer over the hole-injection layer, a light-emitting layer over the hole-transport layer, and an electron-transport layer over the light-emitting layer. Furthermore, for example, in the case where the common layer 114 includes a hole-injection layer, the EL layer 112R, the EL layer 112G, and the EL layer 112B do not necessarily include a hole-injection layer.

As described above, the common layer 114 is provided as a continuous layer shared by the light-emitting elements 110. Accordingly, it is not necessary to process the common layer 114 by etching, for example. Thus, the structure of the display device 100 including the common layer 114 allows simplifying the manufacturing processes of the display device 100, leading to a reduction in manufacturing cost of the display device 100. Therefore, the display device 100 can be an inexpensive display device.

The common layer 114 and the common electrode 115 can be formed successively without a process such as etching between formations of the common layer 114 and the common electrode 115. Accordingly, the interface between the common layer 114 and the common electrode 115 can be clean. Thus, the display device 100 can be a highly reliable display device. Note that the display device 100 does not necessarily include the common layer 114. In this case, for example, in light-emitting elements in which the pixel electrodes 111 serve as anodes and the common electrode serves as a cathode, the EL layer 112R, the EL layer 112G, and the EL layer 112B can each have a structure in which an electron-injection layer is provided over an electron-transport layer.

A conductive layer having a transmitting property with respect to visible light is used for either the pixel electrode 111 or the common electrode 115, and a reflective conductive layer is used for the other. When the pixel electrode 111 is a light-transmitting electrode and the common electrode 115 is a reflective electrode, a bottom-emission display device can be obtained; in contrast, when the pixel electrode 111 is a reflective electrode and the common electrode 115 is a light-transmitting electrode, a top-emission display device can be obtained. Note that when both the pixel electrode 111 and the common electrode 115 have a light-transmitting property, the display device can have a dual emission structure.

In the case where a conductive layer having a reflective property with respect to visible light is used for the pixel electrode 111, silver, aluminum, titanium, tantalum, molybdenum, platinum, gold, titanium nitride, tantalum nitride, or the like can be used for the pixel electrode 111, for example. In addition, an alloy can be used for the pixel electrode 111. For example, an alloy containing silver can be used. As the alloy containing silver, an alloy containing silver, palladium, and copper, for example, can be used. For example, an alloy containing aluminum can be used. Alternatively, a stack of two or more layers including any of these materials may be used.

In addition, the pixel electrode 111 can have a stacked-layer structure in which a conductive layer having a transmitting property with respect to visible light is provided over a conductive layer having a reflective property with respect to visible light. As the conductive material having a transmitting property with respect to visible light, a conductive oxide such as indium oxide, indium tin oxide, indium zinc oxide, zinc oxide, zinc oxide containing gallium, indium tin oxide containing silicon, or indium zinc oxide containing silicon can be used. An oxide of a conductive material having a reflective property with respect to visible light may be used as the conductive material having a transmitting property with respect to visible light. The oxide can be formed by oxidizing the surface of a conductive material having a reflective property with respect to visible light, for example. Specifically, for example, titanium oxide may be used. Titanium oxide can be formed by oxidizing the surface of titanium, for example.

Providing the oxide on the surface of the pixel electrode 111 can inhibit oxidation reaction with the pixel electrode 111, for example, at the time of forming the EL layer 112. In addition, when the pixel electrode 111 has a stacked-layer structure in which a conductive layer having a transmitting property with respect to visible light is provided over a conductive layer having a reflective property with respect to visible light, the conductive film having a transmitting property with respect to visible light can function as an optical adjustment layer.

The pixel electrode 111 including the optical adjustment layer can adjust the optical path length. The optical path length in the light-emitting element 110 corresponds to, for example, the sum of the thickness of the optical adjustment layer and the thickness of a layer provided below the layer containing a light-emitting compound in the EL layer 112.

The optical path lengths of the light-emitting elements 110 are set different from each other using a microcavity structure, whereby light of a specific wavelength can be intensified. This can achieve a display device with high color purity.

For example, the thickness of the EL layer 112 is set different among the light-emitting elements 110, whereby a micorcavity structure can be obtained. For example, the EL layer 112R of the light-emitting element 110R emitting light with the longest wavelength can be made to have the largest thickness, and the EL layer 112B of the light-emitting element 110B emitting light with the shortest wavelength can be made to have the smallest thickness. Without limitation to this, each of the thicknesses of the EL layers 112 can be adjusted in consideration of the wavelength of light emitted by the light-emitting element 110, the optical characteristics of the layer included in the light-emitting element 110, the electrical characteristics of the light-emitting element 110, and the like.

For the conductive layer having a reflective property with respect to visible light, aluminum, silver, or the like, which has high reflectivity, is preferably used. Aluminum is particularly preferable at the time of manufacturing a high-resolution display device because microfabrication of aluminum is easy to perform.

For the conductive layer having a transmitting property with respect to visible light, a transparent oxide conductive material is preferably used. However, for example, when a transparent oxide conductive material containing indium is provided in direct contact with aluminum, corrosion of the aluminum might occur in a later process. For this reason, it is preferable to use, for example, aluminum for a layer that is not in contact with the transparent oxide conductive film containing indium in order to prevent corrosion. For example, the pixel electrode 111 can have a three-layer stacked structure of a layer using aluminum, a layer using titanium oxide, and a layer using indium tin oxide containing silicon.

Here, it is preferable that an aluminum film and a titanium oxide film be deposited successively at the time of forming the pixel electrode 111. In the case where after the aluminum film is deposited, the aluminum film is exposed to the air, and then the titanium oxide film is deposited, the aluminum film might be oxidized naturally owing to the exposure to the air. When the titanium oxide film is deposited after the aluminum film is deposited without exposure to the air, oxidation of aluminum can be inhibited.

Note that in the case where exposure to the air is needed in a period after the aluminum film is deposited and before the titanium film is formed, a different film is preferably formed over the aluminum film before exposure to the air. This can inhibit oxidation of the aluminum film due to the exposure to the air. The thickness of the different film can be extremely small. For example, a titanium film may be formed over an aluminum film and then exposed to the air, and a titanium oxide film may be formed over the titanium film.

In the case where there is apprehension that the surface of the aluminum film is oxidized, the oxide film on the surface of the aluminum film may be removed by reverse sputtering treatment. For example, after the aluminum film is formed and exposed to the air, the oxide film on the surface of the aluminum film may be removed by reverse sputtering treatment, and then the titanium oxide film may be formed.

Examples of a method for forming the titanium oxide film include a reactive sputtering method using a titanium target and an oxygen gas and a sputtering method using a titanium oxide target and an inert gas (e.g., an argon gas). Here, when an oxygen gas is used, the surface of the aluminum film might be oxidized by being exposed to the oxygen gas. Thus, a film to be formed on and in contact with the aluminum film is preferably formed without using an oxygen gas. Therefore, it is preferable that the titanium oxide film be formed by a sputtering method using a titanium oxide target and an inert gas (e.g., an argon gas).

The common electrode 115 can be a conductive layer having a transmitting property with respect to visible light. For example, a conductive oxide such as indium oxide, indium tin oxide, indium zinc oxide, zinc oxide, or zinc oxide containing gallium or graphene can be used for the common electrode 115. Alternatively, a metal material such as gold, silver, platinum, magnesium, nickel, tungsten, chromium, molybdenum, iron, cobalt, copper, palladium, or titanium, or an alloy material containing the metal material can be used for the common electrode 115. Alternatively, a nitride of the metal material (e.g., titanium nitride) or the like may be used for the common electrode 115. Note that in the case of using a metal material or an alloy material (or a nitride thereof), the thickness is preferably set small enough to transmit light. Furthermore, a stacked-layer film of the above materials can be used for the conductive layer. For example, a stacked-layer film of indium tin oxide and an alloy of silver and magnesium is preferably used for the common electrode 115, in which case the conductivity of the common electrode 115 can be increased.

Here, a protective layer 131 including a region overlapping with the side surface of the EL layer 112R and the protective layer 131 including a region overlapping with the side surface of the EL layer 112G are provided between the EL layer 112R and the EL layer 112G, for example. In a similar manner, the protective layer 131 is provided between other EL layers 112. In addition, the protective layer 131 including a region overlapping with the side surface of the pixel electrode 111 can be provided.

The protective layer 131 is preferably a layer having a high barrier property against oxygen, water, and the like. Accordingly, entry of impurities such as oxygen and water from the side surface of the EL layer 112 to the inside thereof can be inhibited. Accordingly, the degradation of the light-emitting element 110 is inhibited, whereby the display device 100 can be a highly reliable display device.

For the protective layer 131, an inorganic insulating material can be used, and a layer including an oxide or a nitride such as silicon oxide, silicon oxynitride, silicon nitride oxide, silicon nitride, aluminum oxide, aluminum oxynitride, or hafnium oxide can be used, for example. Note that the protective layer 131 is preferably a film whose kind and thickness generate no pin hole.

Note that in this specification and the like, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition; in the case where silicon nitride oxide is described, it refers to a material that contains more nitrogen than oxygen in its composition.

Although the uppermost surface of the protective layer 131 including a region overlapping with the side surface of the EL layer 112 is positioned above the top surface of the EL layer 112 in the example illustrated in FIG. 2A and FIG. 2B, one embodiment of the present invention is not limited thereto. For example, the level of the uppermost surface of the protective layer 131 including a region overlapping with the side surface of the EL layer 112 may be equal to the level of the top surface of the EL layer 112. Alternatively, the uppermost surface of the protective layer 131 including a region overlapping with the side surface of the EL layer 112 may be positioned below the top surface of the EL layer 112.

Here, when the space between the adjacent EL layers 112 is increased, the aperture ratio of the pixel 103 is decreased in some cases. In contrast, when the space between the adjacent EL layers 112 is reduced, the protective layer 131 is not formed so as to cover the side surface of the EL layer 112, whereby a barrier effect of the protective layer 131 is reduced; therefore, impurities sometimes easily enter the inside of the EL layer 112 from the side surface of the EL layer 112. Thus, the space between the side surface of the EL layer 112 and the side surface of the adjacent EL layer 112 preferably includes a region greater than or equal to 3 nm and less than or equal to 200 nm, further preferably includes a region greater than or equal to 3 nm and less than or equal to 150 nm, still further preferably includes a region greater than or equal to 5 nm and less than or equal to 150 nm, yet further preferably includes a region greater than or equal to 5 nm and less than or equal to 100 nm, yet still further preferably includes a region greater than or equal to 10 nm and less than or equal to 100 nm, yet still further preferably includes a region greater than or equal to 10 nm and less than or equal to 50 nm. When the space between the side surface of the EL layer 112 and the side surface of the adjacent EL layer 112 is within the above range, the display device 100 can be a highly reliable display device with a high aperture ratio.

An insulating layer 132 is provided between adjacent light-emitting elements 110. The insulating layer 132 is positioned between the EL layers 112 included in the light-emitting elements 110. The insulating layer 132 is provided, for example, between two EL layers 112 exhibiting different colors. Alternatively, the insulating layer 132 is provided, for example, between two EL layers 112 exhibiting the same color. Alternatively, the following structure may be employed: the insulating layer 132 is provided between two EL layers 112 exhibiting different colors and is not provided between two EL layers 112 exhibiting the same color. The insulating layer 132 can be positioned between the pixel electrodes 111 included in the light-emitting elements 110.

In the top view, the insulating layer 132 is positioned between the EL layers 112 of the adjacent pixels so as to have a mesh (also referred to as grid or matrix) shape.

When the insulating layer 132 is provided between the EL layers 112 exhibiting different colors, the EL layer 112R, the EL layer 112G, and the EL layer 112B can be inhibited from being in contact with each other. This can inhibit unintentional light emission from being caused by a current flowing through the two adjacent EL layers 112. Thus, the contrast can be increased, whereby the display device 100 can be a display device having high display quality. The insulating layer 132 provided between the pixel electrodes 111 can inhibit the pixel electrodes 111 from being in contact with each other. This can inhibit a short circuit between the pixel electrodes 111. Consequently, the display device 100 can be a highly reliable display device.

The insulating layer 132 provided between the adjacent light-emitting elements 110 can planarize a step generated owing to a region where the EL layer 112 is provided and a region where the EL layer 112 is not provided. Accordingly, the coverage with the common electrode 115 can be improved as compared with a case where the insulating layer 132 is not provided between the adjacent light-emitting elements 110 and a gap is formed, for example. Thus, connection failures due to generation of disconnection in the common electrode 115 can be inhibited. In addition, it is possible to inhibit an increase in electric resistance due to local thinning of the common electrode 115 by the step. Consequently, the display device 100 can be a highly reliable display device.

Note that in the case where the insulating layer 132 is not provided between the adjacent light-emitting elements 110 for the same color and is formed between the light-emitting elements 110 for different colors, the insulating layer 132 can have a stripe shape in the top view. The insulating layer 132 can be formed in a smaller space when having a stripe shape rather than a lattice shape. Accordingly, the aperture ratio of the display device 100 can be increased. Note that in the case where the insulating layer 132 has a stripe shape, the adjacent EL layers 112 for the same color may be processed in a band shape so as to be continuous in a column direction.

An insulating layer containing an organic material can be suitably used for the insulating layer 132. As the insulating layer 132, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. Moreover, a photosensitive resin can be used for the insulating layer 132. As the photosensitive resin, a positive photosensitive material or a negative photosensitive material can be used.

A photosensitive resin is used for the insulating layer 132, whereby the insulating layer 132 can be formed only by light exposure and development processes. Thus, the manufacturing processes of the display device 100 can be simplified, which leads to a reduction in manufacturing cost of the display device 100. Thus, the display device 100 can be an inexpensive display device.

In the case where an organic material is used for the insulating layer 132, oxygen, water, or the like is contained in the insulating layer 132 in some cases. As described above, entry of oxygen, water, or the like to the EL layer 112 may degrade the light-emitting element 110. Here, the insulating layer 132 is provided in contact with the protective layer 131 in the display device 100. For example, the insulating layer 132 is provided such that the side surface and the bottom surface of the insulating layer 132 are in contact with the protective layer 131. In this case, oxygen, water, or the like contained in the insulating layer 132 can be inhibited from entering the EL layer 112; therefore, the display device 100 can be a highly reliable display device.

As illustrated in FIG. 2A, the number of protective layers 131 positioned between the EL layer 112R and the insulating layer 132, the number of protective layers 131 positioned between the EL layer 112G and the insulating layer 132, and the number of protective layers 131 positioned between the EL layer 112B and insulating layer 132 can be different from one another. In the example illustrated in FIG. 2A and FIG. 2B, three protective layers 131 are provided between the EL layer 112R and the insulating layer 132, two protective layers 131 are provided between the EL layer 112G and the insulating layer 132, and one protective layer 131 is provided between the EL layer 112B and insulating layer 132. Furthermore, in the example illustrated in FIG. 2A and FIG. 2B, the number of protective layers 131 provided between the pixel electrode 111R and the insulating layer 132, the number of protective layers 131 provided between the pixel electrode 111G and the insulating layer 132, and the number of protective layers 131 provided between the pixel electrode 111B and the insulating layer 132 are each three. Note that the number of protective layers 131 is not limited to that in example illustrated in FIG. 2A and FIG. 2B; although details are described later, the number of protective layers 131 can be varied as appropriate depending on the method for manufacturing the display device 100, for example. In addition, the protective layer 131 is not necessarily provided between the pixel electrode 111 and the protective layer 131 in contact with the insulating layer 132.

A protective layer 133 is provided over the insulating layer 132. For example, the protective layer 133 is provided so as to include a region in contact with the top surface of the insulating layer 132. The protective layer 133 is provided, for example, between the insulating layer 132 and the common layer 114. As described above, the common layer 114 is provided over the EL layer 112R, over the EL layer 112G, and over the EL layer 112B, and the common electrode 115 is provided over the common layer 114. Accordingly, the common layer 114 and the common electrode 115 are provided over the EL layer 112R, over the EL layer 112G, over the EL layer 112B, and over the protective layer 133.

The protective layer 133 can be provided so as to include a region overlapping with the top surface of the protective layer 131 provided between the EL layer 112 and the insulating layer 132. Although an end portion of the EL layer 112 is aligned with an end portion of the protective layer 133 in FIG. 2A and FIG. 2B, the end portion of the EL layer 112 is not necessarily aligned with the end portion of the protective layer 133. For example, the end portion of the protective layer 133 may be positioned between an end portion of the protective layer 131 provided on a surface in contact with the EL layer 112 and an end portion of the protective layer 131 provided on a surface in contact with the insulating layer 132.

The protective layer 133 is preferably a layer having a high barrier property against oxygen, water, and the like. This can inhibit impurities such as oxygen and water contained in the insulating layer 132 that can contain an organic insulating material such as a resin from entering the common layer 114. Accordingly, the display device 100 can be a highly reliable display device.

Thus, in the display device 100, the insulating layer 132 is surrounded by the protective layer 131 and the protective layer 133, which are layers having a high barrier property with respect to oxygen, water, and the like. Therefore, the display device 100 can be a highly reliable display device.

An inorganic insulating material can be used for the protective layer 133; for example, a nitride can be used. Specifically, the protective layer 133 can contain at least one of silicon nitride, aluminum nitride, and hafnium nitride. For the protective layer 133, an oxide or an oxynitride can be used; for example, an oxide film or a oxynitride film of silicon oxide, silicon oxynitride, aluminum oxide, aluminum oxynitride, hafnium oxide, hafnium oxynitride, or the like can be used. For example, the protective layer 133 can be formed by a sputtering method, a CVD method, a vacuum evaporation method, a pulsed laser deposition (PLD) method, or an atomic layer deposition (ALD) method.

A protective layer 121 is provided over the common electrode 115 to cover the light-emitting element 110R, the light-emitting element 110G, and the light-emitting element 110B. The protective layer 121 has a function of preventing diffusion of impurities such as water into the light-emitting elements 110 from above.

The protective layer 121 can have, for example, a single-layer structure or a stacked-layer structure at least including an inorganic insulating film. For the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This enables the top surface of the organic insulating film to be flat, and accordingly, coverage with the inorganic insulating film thereover is improved, which leads to an improvement in barrier properties. Moreover, the top surface of the protective layer 121 is flat, which is preferable because the influence of an uneven shape due to a lower structure can be reduced in the case where a component (e.g., a color filter, an electrode of a touch sensor, a lens array, or the like) is provided above the protective layer 121.

FIG. 2C1 illustrates a cross section taken along the dashed-dotted line C1-C2 illustrated in FIG. 1. In the cross section taken along the dashed-dotted line C1-C2, a region 130 in which the connection electrode 111C and the common electrode 115 are electrically connected to each other is provided. Note that although the common layer 114 is provided between the connection electrode 111C and the common electrode 115 in the example illustrated in FIG. 2C1, the common layer 114 is not necessarily provided in the region 130. FIG. 2C2 illustrates a cross section taken along the dashed-dotted line C1-C2 in FIG. 1 in the case where the common layer 114 is not provided in the region 130. When the common layer 114 is not provided in the region 130, the connection electrode 111C and the common electrode 115 can be in contact with each other, so that contact resistance can be further reduced.

In the region 130, the common electrode 115 is provided over the connection electrode 111C, and the protective layer 121 is provided to cover the common electrode 115. The protective layer 131 and the insulating layer 132 are provided in a region not overlapping with the top surface of the connection electrode 111C, and the protective layer 133 is provided over the protective layer 131 and over the insulating layer 132. Furthermore, in the example illustrated in FIG. 2C1, the common layer 114 is provided over the connection electrode 111C, over the protective layer 133, and over the layer 101 including transistors. Note that although three protective layers 131 are provided on each side of the connection electrode 111C in FIG. 2C1 and FIG. 2C2, one embodiment of the present invention is not limited thereto; although details will be described, the number of protective layers 131 can be varied depending on the method for manufacturing the display device 100, for example.

FIG. 2D illustrates an enlarged view of a region surrounded by a dashed-dotted line in FIG. 2A. As illustrated in FIG. 2D, the insulating layer 132 can have a concave shape.

The protective layer 131 can have a two-layer stacked structure and can have, for example, a two-layer stacked structure of a protective layer 131*a* and a protective layer 131*b* as illustrated in FIG. 2D. In this case, for example, the side surface of the EL layer 112 can include a region in contact with the protective layer 131*a*. Furthermore, in the protective layer 131 including a region in contact with the side surface and the bottom surface of the insulating layer 132, the protective layer 131*b* includes a region in contact with the side surface and the bottom surface of the insulating layer 132, and the protective layer 131*a* includes a region in contact with the side surface and the bottom surface of the protective layer 131*b*.

The protective layer 131*a* can be a layer formed by processing a film deposited, for example, by a method with high coverage, and the protective layer 131*b* can be a layer formed by processing a film deposited, for example, by a method with low coverage. For example, the protective layer 131*a* can be a layer formed by processing a film deposited by an ALD method, and the protective layer 131*b* can be a layer formed by processing a film deposited by a sputtering method or a CVD method. Thus, the protective layer 131 can have a large thickness as well as covering a step. Accordingly, entry of impurities such as oxygen and water to the EL layer 112 can be favorably inhibited. Consequently, the display device 100 can be a highly reliable display device.

For the protective layer 131*a*, for example, an inorganic oxide or an inorganic nitride can be used, and the protective layer 131*a* can contain at least one of aluminum oxide, silicon oxide, silicon oxynitride, silicon nitride oxide, silicon nitride, aluminum oxynitride, and hafnium oxide, for example. For the protective layer 131*b*, for example, an inorganic nitride can be used, and the protective layer 131*b* can contain at least one of silicon nitride, aluminum nitride, and hafnium nitride, for example.

The thickness of the protective layer 131*a* is, for example, preferably greater than or equal to 1 nm and less than or equal to 60 nm, further preferably greater than or equal to 1 nm and less than or equal to 40 nm, still further preferably greater than or equal to 5 nm and less than or equal to 20 nm. The thickness of the protective layer 131*b* is, for example, preferably greater than or equal to 60 nm and less than or equal to 300 nm, further preferably greater than or equal to 60 nm and less than or equal to 150 nm, still further preferably greater than or equal to 80 nm and less than or equal to 120 nm. Note that the protective layer 131*a* and the protective layer 131*b* are each preferably a film whose kind and thickness generate no pin hole.

Figure 3A:
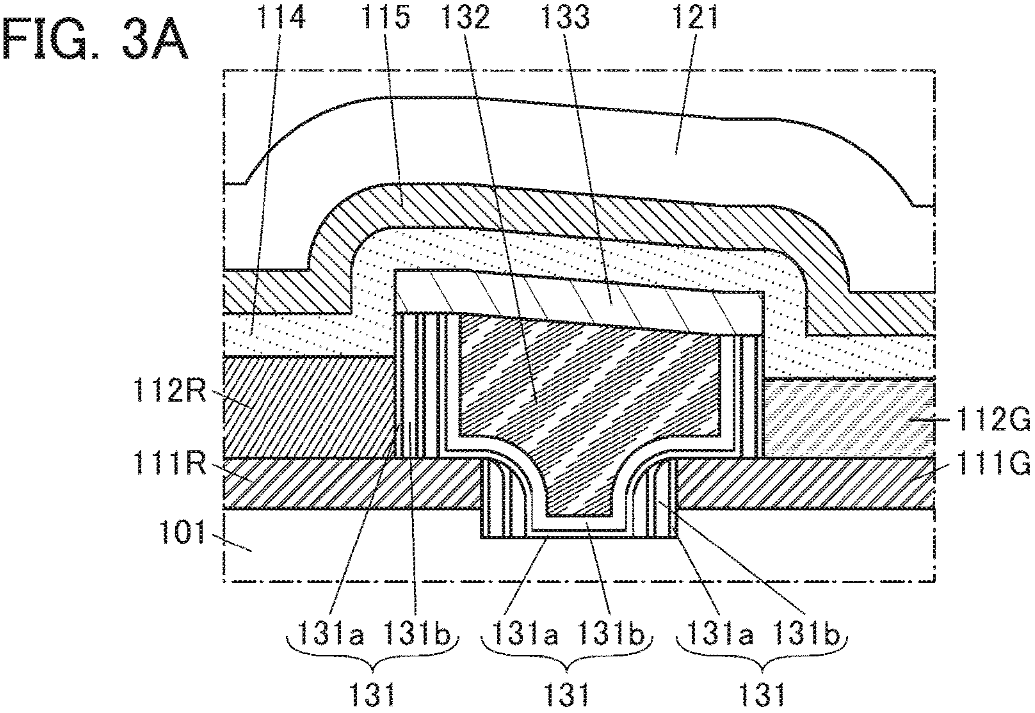
FIG. 3A and FIG. 3B are cross-sectional views each illustrating a structure example of a display apparatus.
Figure 3B:
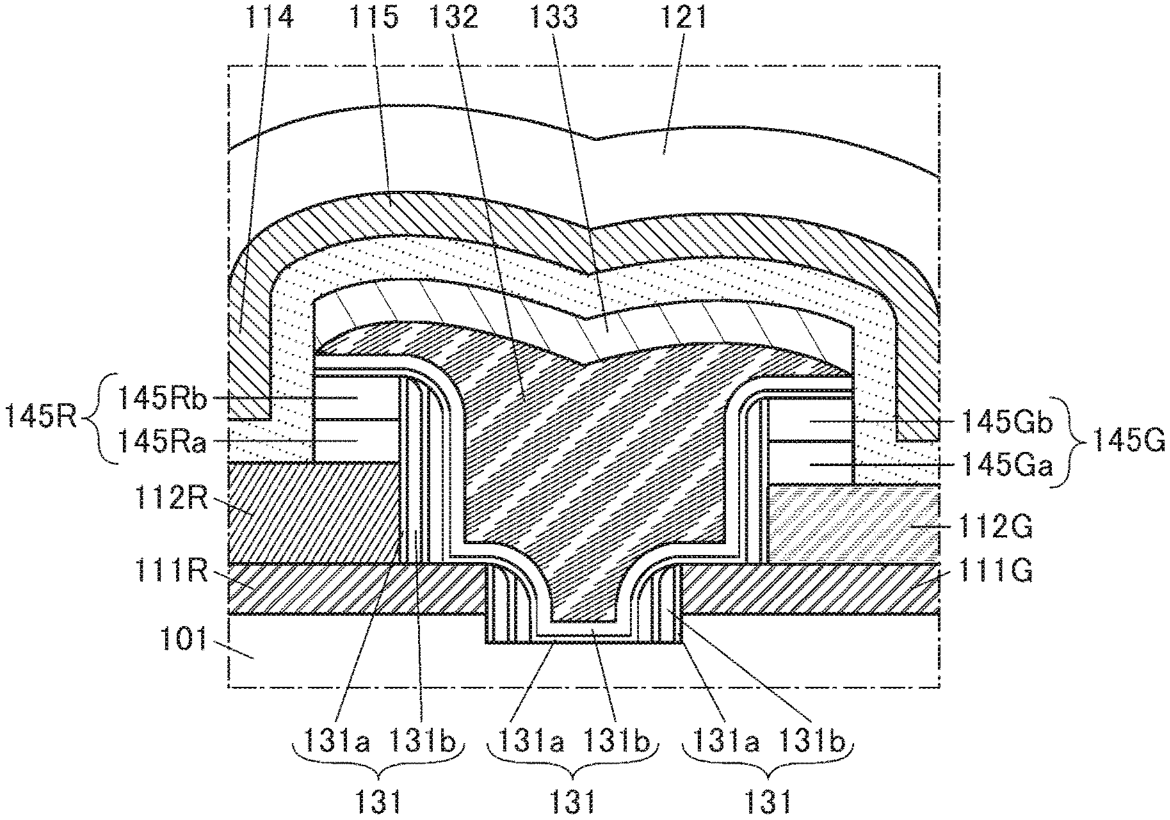

FIG. 3A and FIG. 3B illustrate modification examples of the structure of FIG. 2D. The structures illustrated in FIG. 3A and FIG. 3B differ from the structure illustrated in FIG. 2D in the shape of the insulating layer 132, for example.

The insulating layer 132 illustrated in FIG. 3A has a flat top surface. The insulating layer 132 illustrated in FIG. 3B includes a region overlapping with the top surface of the EL layer 112. In the structure illustrated in FIG. 3B, a sacrificial layer 145 is provided between the top surface of the EL layer 112 and the insulating layer 132. For example, the sacrificial layer 145 is provided between the top surface of the EL layer 112 and the protective layer 131. Here, the sacrifice layer 145 can have a two-layer stacked structure of a sacrificial layer 145*a* and a sacrificial layer 145*b*. FIG. 3B illustrates, as the sacrificial layer 145, a sacrificial layer 145R provided between the top surface of the EL layer 112R and the insulating layer 132 and a sacrificial layer 145G provided between the top surface of the EL layer 112G and the insulating layer 132. Detailed description on the sacrificial layer 145 will be made later.

Although the end portion of the protective layer 133 is aligned with the end portion of the sacrificial layer 145 in FIG. 3B, the end portion of the protective layer 133 is not necessarily aligned with the end portion of the sacrificial layer 145. For example, the protective layer 133 may include a region in contact with the top surface of the EL layer 112. In other words, the protective layer 133 may cover the side surface of the sacrificial layer 145.

[Pixel Layout]

Next, pixel layouts different from that in FIG. 1 will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of the top surface shape of the subpixel include polygons such as a triangle, a tetragon (including a rectangle and a square), and a pentagon; polygons with rounded corners; an ellipse; and a circle. Here, the top surface shape of the subpixel corresponds to the top surface shape of a light-emitting region of the light-emitting element.

Figure 4A:
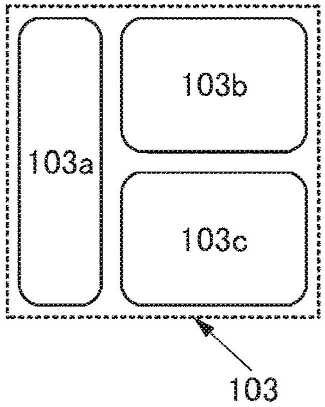
FIG. 4A to FIG. 4F are top views each illustrating a structure example of a pixel.
Figure 4B:
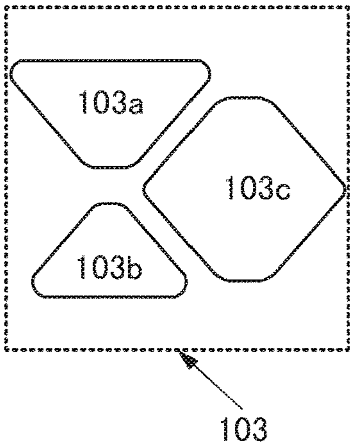
Figure 5A:
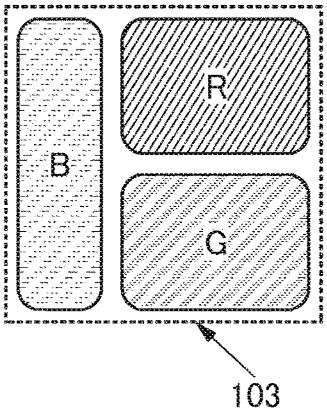
FIG. 5A to FIG. 5E are top views each illustrating a structure of a pixel.
Figure 5B:
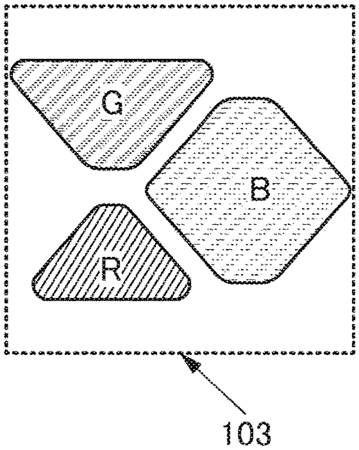

The pixel 103 illustrated in FIG. 4A employs S-stripe arrangement. The pixel 103 illustrated in FIG. 4A includes three subpixels, a subpixel 103*a*, a subpixel 103*b*, and a subpixel 103*c*. For example, as illustrated in FIG. 5A, the subpixel 103*a* may be a blue subpixel B, the subpixel 103*b* may be a red subpixel R, and the subpixel 103*c* may be a green subpixel G. The pixel 103 illustrated in FIG. 4B includes the subpixel 103*a* whose top surface has a rough trapezoidal shape with rounded corners, the subpixel 103*b* whose top surface has a rough triangle shape with rounded corners, and the subpixel 103*c* whose top surface has a rough tetragonal, rough hexagonal, or rough octagonal shape with rounded corners. In addition, the subpixel 103*a* has a larger light-emitting area than the subpixel 103*b*. In this manner, the shapes and sizes of the subpixels can be determined independently. For example, the size of a subpixel including a light-emitting element with higher reliability can be smaller. For example, as illustrated in FIG. 5B, the subpixel 103*a* may be a green subpixel G, the subpixel 103*b* may be a red subpixel R, and the subpixel 103*c* may be a blue subpixel B.

Figure 4C:
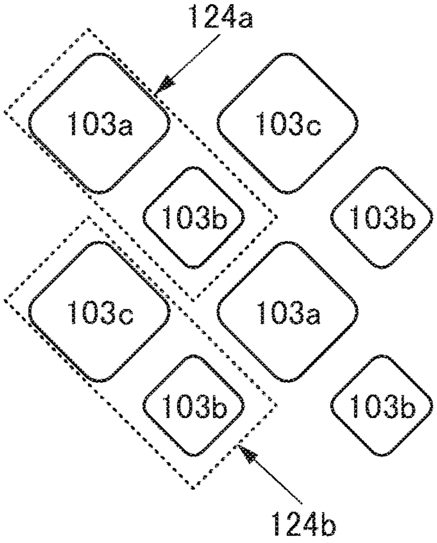
Figure 5C:
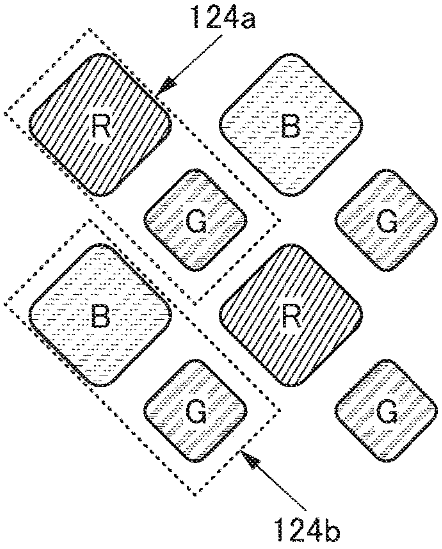

A pixel 124*a* and a pixel 124*b* illustrated in FIG. 4C employ PenTile arrangement. FIG. 4C illustrates an example in which the pixel 124*a* including the subpixel 103*a* and the subpixel 103*b* and the pixel 124*b* including the subpixel 103*b* and the subpixel 103*c* are alternately arranged. For example, as illustrated in FIG. 5C, the subpixel 103*a* may be a red subpixel R, the subpixel 103*b* may be a green subpixel G, and the subpixel 103*c* may be a blue subpixel B.

Figure 4D:
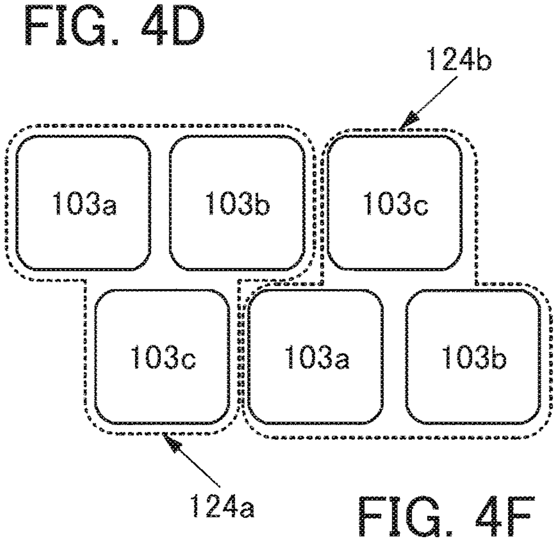
Figure 4E:
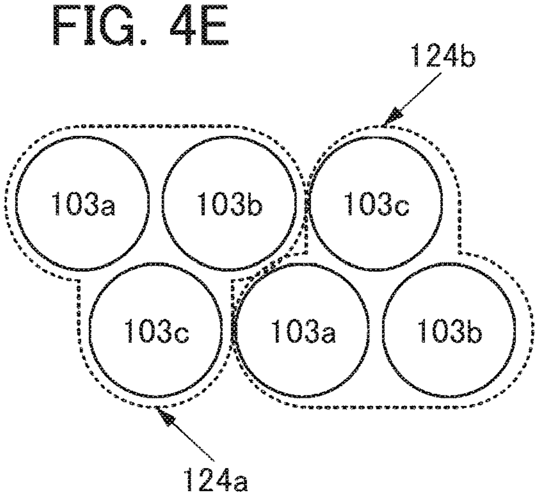
Figure 5D:
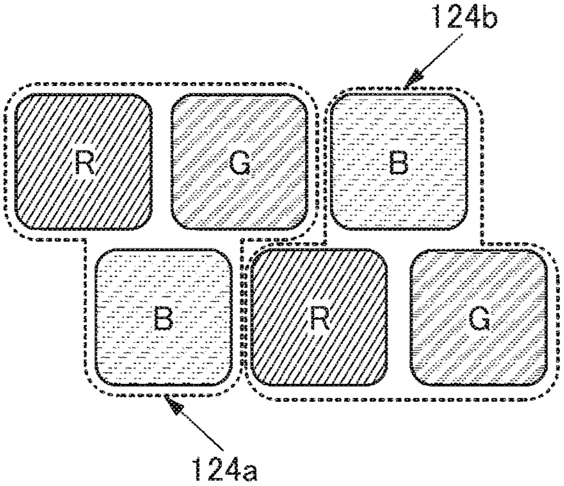

The pixel 124*a* and the pixel 124*b* illustrated in FIG. 4D and FIG. 4E employ delta arrangement. The pixel 124*a* includes two subpixels (the subpixel 103*a* and the subpixel 103*b*) in the upper row (first row) and one subpixel (the subpixel 103*c*) in the lower row (second row). The pixel 124*b* includes one subpixel (the subpixel 103*c*) in the upper row (first row) and two subpixels (the subpixel 103*a* and the subpixel 103*b*) in the lower row (second row). For example, as illustrated in FIG. 5D, the subpixel 103*a* may be a red subpixel R, the subpixel 103*b* may be a green subpixel G, and the subpixel 103*c* may be a blue subpixel B.

FIG. 4D is an example where each subpixel has a rough tetragonal top surface shape with rounded corners, and FIG. 4E is an example where each subpixel has a circular top surface shape.

Figure 4F:
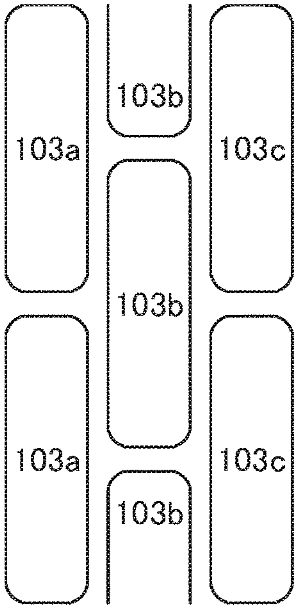
Figure 5E:
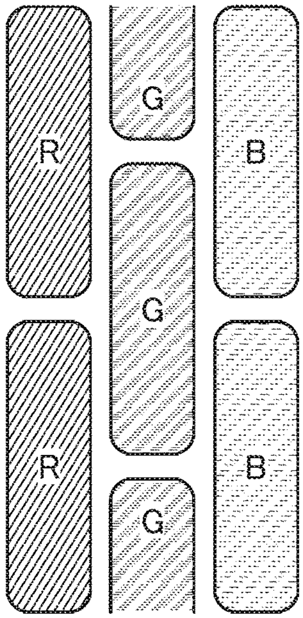

FIG. 4F illustrates an example in which subpixels of different colors are arranged in a zigzag manner. Specifically, the positions of the top sides of two subpixels arranged in the column direction (e.g., the subpixel 103*a* and the subpixel 103*b* or the subpixel 103*b* and the subpixel 103*c*) are not aligned in the top view. For example, as illustrated in FIG. 5E, the subpixel 103*a* may be a red subpixel R, the subpixel 103*b* may be a green subpixel G, and the subpixel 103*c* may be a blue subpixel B.

In a photolithography method, as a pattern to be formed by processing becomes finer, the influence of light diffraction becomes more difficult to ignore; accordingly, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel may have a polygonal shape with rounded corners, an elliptical shape, a circular shape, or the like.

Furthermore, in the method for manufacturing the display device of one embodiment of the present invention, the EL layer is processed into an island shape with the use of a resist mask. The resist film formed over the EL layer needs to be cured at a temperature lower than the upper temperature limit of the EL layer. Thus, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

Note that to obtain a desired top surface shape of the EL layer, a technique of correcting a mask pattern in advance so that a transferred pattern agrees with a design pattern (an OPC (Optical Proximity Correction technique) may be used. Specifically, with the OPC technique, a pattern for correction is added to a corner portion of a figure on a mask pattern, for example.

[Manufacturing Method Example]

An example of a method for manufacturing the display device of one embodiment of the present invention will be described below with reference to drawings. Here, description is made using the display device 100 described in the above structure example as an example.

Note that thin films included in the display device (insulating films, semiconductor films, conductive films, and the like) can be formed by a sputtering method, a CVD method, a vacuum evaporation method, a PLD method, an ALD method, or the like. Examples of the CVD method include a plasma-enhanced chemical vapor deposition (PECVD) method, a thermal CVD method, and the like. An example of the thermal CVD method is a metal organic chemical vapor deposition (MOCVD: Metal Organic CVD) method. Examples of an ALD method include a PEALD method and a thermal ALD method.

Alternatively, the thin films included in the display device (insulating films, semiconductor films, conductive films, and the like) can be formed by a method such as spin coating, dipping, spray coating, ink-jetting, dispensing, screen printing, offset printing, a doctor knife method, slit coating, roll coating, curtain coating, or knife coating.

In addition, when the thin films included in the display device are processed, a photolithography method can be used, for example. Besides, the thin films may be processed by a nanoimprinting method, a sandblasting method, a lift-off method, or the like. An island-shaped thin film may be directly formed by a deposition method using a shielding mask such as a metal mask.

There are the following two typical examples of a photolithography method. In one of the methods, a resist mask is formed over a thin film that is to be processed, the thin film is processed by etching or the like, and the resist mask is removed. In the other method, a photosensitive thin film is deposited and then processed into a desired shape by light exposure and development.

For light used for light exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. In addition, light exposure may be performed by liquid immersion exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing is possible. Note that when light exposure is performed by scanning of a beam such as an electron beam, a photomask is not needed.

For etching of the thin films, a dry etching method, a wet etching method, a sandblasting method, or the like can be used.

To manufacture the display device 100, firstly, the layer 101 including transistors is formed over a substrate (not illustrated). As described above, the layer 101 including transistors can have a stacked-layer structure in which an insulating layer is provided so as to cover the transistors, for example.

As the substrate, a substrate having at least heat resistance high enough to withstand later heat treatment can be used. In the case where an insulating substrate is used as the substrate, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate including silicon, silicon carbide, or the like as a material; a compound semiconductor substrate of silicon germanium or the like; or an SOI substrate.

Figure 6A:
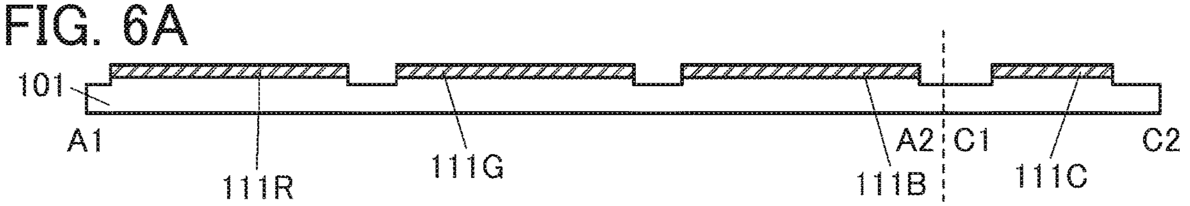
FIG. 6A to FIG. 6D are cross-sectional views illustrating an example of a method for manufacturing a display device.

Then, a conductive film to be the pixel electrodes 111 is deposited over the layer 101 including transistors. Specifically, for example, over an insulating surface of the layer 101 including transistors, a conductive film to be the pixel electrodes 111 is deposited. Then, the conductive film is partly removed by etching, whereby the pixel electrode 111R, the pixel electrode 111G, the pixel electrode 111B, and the connection electrode 111C are formed over the layer 101 including transistors (FIG. 6A).

In the case where a conductive layer having a reflective property with respect to visible light is used as the pixel electrode, a material that has a reflectance as high as possible in the whole wavelength range of visible light (e.g., silver, aluminum, or the like) is preferably used. This can increase color reproducibility as well as light extraction efficiency of the light-emitting elements.

Subsequently, an EL film 112Rf to be the EL layer 112R later is formed over the pixel electrode 111R, the pixel electrode 111G, and the pixel electrode 111B, and over the layer 101 including transistors. Here, the EL film 112Rf can be provided so as not to overlap with the connection electrode 111C. For example, the EL film 112Rf can be formed so as not to overlap with the connection electrode 111C when formed by shielding a region including the connection electrode 111C with a metal mask. The metal mask used here does not need to shield a pixel region of the display portion; hence, a fine mask is not required.

The EL film 112Rf includes at least a film containing a light-emitting compound. The EL film 112Rf may have a structure in which one or more of films functioning as a hole-injection layer, a hole-transport layer, a hole-blocking layer, an electron-blocking layer, an electron-transport layer, and an electron-injection layer are stacked. The EL film 112Rf can be formed by, for example, an evaporation method, a sputtering method, or an inkjet method. Note that without limitation to this, the above deposition method can be used as appropriate.

Next, a sacrificial film 144Ra is formed over the EL film 112Rf, over the connection electrode 111C, and over the layer 101 including transistors, and a sacrificial film 144Rb is formed over the sacrificial film 144Ra. That is, a sacrificial film having a two-layer stacked structure is formed over the EL film 112Rf, over the connection electrode 111C, and over the layer 101 including transistors. Note that the sacrificial film may have a single-layer structure or a stacked-layer structure of three or more layers. In a subsequent process of forming another sacrificial film, a sacrificial film has a two-layer stacked structure; however, the sacrificial film may have a single-layer structure or a stacked-layer structure of three or more layers.

The sacrificial film 144Ra and the sacrificial film 144Rb can be formed by, for example, a sputtering method, a CVD method, an ALD method, or a vacuum evaporation method. Note that a formation method that causes less damage to the EL layer is preferable, and the sacrificial film 144Ra formed directly on the EL film 112Rf is preferably formed by an ALD method or a vacuum evaporation method.

As the sacrificial film 144Ra, an inorganic film such as a metal film, an alloy film, a metal oxide film, a semiconductor film, or an inorganic insulating film can be suitably used.

Alternatively, an oxide film can be used as the sacrificial film 144Ra. An oxide film or an oxynitride film of silicon oxide, silicon oxynitride, aluminum oxide, aluminum oxynitride, hafnium oxide, hafnium oxynitride, or the like can also be typically used. For example, a nitride film can also be used as the sacrificial film 144Ra. Specifically, it is also possible to use a nitride such as silicon nitride, aluminum nitride, hafnium nitride, titanium nitride, tantalum nitride, tungsten nitride, gallium nitride, or germanium nitride. Such an inorganic insulating material can be formed by a deposition method such as a sputtering method, a CVD method, or an ALD method; the sacrificial film 144Ra, which is formed directly on the EL film 112Rf, is particularly preferably formed by an ALD method.

For the sacrificial film 144Ra, a metal material such as nickel, tungsten, chromium, molybdenum, cobalt, palladium, titanium, aluminum, yttrium, zirconium, or tantalum or an alloy material containing the metal material can be used, for example. It is particularly preferable to use a low-melting-point material such as aluminum or silver.

Alternatively, for the sacrificial film 144Ra, a metal oxide such as an indium gallium zinc oxide (an In—Ga—Zn oxide, also referred to as IGZO) can be used. It is also possible to use indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, for example, an indium tin oxide containing silicon can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. Specifically, M is preferably one or more kinds selected from gallium, aluminum, and yttrium.

Any of the above-described materials usable for the sacrificial film 144Ra can be used for the sacrificial film 144Rb. For example, from the above materials usable for the sacrificial film 144Ra, one material can be selected for the sacrificial film 144Ra and another material can be selected for the sacrificial film 144Rb. Alternatively, one or more materials can be selected for the sacrificial film 144Ra from the above materials usable for the sacrificial film 144Ra, and one or more materials selected from the materials excluding the material(s) selected for the sacrificial film 144Ra can be used for the sacrificial film 144Rb.

Specifically, aluminum oxide formed by an ALD method is preferably used as the sacrificial film 144Ra, and silicon nitride formed by a sputtering method is suitably used as the sacrificial film 144Rb. In the case of employing this structure, the deposition temperature at the time of depositing the materials by an ALD method and a sputtering method is preferably higher than or equal to room temperature and lower than or equal to 120° C., further preferably higher than or equal to room temperature and lower than or equal to 100° C., in which case adverse effects on the EL film 112Rf can be reduced. In the case of the stacked-layer structure of the sacrificial film 144Ra and the sacrificial film 144Rb, a stress applied to the stacked-layer structure is preferably small. Specifically, a stress applied to the stacked-layer structure is preferably higher than or equal to −500 MPa and less than or equal to +500 MPa, further preferably higher than or equal to −200 MPa and lower than or equal to +200 MPa, in which case troubles in the process, such as film separation and peeling, can be inhibited.

As the sacrificial film 144Ra, it is possible to use a film highly resistant to etching treatment performed on various EL films such as the EL film 112Rf, i.e., a film having high etching selectivity. Moreover, as the sacrificial film 144Ra, it is particularly preferable to use a film that can be removed by a wet etching method less likely to cause damage to EL films.

For the sacrificial film 141Ra, a material that can be dissolved in a chemically stable solvent may be used. In particular, a material that is dissolved in water or alcohol can be suitably used for the sacrificial film 144Ra. In deposition of the sacrificial film 144Ra, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of the wet deposition method that can be used for forming the sacrificial film 144Ra include spin coating, dipping, spray coating, ink-jetting, dispensing, screen printing, offset printing, a doctor knife method, slit coating, roll coating, curtain coating, knife coating, and the like.

For the sacrificial film 144Ra, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

As the sacrificial film 144Rb, a film having high etching selectivity with the sacrificial film 144Ra is used.

Preferably, an inorganic insulating material such as aluminum oxide, hafnium oxide, or silicon oxide formed by an ALD method is used for the sacrificial film 144Ra, and a metal material such as nickel, tungsten, chromium, molybdenum, cobalt, palladium, titanium, aluminum, yttrium, zirconium, or tantalum or an alloy material containing any of the metal materials formed by a sputtering method is used as the sacrificial film 144Rb. Tungsten formed by a sputtering method is particularly preferably used as the sacrificial film 144Rb. Alternatively, a metal oxide containing indium, such as indium gallium zinc oxide (also denoted as In—Ga—Zn oxide or IGZO), formed by a sputtering method may be used as the sacrificial film 144Rb. Furthermore, an inorganic material may be used for the sacrificial film 144Rb. For example, it is possible to use an oxide film or a nitride film such as a silicon oxide film, a silicon oxynitride film, a silicon nitride oxide film, a silicon nitride film, an aluminum oxide film, an aluminum oxynitride film, or a hafnium oxide film.

Alternatively, as the sacrificial film 144Rb, an organic film that can be used for the EL film 112Rf and the like may be used. For example, the same film as the organic film is used for the EL film 112Rf can be used as the sacrificial film 144Rb. The use of such an organic film is preferable, in which case the deposition apparatus for the EL film 112Rf can be used in common. Furthermore, the sacrificial film 144Rb can be removed at the same time as the etching of the EL film 112Rf; thus, the process can be simplified.

Figure 6B:
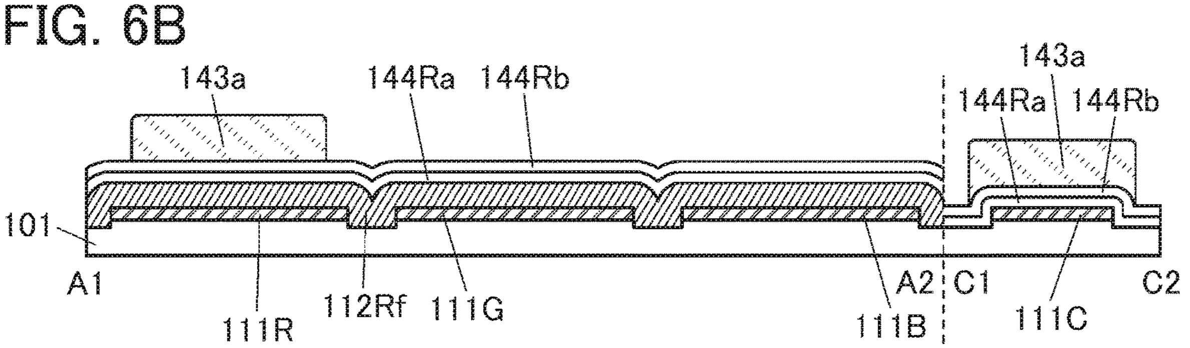

Next, a resist mask 143*a* is formed over the sacrificial film 144Rb (FIG. 6B). For the resist mask 143*a*, a resist material containing a photosensitive resin, such as a positive type resist material or a negative type resist material can be used.

Figure 6C:
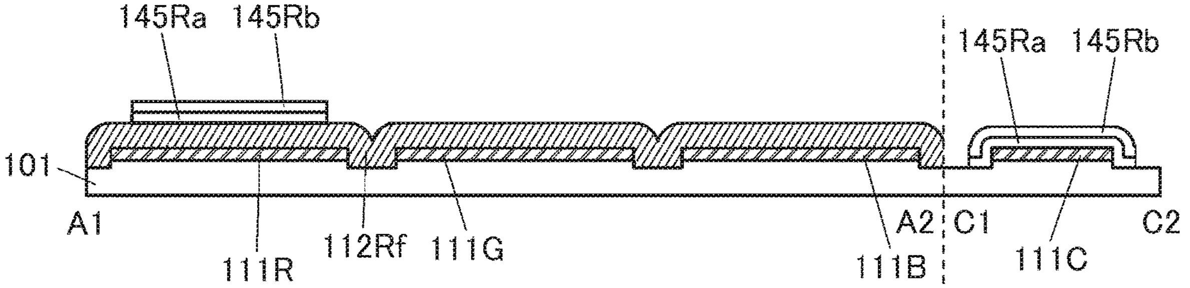

Then, part of the sacrificial film 144Rb and the sacrificial film 144Ra that is not covered with the resist mask 143*a* is removed by etching, whereby island-shaped or band-shaped sacrificial layers 145Rb and 145Ra are formed (FIG. 6C). As illustrated in FIG. 6C, the sacrificial layer 145Rb and the sacrificial layer 145Ra can be formed over the pixel electrode 111R and over the connection electrode 111C, for example.

Preferably, part of the sacrificial film 144Rb is removed by etching using the resist mask 143*a* to form the sacrificial layer 145Rb; then, the resist mask 143*a* is removed; after that, the sacrificial film 144Ra is etched using the sacrificial layer 145Rb as a hard mask. In this case, the etching of the sacrificial film 144Rb preferably employs etching conditions with high selectivity with the sacrificial film 144Ra. Although a wet etching method or a dry etching method can be used for the etching for forming the hard mask, a shrinkage of the pattern can be reduced by using a dry etching method.

Processing of the sacrificial film 144Ra and the sacrificial film 144Rb and removal of the resist mask 143*a* can be performed by a wet etching method or a dry etching method. For example, the sacrificial film 144Ra and the sacrificial film 144Rb can be processed by a dry etching method using a fluorine-containing gas. The resist mask 143*a* can be removed by a dry etching method using an oxygen-containing gas (also referred to as an oxygen gas) (such a method is also referred to as a plasma ashing method).

When the sacrificial film 144Ra is etched using the sacrificial layer 145Rb as a hard mask, the resist mask 143*a* can be removed while the EL film 112Rf is covered with the sacrificial film 144Ra. For example, if the EL film 112Rf is exposed to oxygen, the electrical characteristics of the light-emitting element 110R are adversely affected in some cases. Thus, in the case where the resist mask 143*a* is removed by a method using an oxygen gas, such as plasma ashing, the sacrificial film 144Ra is preferably etched using the sacrificial layer 145Rb as a hard mask.

Figure 6D:
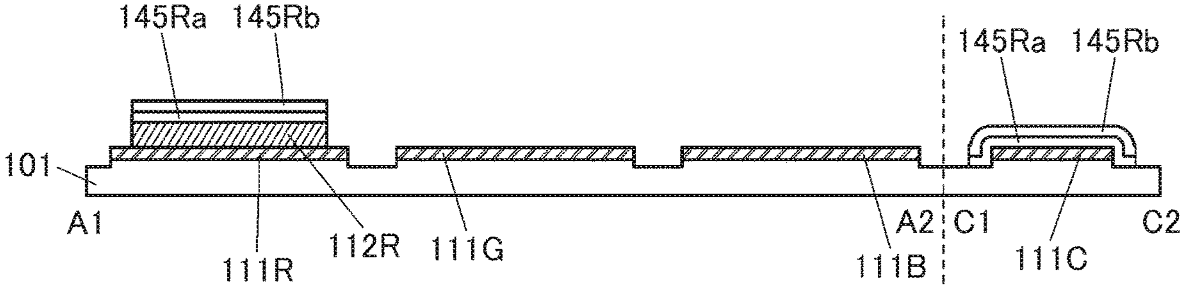

Next, part of the EL film 112Rf that is not covered with the sacrificial layer 145Ra is removed by etching, so that an island-shaped or band-shaped EL layer 112R is formed (FIG. 6D).

In addition, when a dry etching method using an oxygen gas is used for the etching of the EL film 112Rf, the etching rate can be increased. Thus, etching under a low-power condition can be performed while the etching rate is kept adequately high; hence, damage due to the etching can be reduced. Furthermore, for example, a defect such as attachment of a reaction product generated at the etching onto the EL layer 112R can be inhibited.

Alternatively, when the EL film 112Rf is etched by a dry etching method using an etching gas that does not contain oxygen as its main component, a change in properties of the EL film 112Rf can be inhibited, so that the display device 100 can be a highly reliable display device. Examples of the etching gas that does not contain oxygen as its main component include $CF_4$, $C_4F_8$, $SF_6$, $CHF_3$, $Cl_2$, $H_2O$, $BCl_3$, and a Group 18 element. Helium can be used as the Group 18 element, for example. Alternatively, a mixed gas of the above gas and a dilution gas that does not contain oxygen can be used as the etching gas. Note that etching of the EL film 112Rf is not limited to the above and may be performed by a dry etching method using another gas or a wet etching method.

If impurities are attached to the side surface of the EL layer 112R when the EL layer 112R is formed by the etching of the EL film 112Rf, the impurities might enter the inside of the EL layer 112R in the subsequent process. This degrades the reliability of the display device 100 in some cases. Thus, it is preferable to remove impurities attached to the surface of the EL layer 112R after the formation of the EL layer 112R, in which case the reliability of the display device 100 can be increased.

Impurities attached to the surface of the EL layer 112R can be removed, for example, by irradiation of the surface of the EL layer 112R with an inert gas. Here, the surface of the EL layer 112R is exposed immediately after the EL layer 112R is formed. Specifically, the side surface of the EL layer 112R is exposed. Accordingly, impurities attached to the EL layer 112R can be removed, for example, when the substrate where the EL layer 112R is formed is put in an inert gas atmosphere after the formation of the EL layer 112R. As the inert gas, one or more selected from Group 18 elements (typically, helium, neon, argon, xenon, and krypton) and nitrogen can be used, for example.

Next, a protective film 131Rf to be a protective layer 131R later is formed so as to cover the top surface of the layer 101 including transistors, the top surfaces and side surfaces of the pixel electrode 111R, the pixel electrode 111G, and the pixel electrode 111B, the side surface of the EL layer 112R, the side surface of the sacrificial layer 145Ra, and the side surface and top surface of the sacrificial layer 145Rb (FIG. 7A1).

FIG. 7A2 illustrates an enlarged view of a region surrounded by a dashed-dotted line in FIG. 7A1. As illustrated in FIG. 7A2, the protective film 131Rf can have a two-layer stacked structure of a protective film 131Raf to be a protective layer 131Ra later and a protective film 131Rbf to be a protective layer 131Rb later.

It is preferable that the protective film 131Raf be deposited by a method with high coverage and the protective film 131Rbf be deposited by a method with low coverage, for example. For example, the protective film 131Raf can be deposited by an ALD method and the protective film 131Rbf can be deposited by a sputtering method or a CVD method. Thus, the protective film 131Rf can have a large thickness as well as covering a step. Accordingly, entry of impurities such as oxygen and water to the EL layer 112R can be favorably inhibited. Consequently, the display device 100 can be a highly reliable display device.

An inorganic insulating material can be used for the protective film 131Rf. For the protective film 131Raf, for example, an inorganic oxide or an inorganic nitride can be used, and the protective film 131Rf can contain at least one of aluminum oxide, silicon oxide, silicon oxynitride, silicon nitride oxide, silicon nitride, aluminum oxynitride, and hafnium oxide, for example. For the protective film 131Rbf, for example, an inorganic nitride can be used, and the protective film 131Rbf can contain at least one of silicon nitride, aluminum nitride, and hafnium nitride, for example.

The protective film 131Raf is preferably deposited to have a thickness greater than or equal to 1 nm and less than or equal to 60 nm, further preferably deposited to have a thickness greater than or equal to 1 nm and less than or equal to 40 nm, still further preferably deposited to have a thickness greater than or equal to 5 nm and less than or equal to 20 nm. The protective film 131Rbf is preferably deposited to have a thickness greater than or equal to 60 nm and less than or equal to 300 nm, further preferably deposited to have a thickness greater than or equal to 60 nm and less than or equal to 150 nm, still further preferably deposited to have a thickness greater than or equal to 80 nm and less than or equal to 120 nm. Note that the protective film 131Raf and the protective film 131Rbf are each preferably a film whose kind and thickness generate no pin hole.

Here, when the EL layer 112R is exposed to the air or the like, impurities such as oxygen and water contained in the air might enter the inside of the EL layer 112R. After the formation of the EL layer 112R, the surface of the EL layer 112R, specifically, the side surface of the EL layer 112R, is exposed until the protective film 131Rf is formed. Accordingly, the processes from the etching of the EL film 112Rf to the deposition of the protective film 131Rf are preferably performed in the same apparatus. This makes it possible to form the protective film 131Rf covering the EL layer 112R without the exposure of the EL film 112R to the air after the EL film 112Rf is etched to form the EL layer 112R. Thus, entry of impurities contained in the air into the inside of the EL layer 112R is inhibited, whereby the display device 100 can be a highly reliable display device. Note that other processes are preferably performed in the same apparatus, in which case components of the display device can be inhibited from being exposed to, for example, the air in the manufacturing process of the display device 100, whereby throughput in the manufacturing of the display device 100 can be increased.

Next, the protective film 131Rf is etched to form the protective layer 131R (FIG. 7B1). The protective layer 131R is formed so as to include a region overlapping with the side surface of the EL layer 112R. Furthermore, the protective layer 131R is formed so as to include a region overlapping with the side surface of the pixel electrode 111R, the side surface of the pixel electrode 111G, the side surface of the pixel electrode 111B, the side surface of the sacrificial layer 145Ra, and the side surface of the sacrificial layer 145Rb. Note that in the case where the thickness of the protective film 131Rf is small, for example, the protective layer 131R is not formed in a region overlapping with the side surface of the pixel electrode 111R, the side surface of the pixel electrode 111G, the side surface of the pixel electrode 111B, the side surface of the sacrificial layer 145Ra, the side surface of the sacrificial layer 145Rb, or the like in some cases.

The protective layer 131R is formed so as to include a region overlapping with the side surface of the EL layer 112R, whereby entry of impurities such as oxygen and water from the side surface of the EL layer 112R to the inside thereof can be inhibited in subsequent processes. Accordingly, the display device 100 can be a highly reliable display device.

Anisotropic etching is preferably performed for the etching of the protective film 131Rf, in which case the protective layer 131 can be suitably formed without patterning using a photolithography method, for instance. Forming the protective layer 131 without patterning using a photolithography method, for example, enables simplification of the manufacturing process of the display device 100, resulting in lower manufacturing cost of the display device 100. Thus, the display device 100 can be an inexpensive display device. As described above, for example, a dry etching method can be given as anisotropic etching. In the case where the protective film 131Rf is etched by a dry etching method, for example, the protective film 131Rf can be etched with use of an etching gas usable in etching of the sacrificial film 144Ra or the sacrificial film 144Rb.

FIG. 7B2 illustrates an enlarged view of a region surrounded by a dashed-dotted line in FIG. 7B1. As illustrated in FIG. 7B2, the protective layer 131R can have a two-layer stacked structure of the protective layer 131Ra and the protective layer 131Rb.

In the processes illustrated in FIG. 6C to FIG. 6D, when the EL film 112Rf is etched with use of an oxygen-containing gas, the surface states of the pixel electrode 111G and the pixel electrode 111B are changed in some cases. For example, the surfaces of the pixel electrode 111G and the pixel electrode 111B become hydrophilic in some cases. For example, in the case where each of the upper surfaces of the pixel electrode 111G and the pixel electrode 111B is a layer containing indium tin oxide, the layer containing indium tin oxide becomes hydrophilic in some cases by the etching of the EL film 112Rf with use of an oxygen-containing gas. Here, an EL film to be formed so as to include a region in contact with the pixel electrode 111G and an EL film to be formed so as to include a region in contact with the pixel electrode 111B in a later process are hydrophobic, for example. Adhesion between a hydrophilic surface and a hydrophobic surface is lower than adhesion between hydrophilic surfaces and adhesion between hydrophobic surfaces. From the above, when the surfaces of the pixel electrode 111G and the pixel electrode 111B are hydrophilic, adhesion between the surfaces and an EL film to be formed in a later process is lowered in some cases. Accordingly, in a later process, the EL film is separated at the interface with the pixel electrode 111G or the interface with the pixel electrode 111B. Moreover, when the etching of the EL film 112Rf is performed using a gas containing oxygen, work functions of the surfaces of the pixel electrode 111G and the pixel electrode 111B changes in some cases in addition to the change in the surface states described above.

In view of this, hydrophobic treatment is performed on the surface of the pixel electrode 111G and the surface of the pixel electrode 111B, whereby film separation of the EL film to be formed in a later process can be inhibited. Thus, the display device 100 can be a highly reliable display device. In addition, the yield in manufacturing the display device 100 can be increased, and the display device 100 can be an inexpensive display device. The hydrophobic treatment is preferably performed after the formation of the protective layer 131R.

The hydrophobic treatment can be performed by fluorine modification of the pixel electrode 111G and the pixel electrode 111B, for example. The fluorine modification can be performed by, for example, treatment or heat treatment using a fluorine-containing gas, plasma treatment in an atmosphere of a fluorine-containing gas, or the like. As the fluorine-containing gas, a fluorine gas such as a fluorocarbon gas can be used, for example. As a fluorocarbon gas, a low carbon fluoride gas such as a carbon tetrafluoride ($CF_4$) gas, a $C_4F_6$ gas, a $C_2F_6$ gas, a $C_4F_8$ gas, or a $C_5F_8$ gas can be used, for example. Moreover, as the fluorine-containing gas, a $SF_6$ gas, a $NF_3$ gas, a $CHF_3$ gas, or the like can be used, for example. Alternatively, a helium gas, an argon gas, a hydrogen gas, or the like can be added to these gases as appropriate.

In addition, treatment using a silylation agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic. As the silylation agent, hexamethyldisilazane (HMDS), N-trimethylsilylimidazole (TMSI), or the like can be used. Alternatively, treatment using a silane coupling agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic.

Plasma treatment on the surface of the pixel electrode 111G and the surface of the pixel electrode 111B in a gas atmosphere containing a Group 18 element such as argon can apply damage to the surface of the pixel electrode 111G and the surface of the pixel electrode 111B. Accordingly, a methyl group included in the silylation agent such as HMDS is likely to bond to the surface of the pixel electrode 111G and the surface of the pixel electrode 111B. Moreover, silane coupling due to the silane coupling agent is likely to occur. As described above, treatment using a silylation agent or a silane coupling agent performed on the surface of the pixel electrode 111G and the surface of the pixel electrode 111B after plasma treatment in a gas atmosphere containing a Group 18 element such as argon enables the surface of the pixel electrode 111G and the surface of the pixel electrode 111B to become hydrophobic.

The treatment using the silylation agent, the silane coupling agent, or the like can be performed by application of the silylation agent, the silane coupling agent, or the like by a spin coating method or a dipping method, for example. The treatment using the silylation agent, the silane coupling agent, or the like can also be performed by forming a film containing the silylation agent, a film containing the silane coupling agent, or the like over the pixel electrode 111G, over the pixel electrode 111B, and the like by a gas phase method, for example. In a gas phase method, first, a material containing the silylation agent, a material containing the silane coupling agent, or the like is volatilized so that the silylation agent, the silane coupling agent, or the like is included in the atmosphere. Next, a substrate where the pixel electrode 111G, the pixel electrode 111B, and the like are formed is provided in the atmosphere. In this manner, a film containing a silylation agent, a silane coupling agent, or the like can be formed over the pixel electrode 111G, over the pixel electrode 111B, and the like, whereby the surface of the pixel electrode 111G and the surface of the pixel electrode 111B can become hydrophobic.

Next, an EL film 112Gf to be the EL layer 112G later is formed over the sacrificial layer 145Rb, over the protective layer 131R, over the pixel electrode 111G, over the pixel electrode 111B, and over the layer 101 including transistors. Forming the EL film 112Gf after the formation of the sacrificial layer 145R and the protective layer 131R can prevent the EL film 112Gf from being in contact with the EL layer 112R. For the formation of the EL film 112Gf, for example, the description of the formation of the EL film 112Rf can be referred to.

Figure 8A:
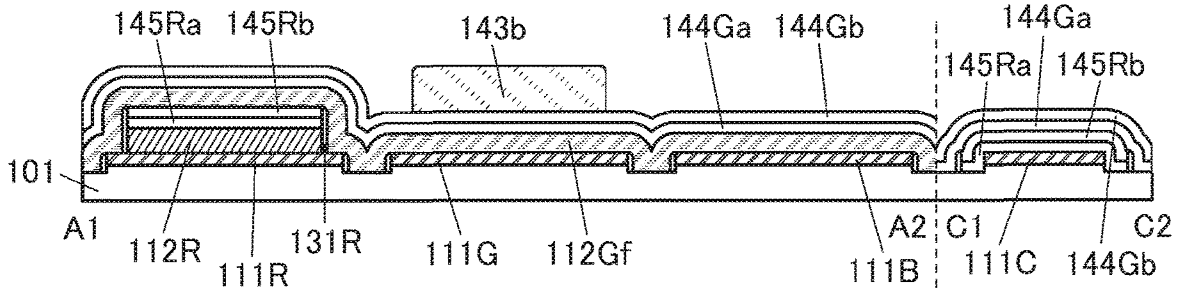
FIG. 8A to FIG. 8C are cross-sectional views illustrating an example of a method for manufacturing a display device.

Subsequently, a sacrificial film 144Ga is formed over the EL film 112Gf, over the sacrificial layer 145Rb, and over the layer 101 including transistors, and a sacrificial film 144Gb is formed over the sacrificial film 144Ga. Then, a resist mask 143*b* is formed over the sacrificial film 144Gb (FIG. 8A). The description of the formation and the like of the sacrificial film 144Ra, the sacrificial film 144Rb, and the resist mask 143*a* can be referred to for the formation and the like of the sacrificial film 144Ga, the sacrificial film 144Gb, and the resist mask 143*b*.

Figure 8B:
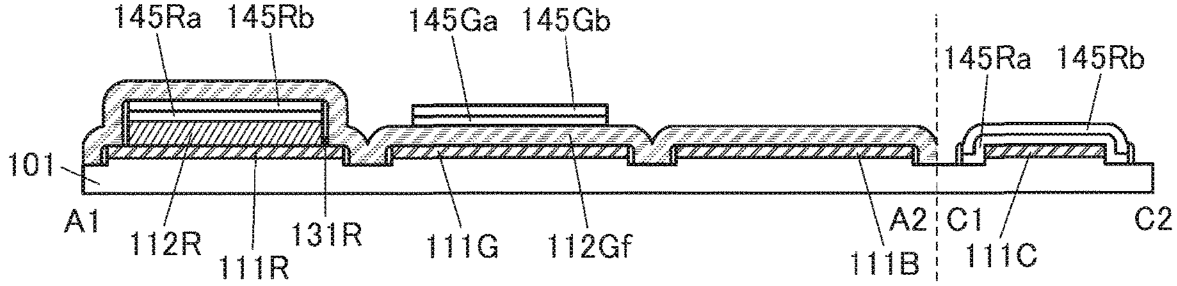

Then, part of the sacrificial film 144Gb and the sacrificial film 144Ga, which is not covered with the resist mask 143*b*, is removed by etching, whereby island-shaped or band-shaped sacrificial layers 145Gb and 145Ga are formed. In addition, the resist mask 143*b* is removed (FIG. 8B). Here, the sacrificial layer 145Gb and the sacrificial layer 145Ga can be formed over the pixel electrode 111G. The description of the formation of the sacrificial layer 145Rb and the sacrificial layer 145Ra, removal of the resist mask 143*a*, and the like can be referred to for the formation of the sacrificial layer 145Gb and the sacrificial layer 145Ga, removal of the resist mask 143*b*, and the like.

Figure 8C:
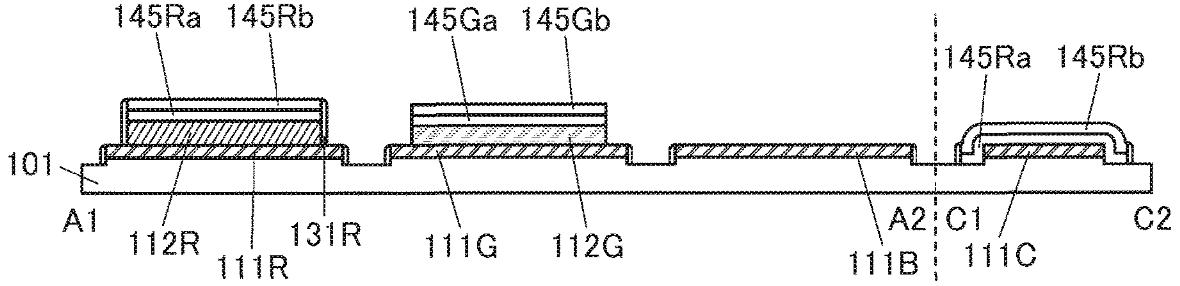

Next, part of the EL film 112Gf that is not covered with the sacrificial layer 145Ga is removed by etching, so that the island-shaped or band-shaped EL layer 112G is formed (FIG. 8C). For the formation of the EL layer 112G, for example, the description of the formation of the EL layer 112R can be referred to. As in the case of the EL layer 112R, it is preferable to remove impurities attached to the surface of the EL layer 112G. For example, impurities attached to the EL layer 112G can be removed when the substrate where the EL layer 112G is formed is put in an inert gas atmosphere after the formation of the EL layer 112G.

Subsequently, a protective film 131Gf to be a protective layer 131G later is formed so as to cover the top surface of the layer 101 including transistors, the top surface of the pixel electrode 111B, the side surface of the EL layer 112G, the side surface of the protective layer 131R, the top surface of the sacrificial layer 145Rb, the side surface of the sacrificial layer 145Ga, and the side surface and top surface of the sacrificial layer 145Gb (FIG. 9A1). For the formation of the protective film 131Gf, for example, the description of the formation of the protective film 131Rf can be referred to. Here, the processes from the etching of the EL film 112Gf to the deposition of the protective film 131Gf are preferably performed in the same apparatus, in which case the protective film 131Gf covering the EL layer 112G can be formed without exposure of the EL layer 112G to the air.

FIG. 9A2 illustrates an enlarged view of a region surrounded by a dashed-dotted line in FIG. 9A1. As illustrated in FIG. 9A2, the protective film 131Gf can have a two-layer stacked structure of a protective film 131Gaf to be a protective layer 131Ga later and a protective film 131Gbf to be a protective layer 131Gb later. For the protective film 131Gaf and the protective film 131Gbf, the description of the protective film 131Raf and the protective film 131Rbf can be referred to.

Next, the protective film 131Gf is etched to form the protective layer 131G (FIG. 9B1). The protective layer 131G is formed so as to include a region overlapping with the side surface of the EL layer 112G. In addition, the protective layer 131G is formed so as to include a region overlapping with the side surface of the protective layer 131R, the side surface of the sacrificial layer 145Ga, and the side surface of the sacrificial layer 145Gb. Note that in the case where the thickness of the protective film 131Gf is small, for example, the protective layer 131G is not formed in a region overlapping with the side surface of the protective layer 131R, the side surface of the sacrificial layer 145Ga, the side surface of the sacrificial layer 145Gb, or the like in some cases. For the formation of the protective layer 131G, for example, the description of the formation of the protective layer 131R can be referred to.

FIG. 9B2 illustrates an enlarged view of a region surrounded by a dashed-dotted line in FIG. 9B1. As illustrated in FIG. 9B2, the protective layer 131G can have a two-layer stacked structure of the protective layer 131Ga and the protective layer 131Gb. For the protective layer 131Ga and the protective layer 131Gb, the description of the protective layer 131Ra and the protective layer 131Rb can be referred to.

Subsequently, an EL film 112Bf to be the EL layer 112B later is formed over the sacrificial layer 145Rb, over the sacrificial layer 145Gb, over the protective layer 131R, over the protective layer 131G, over the pixel electrode 111B, and over the layer 101 including transistors. Forming the EL film 112Bf after the formation of the sacrificial layer 145G and the protective layer 131G can prevent the EL film 112Bf from being in contact with the EL layer 112G. For the formation of the EL film 112Bf, for example, the description of the formation of the EL film 112Rf can be referred to.

Figure 10A:
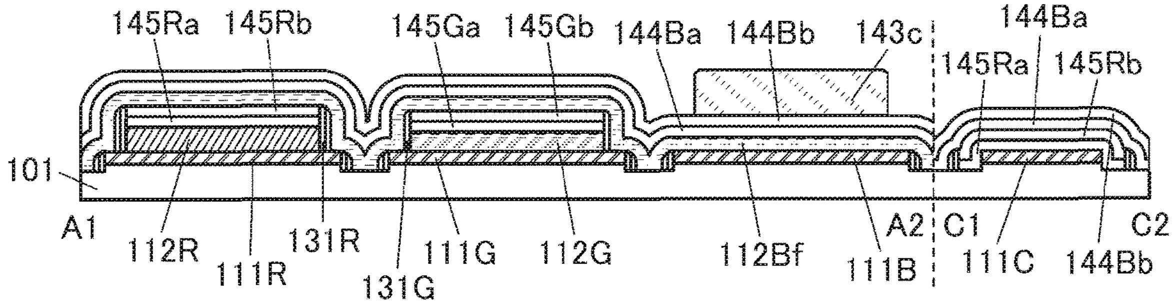
FIG. 10A to FIG. 10C are cross-sectional views illustrating an example of a method for manufacturing a display device.

Next, a sacrificial film 144Ba is formed over the EL film 112Bf, over the sacrificial layer 145Rb, and over the layer 101 including transistors, and a sacrificial film 144Bb is formed over the sacrificial film 144Ba. Then, a resist mask 143*c* is formed over the sacrificial film 144Bb (FIG. 10A). The description of the formation and the like of the sacrificial film 144Ra, the sacrificial film 144Rb, and the resist mask 143*a* can be referred to for the formation and the like of the sacrificial film 144Ba, the sacrificial film 144Bb, and the resist mask 143*c*.

Figure 10B:
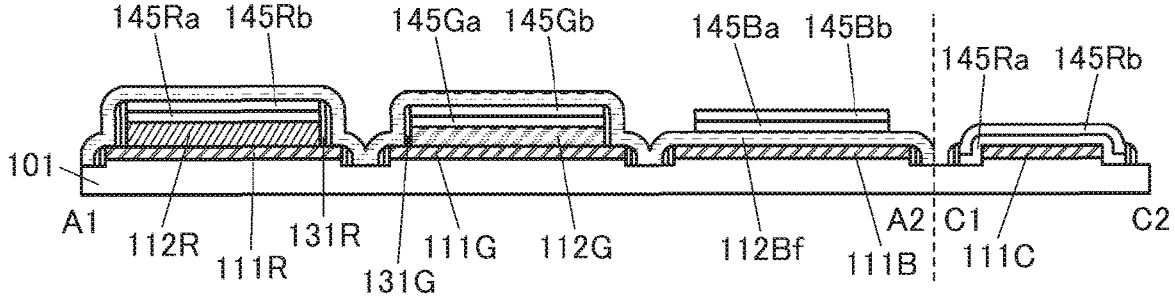

Subsequently, part of the sacrificial film 144Bb and the sacrificial film 144Ba, which is not covered with the resist mask 143*c*, is removed by etching, whereby island-shaped or band-shaped sacrificial layers 145Bb and 145Ba are formed. Furthermore, the resist mask 143*c* is removed (FIG. 10B). Here, the sacrificial layer 145Bb and the sacrificial layer 145Ba can be formed over the pixel electrode 111B. The description of the formation of the sacrificial layer 145Rb and the sacrificial layer 145Ra, the removal of the resist mask 143*a*, and the like can be referred to for the formation of the sacrificial layer 145Bb and the sacrificial layer 145Ba, the removal of the resist mask 143*c*, and the like.

Figure 10C:
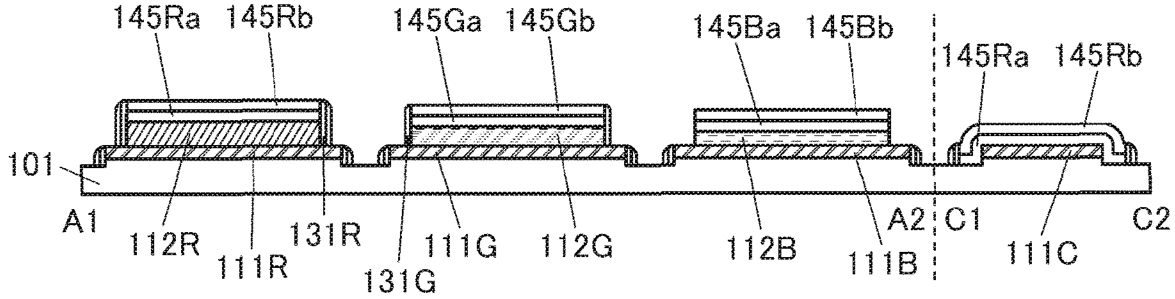

Next, part of the EL film 112Bf that is not covered with the sacrificial layer 145Ba is removed by etching, so that the island-shaped or band-shaped EL layer 112B is formed (FIG. 10C). For the formation of the EL layer 112B, for example, the description of the formation of the EL layer 112R can be referred to. As in the case of the EL layer 112R and the EL layer 112G, it is preferable to remove impurities attached to the surface of the EL layer 112B. For example, impurities attached to the EL layer 112B can be removed when the substrate where the EL layer 112B is formed is put in an inert gas atmosphere after the formation of the EL layer 112B.

Figure 11A:
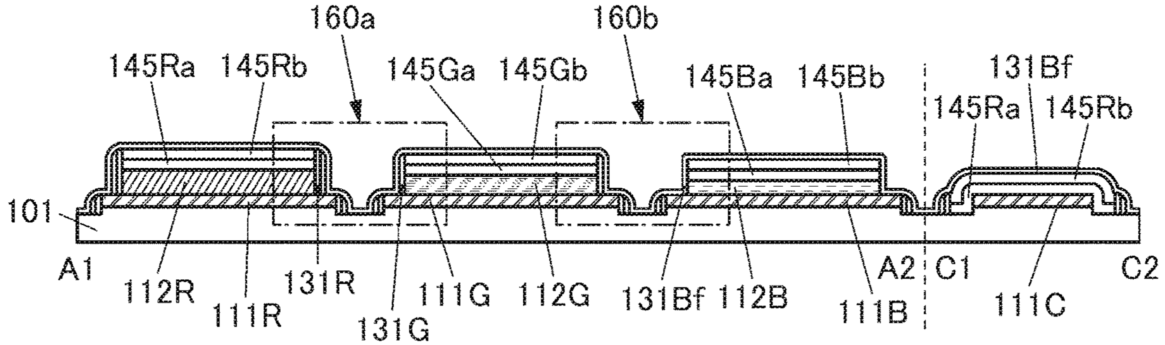
FIG. 11A to FIG. 11C are cross-sectional views illustrating an example of a method for manufacturing a display device.

Subsequently, a protective film 131Bf to be the protective layer 131B later is formed so as to cover the top surface of the layer 101 including transistors, the side surface of the EL layer 112B, the side surface of the protective layer 131G, the top surface of the sacrificial layer 145Rb, the top surface of the sacrificial layer 145Gb, the side surface of the sacrificial layer 145Ba, and the side surface and top surface of the sacrificial layer 145Bb (FIG. 11A). For the formation of the protective film 131Bf, for example, the description of the formation of the protective film 131Rf can be referred to. Here, the processes from the etching of the EL film 112Bf to the deposition of the protective film 131Bf are preferably performed in the same apparatus, in which case the protective film 131Bf covering the EL layer 112B can be formed without exposure of the EL layer 112B to the air.

Figure 11B:
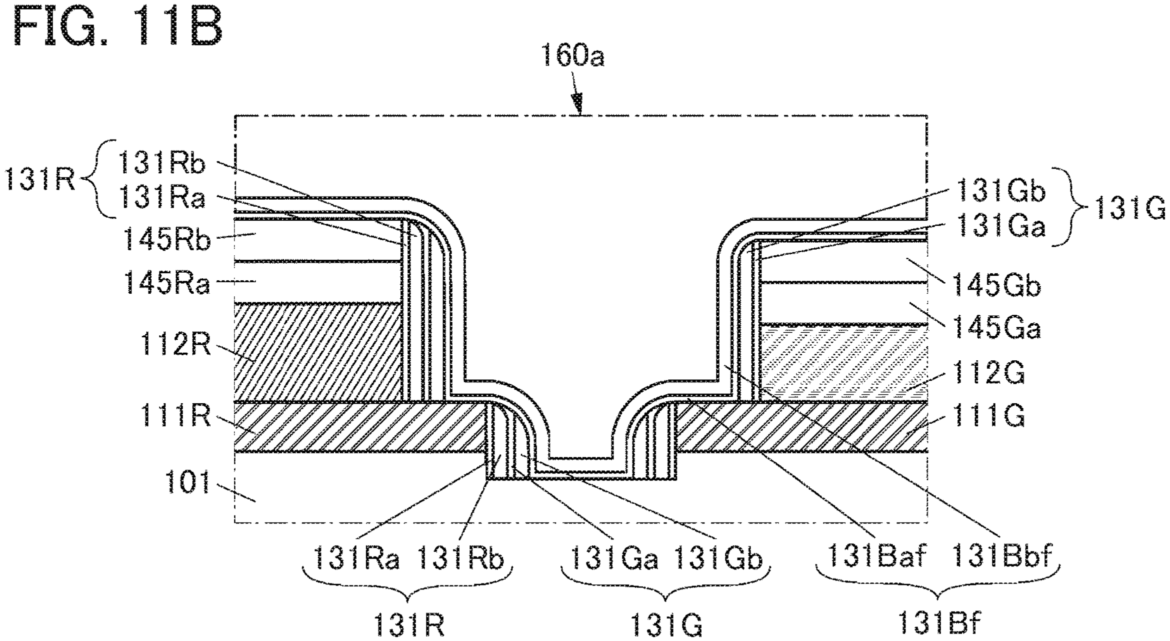
Figure 11C:
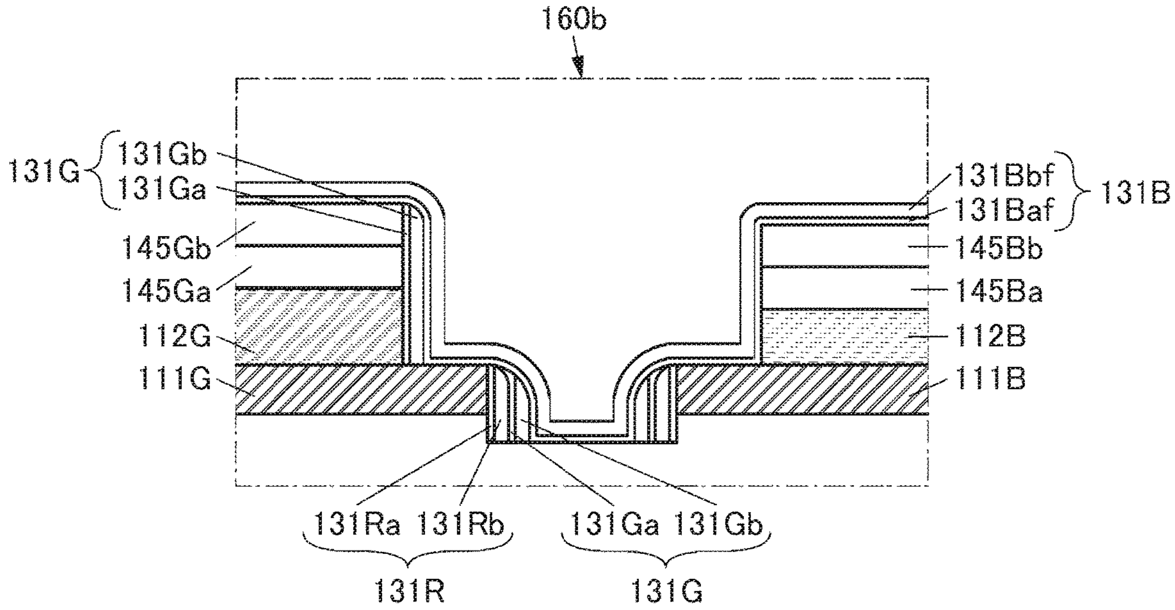

FIG. 11B illustrates an enlarged view of a region 160*a* shown in FIG. 11A, and FIG. 11C illustrates an enlarged view of a region 160*b* shown in FIG. 11A. The region 160*a* includes a region between the EL layer 112R and the EL layer 112G, and the region 160*b* includes a region between the EL layer 112G and the EL layer 112B. As illustrated in FIG. 11B and FIG. 11C, the protective film 131Bf can have a two-layer stacked structure of a protective film 131Baf to be a protective layer 131Ba later and a protective film 131Bbf to be a protective layer 131Bb later. For the protective film 131Baf and the protective film 131Bbf, the description of the protective film 131Raf and the protective film 131Rbf can be referred to.

Then, an insulating film 132*f* to be the insulating layer 132 later is formed over the protective film 131Bf (FIG. 12A).

The insulating film 132*f* is formed in contact with the protective film 131Bf, specifically, the protective film 131Bbf, for example. As the insulating film 132*f*, an insulating film containing an organic material is preferably used, and a resin is preferably used as the organic material. Moreover, a photosensitive resin can be used for the insulating film 132*f*. As the photosensitive resin, a positive photosensitive material or a negative photosensitive material can be used.

When a photosensitive resin is used for the insulating film 132*f*, the insulating film 132*f* can be formed by a spin coating method, a spraying method, a screen printing method, a painting method, or the like.

As illustrated in FIG. 12A, the insulating film 132*f* may have a slight unevenness reflecting unevenness of the formation surface. Alternatively, the insulating film 132*f* is planarized in some cases.

Next, the insulating layer 132 is formed (FIG. 12B1). Here, when a photosensitive resin is used for the insulating film 132*f*, the insulating layer 132 can be formed without providing an etching mask such as a resist mask or a hard mask. Since a photosensitive resin can be processed only by light exposure and development processes, the insulating layer 132 can be formed without using a dry etching method, for example. Thus, the processes can be simplified. In addition, damage to the EL layer 112 due to etching of the insulating film 132*f* can be reduced. Note that the level of the surface may be adjusted by further etching of the upper portion of the insulating layer 132.

The insulating layer 132 may alternatively be formed by performing etching substantially uniformly on the top surface of the insulating film 132*f*. Such uniform etching for planarization is also referred to as etch back.

To form the insulating layer 132, the light exposure and development steps and the etch back step may be used in combination.

FIG. 12B2 illustrates an enlarged view of a region surrounded by a dashed-dotted line in FIG. 12B1. As illustrated in FIG. 12B2, the insulating layer 132 can have a concave shape. Here, the level of an upper end portion of the insulating layer 132 can be lower than or equal to the level of the top surface of the protective film 131Bbf, for example.

Figure 13A:
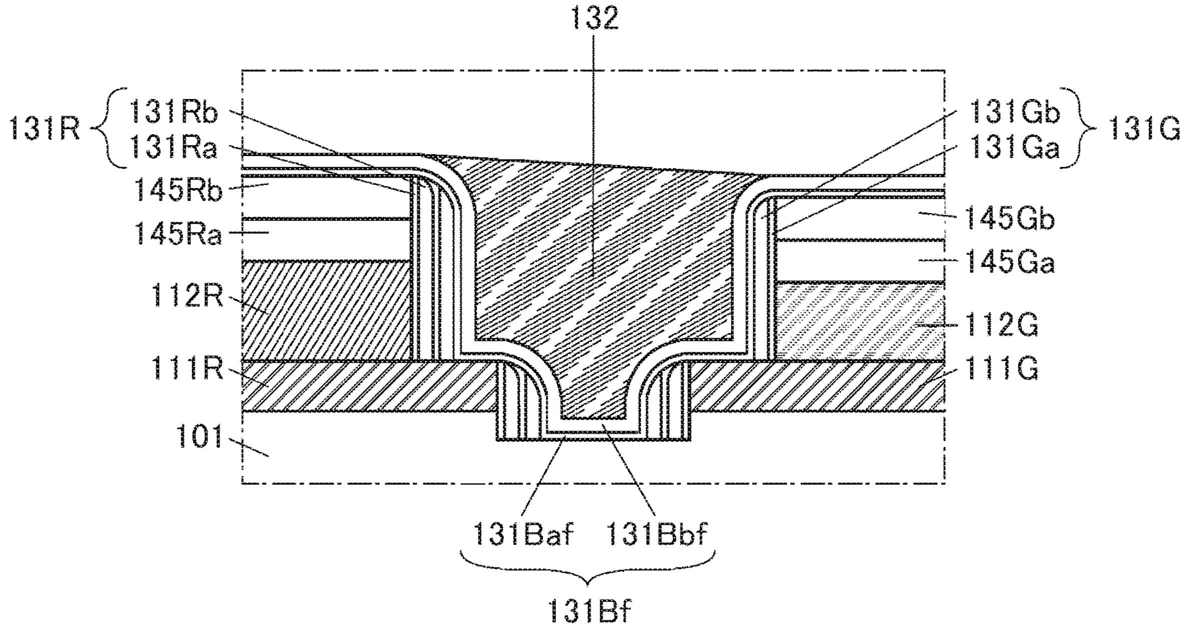
FIG. 13A and FIG. 13B are cross-sectional views each illustrating an example of a method for manufacturing a display device.
Figure 13B:
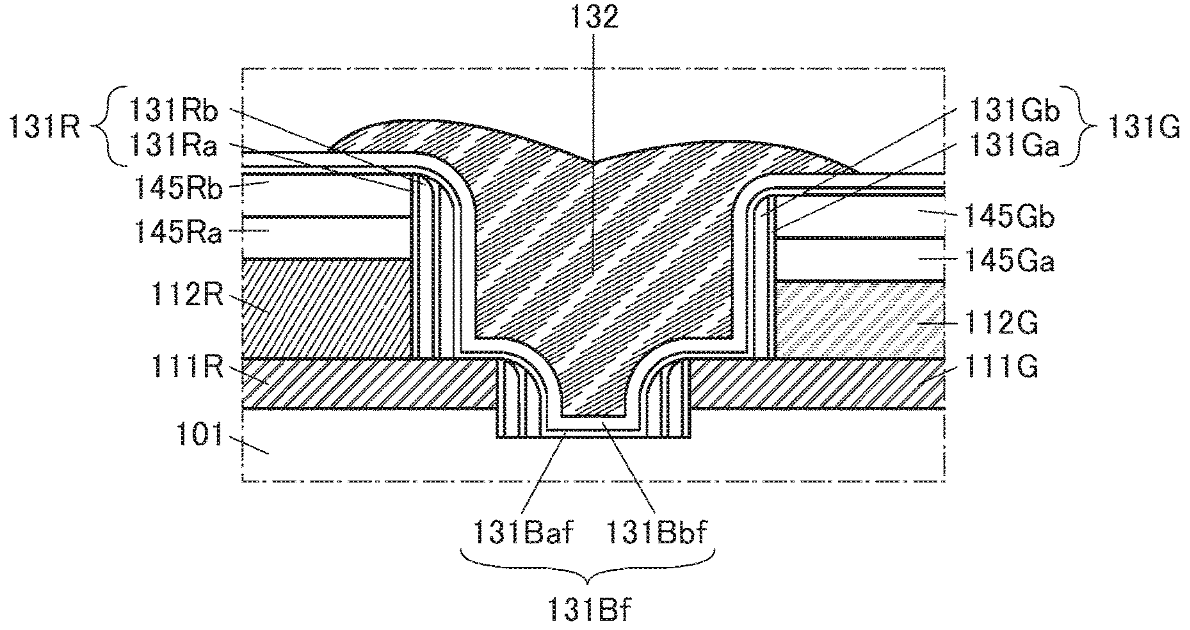

FIG. 13A and FIG. 13B illustrate modification examples of the structure in FIG. 12B2.

The structures illustrated in FIG. 13A and FIG. 13B differ from the structure in FIG. 12B2 in the shape of the insulating layer 132, for example.

The insulating layer 132 illustrated in FIG. 13A has a flat top surface. In the example illustrated in FIG. 13A, the level of the upper end portion of the insulating layer 132 is equal to the level of the top surface of the protective film 131Bbf.

The insulating layer 132 illustrated in FIG. 13B includes a region overlapping with the top surface of the EL layer 112 with the protective film 131Bf, the sacrificial layer 145*b*, and the sacrificial layer 145*a* therebetween. Here, the insulating layer 132 is further processed from the state illustrated in FIG. 13B, whereby the insulating layer 132 can have a shape illustrated in FIG. 12B2 or FIG. 13A.

Next, the protective film 131Bf is etched to form the protective layer 131B (FIG. 14A). The protective layer 131B is formed so as to include a region overlapping with the side surface of the EL layer 112B. The protective layer 131B is formed so as to include a region in contact with the side surface of the insulating layer 132 and a region in contact with the bottom surface of the insulating layer 132. For the formation of the protective layer 131B, for example, the description of the formation of the protective layer 131R can be referred to.

Subsequently, the sacrificial layer 145Rb, the sacrificial layer 145Gb, and the sacrificial layer 145Bb are removed by etching, for example (FIG. 14B1). In the etching of the sacrificial layer 145*b*, a condition with high selectivity with the sacrificial layer 145*a* is preferably employed. Note that the sacrificial layer 145*b* is not necessarily removed.

FIG. 14B2 illustrates an enlarged view of a region surrounded by a dashed-dotted line in FIG. 14B1. Although FIG. 14B2 illustrates an example in which part of the protective layer 131 is removed by removal of the sacrificial layer 145*b* and the uppermost surface of the protective layer 131 including a region in contact with the side surface of the EL layer 112 is aligned with the top surface of the sacrificial layer 145*a*, one embodiment of the present invention is not limited thereto. For example, the uppermost surface of the protective layer 131 including a region in contact with the side surface of the EL layer 112 may be higher than the top surface of the sacrificial layer 145*a*.

Then, a protective film 133*f* to be the protective layer 133 later is formed so as to cover the top surface of the insulating layer 132 and the top surfaces of the sacrificial layer 145Ra, the sacrificial layer 145Ga, and the sacrificial layer 145Ba (FIG. 15A). The protective film 133*f* can be formed by a sputtering method, a CVD method, a vacuum evaporation method, a PLD method, or an ALD method, for example.

An inorganic insulating material can be used for the protective film 133*f*; for example, a nitride can be used. Specifically, the protective film 133*f* can contain at least one of silicon nitride, aluminum nitride, and hafnium nitride. An oxide or an oxynitride can be used for the protective film 133*f*; for example, an oxide film or an oxynitride film of silicon oxide, silicon oxynitride, aluminum oxide, aluminum oxynitride, hafnium oxide, hafnium oxynitride, or the like can be used.

Next, the protective film 133*f* is processed to form the protective layer 133 (FIG. 15B1). The processing of the protective film 133*f* can be performed by a photolithography method, for example. Specifically, first, a resist mask is formed over the protective film 133*f*. Next, a part of the protective film 133*f* that is not covered with the resist mask is removed by etching. In the above manner, the protective layer 133 can be formed.

FIG. 15B2 illustrates an enlarged view of a region surrounded by a dashed-dotted line in FIG. 15B1. Although the end portion of the protective layer 133 is aligned with the end portion of the sacrificial layer 145*a* in FIG. 15B2, the end portion of the protective layer 133 is not necessarily aligned with the end portion of the sacrificial layer 145*a*. For example, the protective layer 133 may include a region overlapping with the sacrificial layer 145*a*. The end portion of the protective layer 133 may be positioned between the end portion of the sacrificial layer 145*a* and the end portion of the insulating layer 132.

Figure 16A:
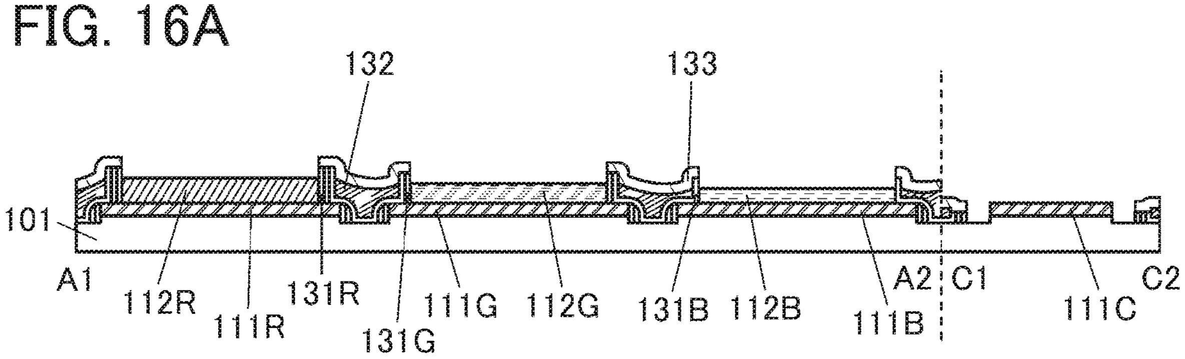
FIG. 16A and FIG. 16B are cross-sectional views illustrating an example of a method for manufacturing a display device.

Subsequently, the sacrificial layer 145Ra, the sacrificial layer 145Ga, and the sacrificial layer 145Ba are removed by etching, for example (FIG. 16A). It is preferable that the sacrificial layer 145Ra, the sacrificial layer 145Ga, and the sacrificial layer 145Ba be removed by a method that causes damage to the EL layers 112 as little as possible; for example, it is preferable to use a wet etching method. Note that a part of the upper portion of the protective layer 133 and a part of the upper portion of the protective layer 131 are etched in some cases owing to the removal of the sacrificial layer 145Ra, the sacrificial layer 145Ga, and the sacrificial layer 145Ba.

Next, vacuum baking treatment is performed to remove water and the like adsorbed on the surface of the EL layer 112R, the surface of the EL layer 112G, and the surface of the EL layer 112B. The vacuum baking is preferably performed in a range of temperatures with which properties of the organic compounds contained in the EL layer 112R, the EL layer 112G, the EL layer 112R, and the like are not changed and can be performed, for example, at higher than or equal to 70° C. and lower than or equal to 120° C., preferably higher than or equal to 80° C. and lower than or equal to 100° C. The vacuum backing treatment is not necessarily performed when water and the like adsorbed on the surface of the EL layer 112R, the surface of the EL layer 112G, the surface of the EL layer 112B, and the like are small in amount and are less likely to adversely affect the reliability of the display device 100, for example.

Next, the common layer 114 is formed over the EL layers 112, the protective layer 133, and the layer 101 including transistors. As described above, the common layer 114 includes at least one of a hole-injection layer, a hole-transport layer, a hole-blocking layer, an electron-blocking layer, an electron-transport layer, and an electron-injection layer and includes, for example, an electron-injection layer or a hole-injection layer. The common layer 114 can be formed by, for example, an evaporation method, a sputtering method, an inkjet method, or the like. Note that in the case where the common layer 114 is not provided over the connection electrode 111C, a metal mask that shields the upper portion of the connection electrode 111C is used in the formation of the common layer 114. The metal mask used here does not need to shield a pixel region of the display portion; hence, a fine mask is not required.

Next, the common electrode 115 is formed over the common layer 114. The common electrode 115 can be formed by a sputtering method or a vacuum evaporation method, for example. Through the above processes, the light-emitting element 110R, the light-emitting element 110G, and the light-emitting element 110B can be manufactured.

Figure 16B:
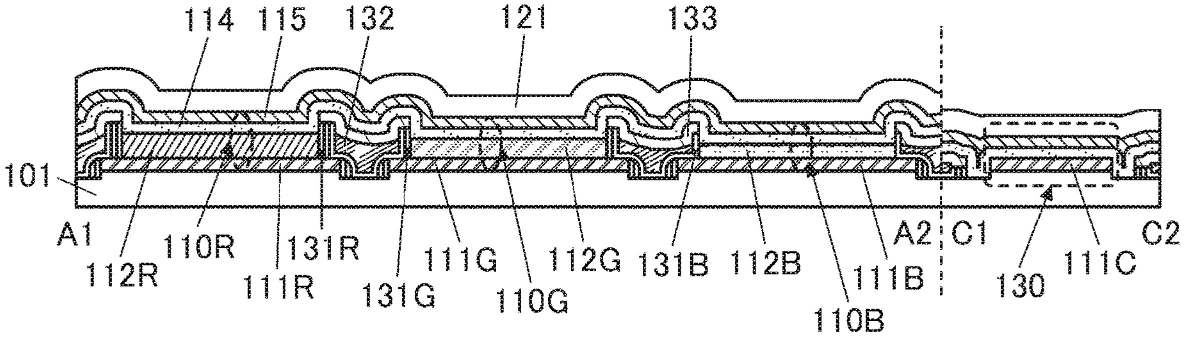

Next, the protective layer 121 is formed over the common electrode 115 (FIG. 16B). When an inorganic insulating film is used as the protective layer 121, the protective layer 121 is preferably formed by a sputtering method, a CVD method, or an ALD method, for example. When an organic insulating film is used as the protective layer 121, the protective layer 121 is preferably formed by an inkjet method, for example, in which case a uniform film can be formed in a desired area.

Through the above processes, the display device 100 can be manufactured.

As described above, in the method for manufacturing the display device of one embodiment of the present invention, EL layers are separately formed by a photolithography method and an etching method without using a shadow mask such as a metal mask. Accordingly, the EL layer can have a fine pattern. Thus, a display device with high resolution and a high aperture ratio can be manufactured by the method for manufacturing the display device of one embodiment of the present invention. In addition, a high-definition display device and a large-sized display device can be manufactured. Moreover, EL layers can be separately formed, whereby a display device that performs extremely clear display with high contrast and high display quality can be manufactured.

Structure Example_2

Figure 17A:
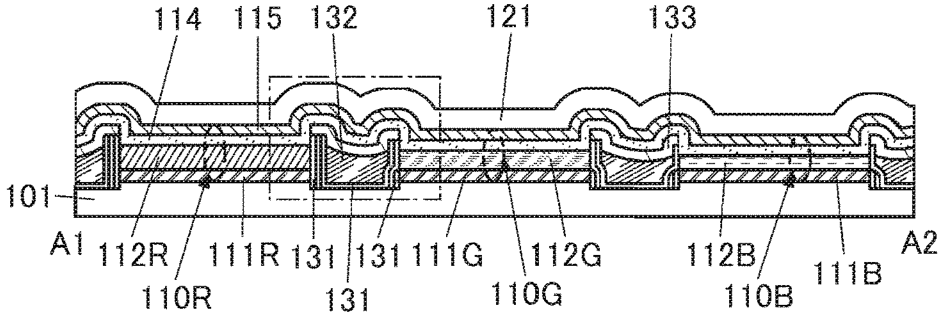
FIG. 17A to FIG. 17D are cross-sectional views illustrating a structure example of a display device.
Figure 17B:
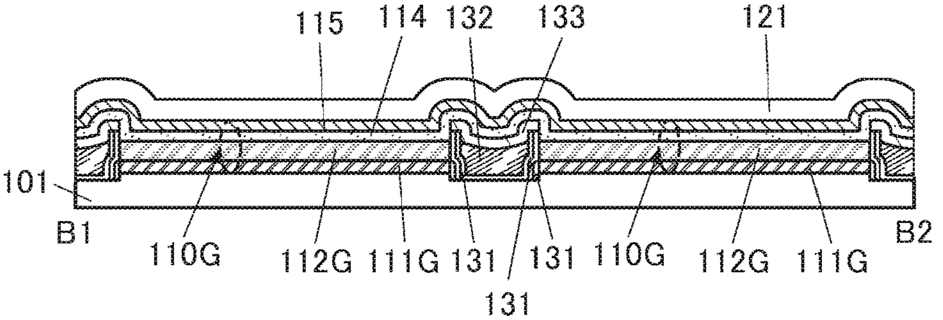
Figure 17C:
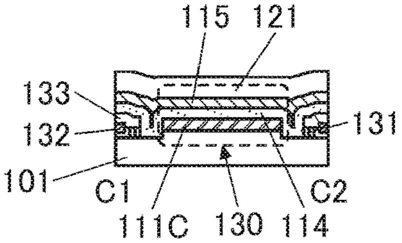
Figure 17D:
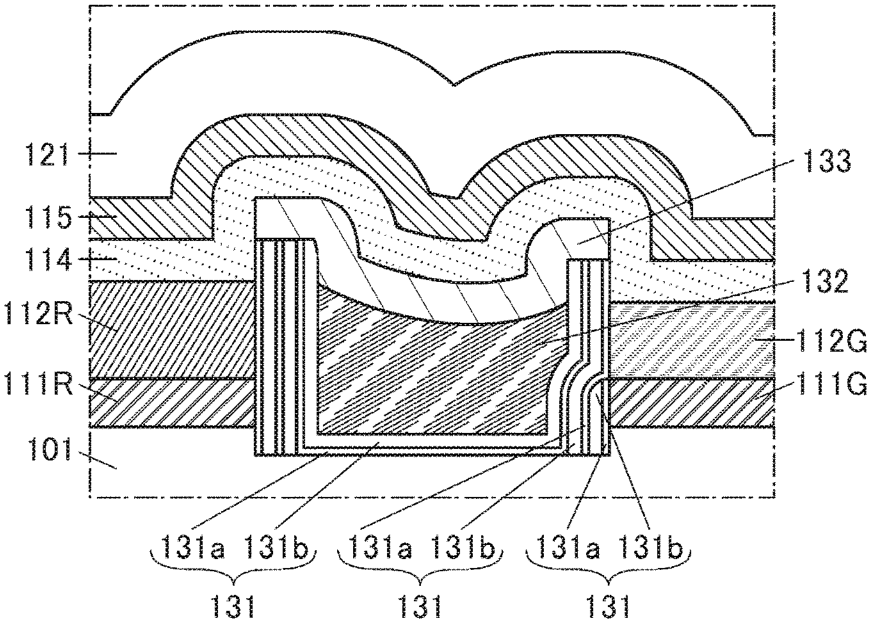

In the structure illustrated in FIG. 2A, FIG. 2B, FIG. 2D, and the like, the side surface of the EL layer 112R is positioned inward from the side surface of the pixel electrode 111R, the side surface of the EL layer 112G is positioned inward from the side surface of the pixel electrode 111G, and the side surface of the EL layer 112B is positioned inward from the side surface of the pixel electrode 111B; however, the structure of the display device of one embodiment of the present invention is not limited thereto. FIG. 17A is a cross-sectional view taken along the dashed-dotted line A1-A2 in FIG. 1, FIG. 17B is a cross-sectional view taken along the dashed-dotted line B1-B2 in FIG. 1, FIG. 17C is a cross-sectional view taken along the dashed-dotted line C1-C2 in FIG. 1, and FIG. 17D is an enlarged view of a region surrounded by a dashed-dotted line in FIG. 17A. FIG. 17A, FIG. 17B, FIG. 17C, and FIG. 17D show a modification example of the structure illustrated in FIG. 2A, FIG. 2B, FIG. 2C1, and FIG. 2D and differ in that the side surface of the pixel electrode 111R and the side surface of the EL layer 112R are aligned with each other, the side surface of the pixel electrode 111G and the side surface of the EL layer 112G are aligned with each other, and the side surface of the pixel electrode 111B and the side surface of the EL layer 112B are aligned with each other.

Figure 18A:
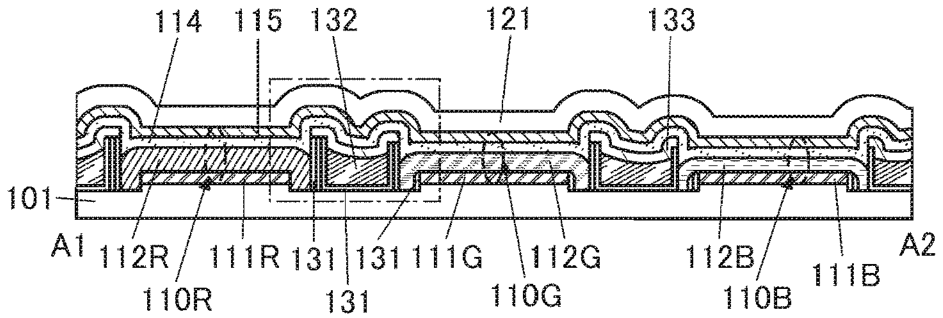
FIG. 18A to FIG. 18D are cross-sectional views illustrating a structure example of a display device.
Figure 18B:
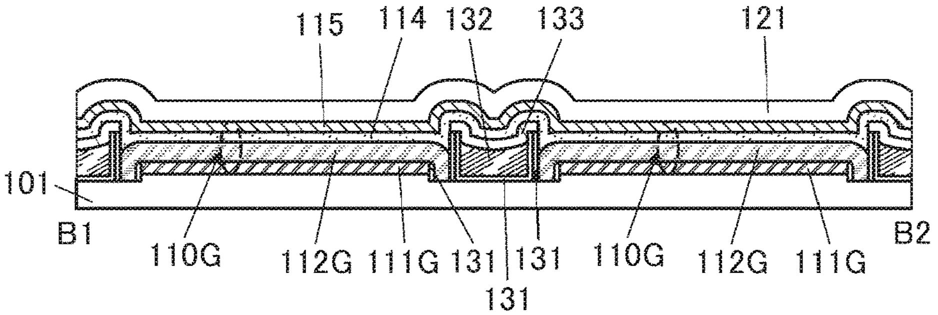
Figure 18C:
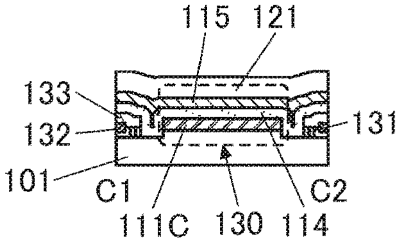
Figure 18D:
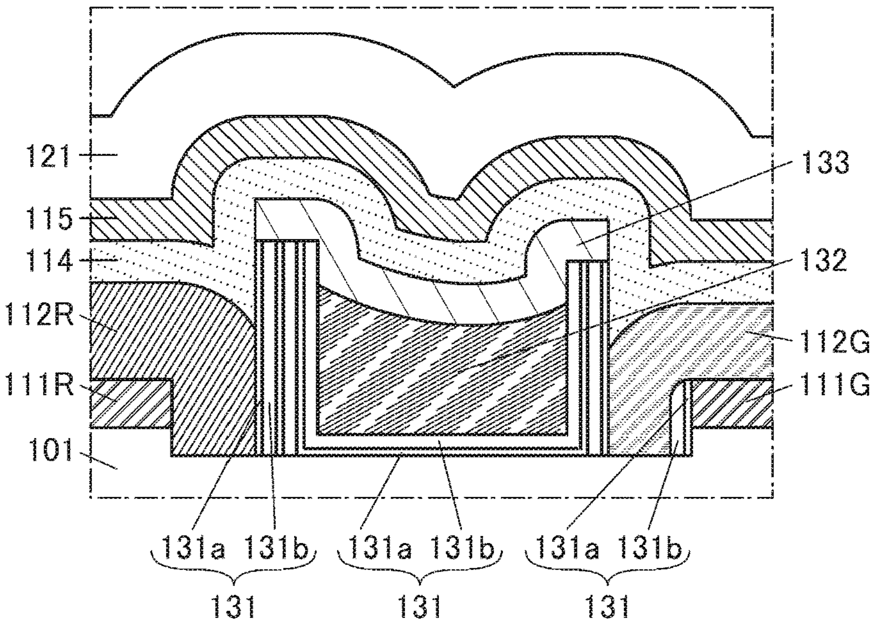

FIG. 18A is a cross-sectional view taken along the dashed-dotted line A1-A2 in FIG. 1, FIG. 18B is a cross-sectional view taken along the dashed-dotted line B1-B2 in FIG. 1, FIG. 18C is a cross-sectional view taken along the dashed-dotted line C1-C2 in FIG. 1, and FIG. 18D is an enlarged view of a region surrounded by a dashed-dotted line in FIG. 18A. FIG. 18A, FIG. 18B, FIG. 18C, and FIG. 18D show a modification example of the structure illustrated in FIG. 2A, FIG. 2B, FIG. 2C1, and FIG. 2D and differ in that the side surface of the EL layer 112R is positioned outward from the side surface of the pixel electrode 111R, the side surface of the EL layer 112G is positioned outward from the side surface of the pixel electrode 111G, and the side surface of the EL layer 112B is positioned outward from the pixel electrode 111B. In the structure illustrated in FIG. 18A, FIG. 18B, and the like, the EL layer 112 is provided so as to cover the side surface of the pixel electrode 111.

Figure 19A:
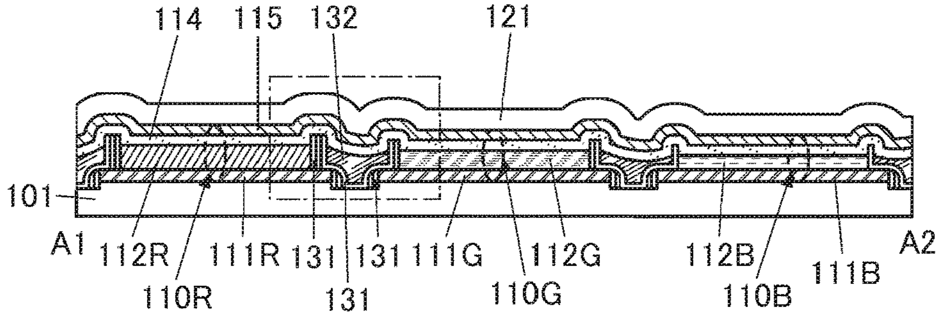
FIG. 19A to FIG. 19D are cross-sectional views illustrating a structure example of a display device.
Figure 19B:
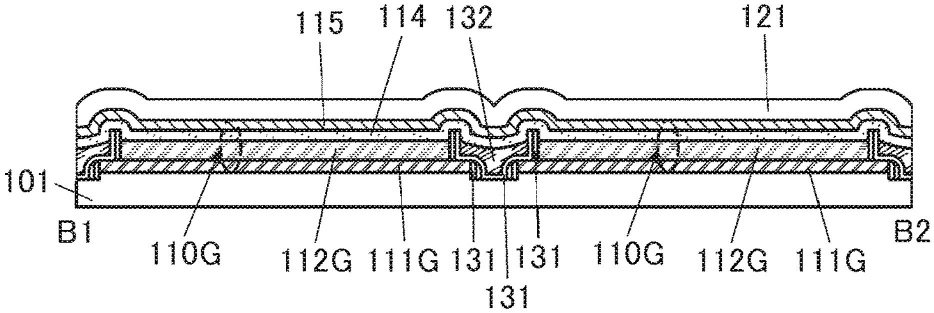
Figure 19C:
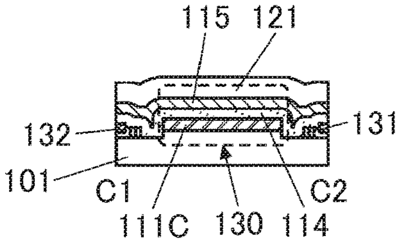
Figure 19D:
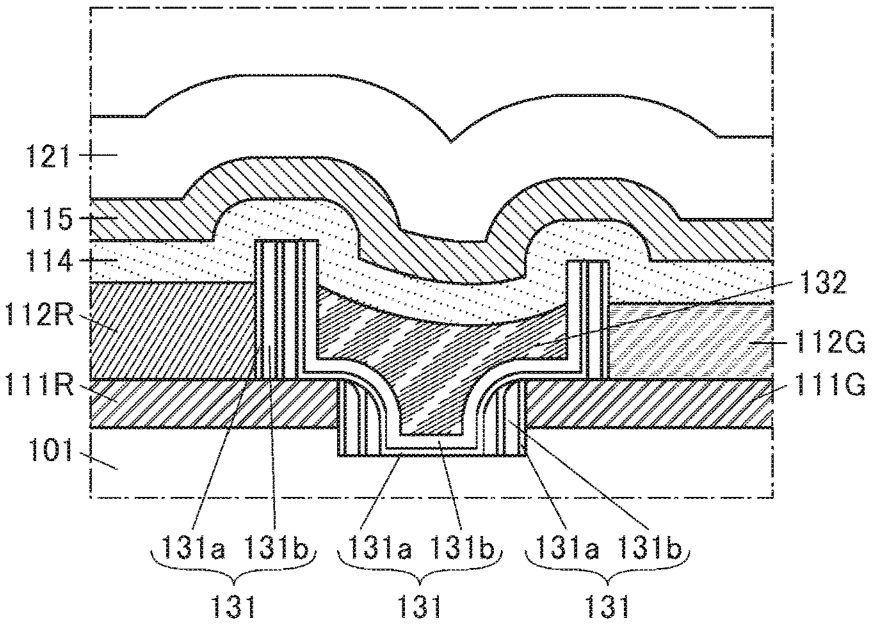

FIG. 19A is a cross-sectional view taken along the dashed-dotted line A1-A2 in FIG. 1, FIG. 19B is a cross-sectional view taken along the dashed-dotted line B1-B2 in FIG. 1, FIG. 19C is a cross-sectional view taken along the dashed-dotted line C1-C2 in FIG. 1, and FIG. 19D is an enlarged view of a region surrounded by a dashed-dotted line in FIG. 19A. FIG. 19A, FIG. 19B, FIG. 19C, and FIG. 19D show a modification example of the structure illustrated in FIG. 2A, FIG. 2B, FIG. 2C1, and FIG. 2D and differ in that the protective layer 133 is not provided. In the structure illustrated in FIG. 19A to FIG. 19D, a region where the insulating layer 132 and the common layer 114 are in contact with each other can be provided, for example.

Since the protective layer 133 is omitted, it is not necessary to perform a process of forming the protective layer 133; therefore, the manufacturing processes of the display device 100 can be simplified. Consequently, the manufacturing cost of the display device 100 can be reduced, whereby the display device 100 can be an inexpensive display device.

Figure 20A:
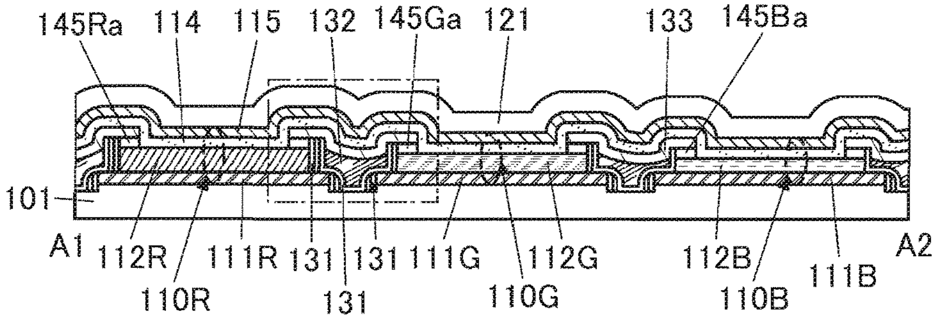
FIG. 20A to FIG. 20D are cross-sectional views illustrating a structure example of a display device.
Figure 20B:
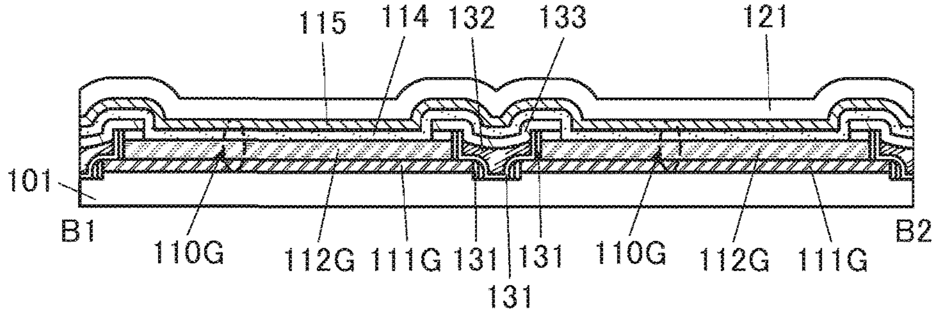
Figure 20C:
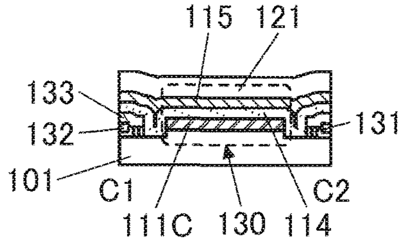
Figure 20D:
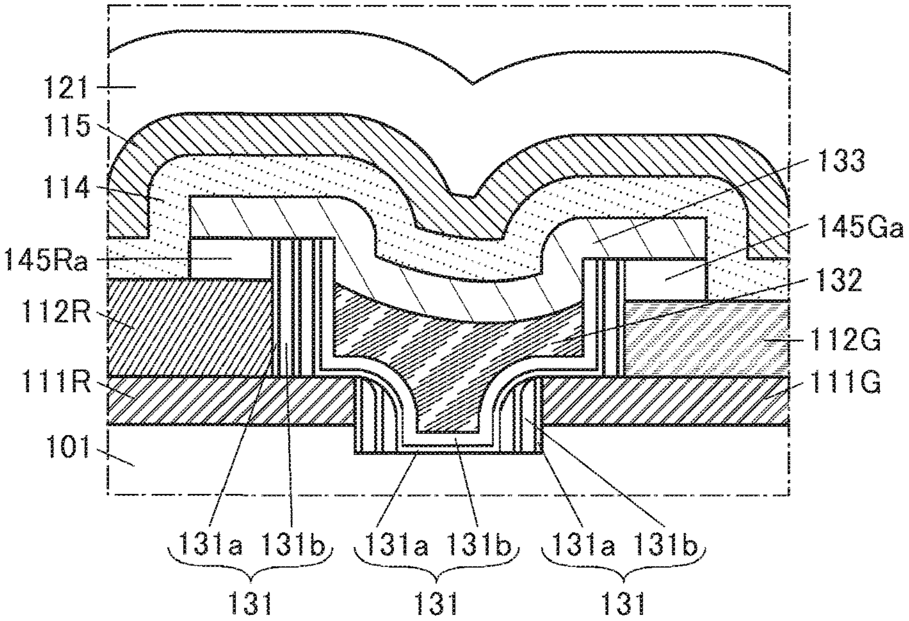

FIG. 20A is a cross-sectional view taken along the dashed-dotted line A1-A2 in FIG. 1. FIG. 20B is a cross-sectional view taken along the dashed-dotted line B1-B2 in FIG. 1. FIG. 20C is a cross-sectional view taken along the dashed-dotted line C1-C2 in FIG. 1. FIG. 20D is an enlarged view of a region surrounded by a dashed-dotted line in FIG. 20A. FIG. 20A, FIG. 20B, FIG. 20C, and FIG. 20D show a modification example of the structure illustrated in FIG. 2A, FIG. 2B, FIG. 2C1, and FIG. 2D and differ in that the protective layer 133 includes regions overlapping with the EL layers 112.

In the structure illustrated in FIG. 20A to FIG. 20D, the sacrificial layer 145Ra remains between the top surface of the EL layer 112R and the protective layer 133, the sacrificial layer 145Ga remains between the top surface of the EL layer 112G and the protective layer 133, and the sacrificial layer 145Ba remains between the top surface of the EL layer 112B and the protective layer 133. Note that in some cases, the sacrificial layer 145Rb remains between the sacrificial layer 145Ra and the protective layer 133, the sacrificial layer 145Gb remains between the sacrificial layer 145Ga and the protective layer 133, and the sacrificial layer 145Bb remains between the sacrificial layer 145Ba and the protective layer 133 depending on the manufacturing processes of the display device 100. Furthermore, in some cases, the sacrificial layer 145Ra, the sacrificial layer 145Ga, and the sacrificial layer 145Ba do not remain and the EL layer 112R, the EL layer 112G, and the EL layer 112B each include a region in contact with the protective layer 133. Although the end portion of the protective layer 133 is aligned with the end portion of the sacrificial layer 145*a* in the structure illustrated in FIG. 20A to FIG. 20D, the end portion of the protective layer 133 is not necessarily aligned with the end portion of the sacrificial layer 145*a*. For example, the protective layer 133 may include a region in contact with the top surface of the EL layer 112. In other words, the protective layer 133 may cover the side surface of the sacrificial layer 145*a*.

At least part of the structure examples, the drawings corresponding thereto, and the like illustrated in this embodiment can be combined with the other structure examples, the other drawings, and the like as appropriate.

Embodiment 2

In this embodiment, structure examples of a display device of one embodiment of the present invention will be described.

The display device in this embodiment can be a high-definition display device or a large-sized display device. Accordingly, the display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer, digital signage, and a large game machine such as a pachinko machine.

[Display Module_1]

Figure 21:
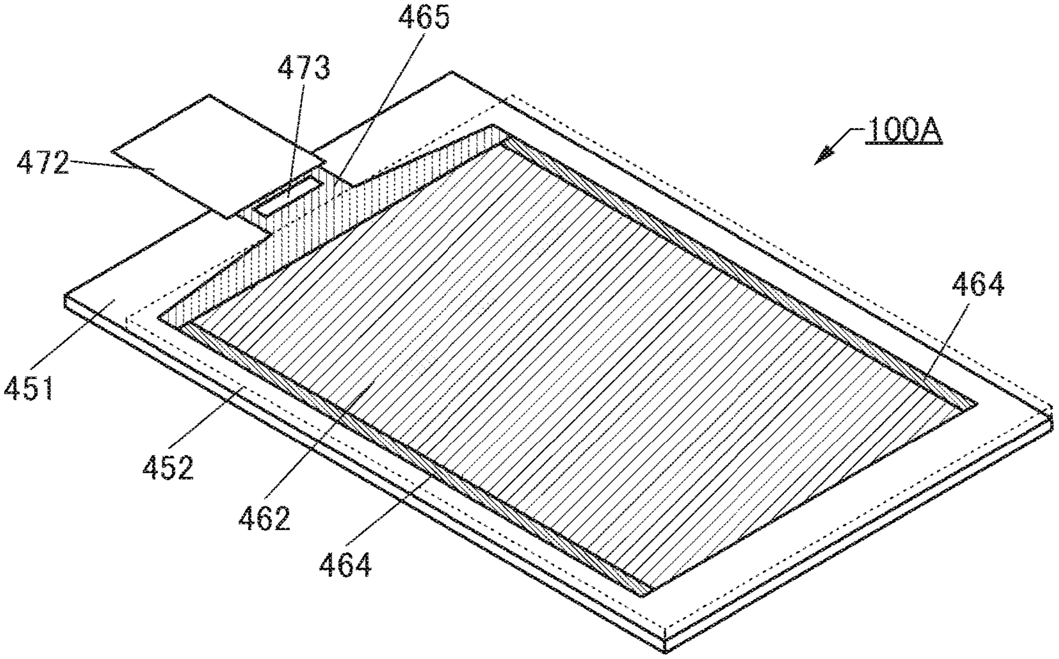
FIG. 21 is a perspective view illustrating a structure example of a display device.
Figures 22A, 22B, 22C:
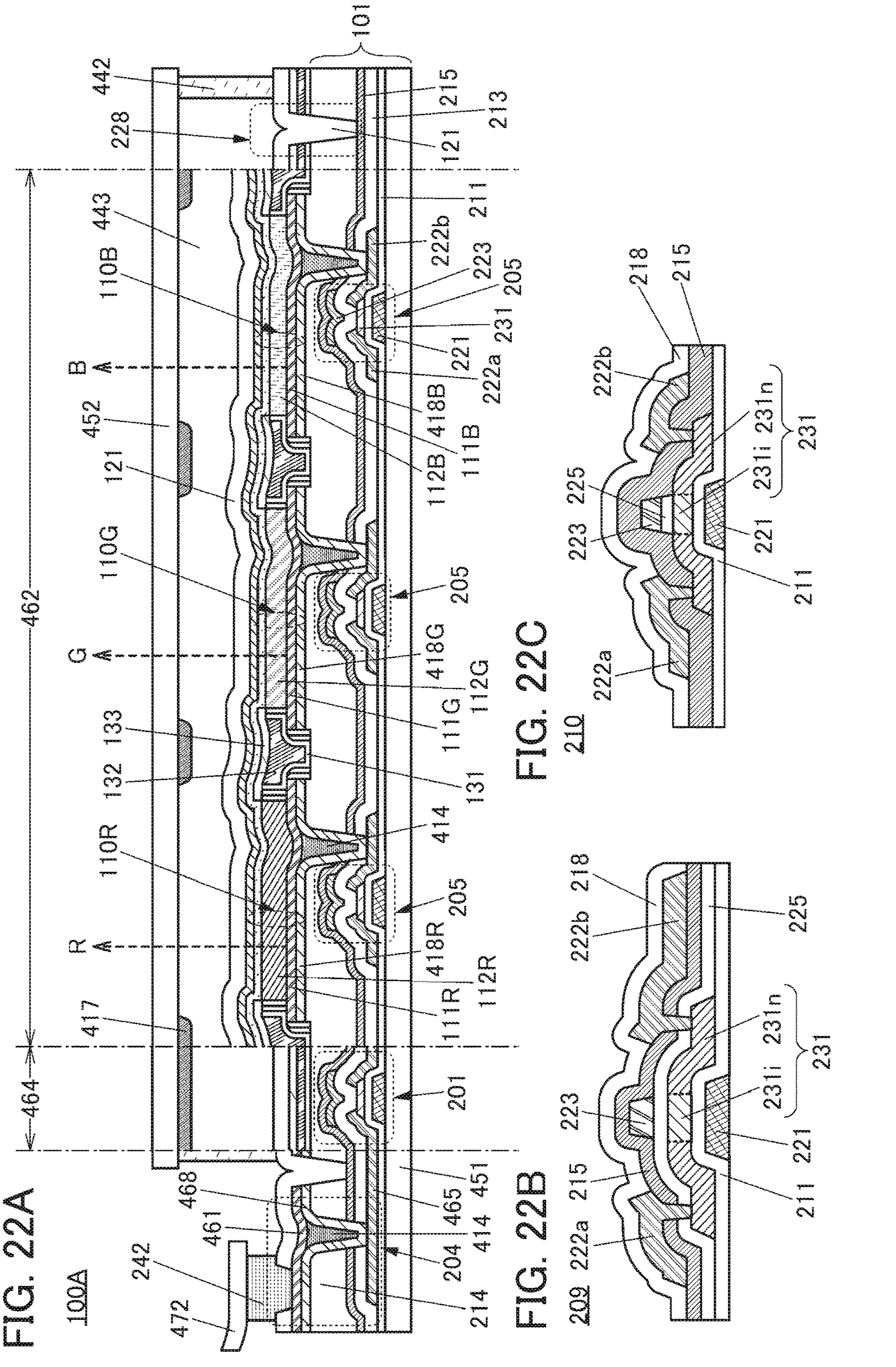
FIG. 22A is a cross-sectional view illustrating a structure example of a display device.
FIG. 22B and FIG. 22C are cross-sectional views each illustrating a structure example of a transistor.

FIG. 21 illustrates a perspective view of a display device 100A and FIG. 22A illustrates a cross-sectional view of the display device 100A.

The display device 100A has a structure in which a substrate 452 and a substrate 451 are bonded to each other. In FIG. 21, the substrate 452 is denoted by a dashed line.

The display device 100A includes a display portion 462, a circuit 464, a wiring 465, and the like. FIG. 21 illustrates an example in which an IC 473 and an FPC 472 are mounted on the display device 100A. Thus, the structure illustrated in FIG. 21 can be regarded as a display module including the display device 100A, the IC (integrated circuit), and the FPC. Note that the display device included in the display module is not limited to the display device 100A and may be a display device 100B described later.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or from the IC 473.

FIG. 21 illustrates an example in which the IC 473 is provided over the substrate 451 by a COG method, a COF (Chip On Film) method, or the like. An IC including a scan line driver circuit, a signal line driver circuit, or the like can be used as the IC 473, for example. Note that the display module including the display device 100A is not necessarily provided with an IC. The IC may be mounted on the FPC by a COF method or the like.

[Display Device 100A]

FIG. 22A illustrates an example of cross sections of part of a region including the FPC 472, part of the circuit 464, part of the display portion 462, and part of a region including an end portion in the display device 100A.

The display device 100A illustrated in FIG. 22A includes a transistor 201, a transistor 205, the light-emitting element 110R which emits red light, the light-emitting element 110G which emits green light, the light-emitting element 110B which emits blue light, and the like between the substrate 451 and the substrate 452. Here, a stacked-layer structure including the substrate 451 and the components thereover up to an insulating layer 214 in the display device 100A corresponds to the layer 101 including transistors in Embodiment 1.

The light-emitting element that is described in Embodiment 1 as an example can be used as the light-emitting element 110R, the light-emitting element 110G, and the light-emitting element 110B.

Here, in the case where a pixel of the display device includes three kinds of subpixels including light-emitting elements emitting different colors from each other, the three subpixels can be of three colors of R, G, and B or of three colors of yellow (Y), cyan (C), and magenta (M), for example. In the case where four subpixels are included, the four subpixels can be of four colors of R, G, B, and white (W) or of four colors of R, G, B, and Y, for example.

The protective layer 121 and the substrate 452 are bonded to each other with an adhesive layer 442 therebetween. A solid sealing structure, a hollow sealing structure, or the like can be employed to seal the light-emitting elements. In FIG. 22A, a space 443 surrounded by the substrate 452, the adhesive layer 442, and the protective layer 121 is filled with an inert gas (e.g., nitrogen or argon), that is, a hollow sealing structure is employed. The adhesive layer 442 may be provided to overlap with the light-emitting element. The space 443 surrounded by the substrate 452, the adhesive layer 442, and the protective layer 121 may be filled with a resin different from that of the adhesive layer 442. Note that the structure described in Embodiment 1 as an example can be employed for the protective layer 121.

In opening portions which are provided in the insulating layer 214, an insulating layer 215, and an insulating layer 213 so that the top surfaces of conductive layers 222*b* included in the transistors 205 are exposed, parts of a conductive layer 418R, a conductive layer 418G, and a conductive layer 418B are formed along the bottom surfaces and side surfaces of the opening portions. Each of the conductive layer 418R, the conductive layer 418G, and the conductive layer 418B is connected to the conductive layer 222*b* included in the transistor 205. Furthermore, other parts of the conductive layer 418R, the conductive layer 418G, and the conductive layer 418B are provided over the insulating layer 214.

The pixel electrode 111R, the pixel electrode 111G, and the pixel electrode 111B are provided over the conductive layer 418R, the conductive layer 418G, and the conductive layer 418B.

As illustrated in FIG. 22A, an insulating layer 414 may be provided in a portion between the conductive layer 418R and the pixel electrode 111R, a portion between the conductive layer 418G and the pixel electrode 111G, and a portion between the conductive layer 418B and the pixel electrode 111B. Specifically, the insulating layer 414 can be provided in an opening portion that is provided in the insulating layer 214, the insulating layer 215, and the insulating layer 213 and reaches the conductive layer 222*b*.

As the pixel electrode 111R, the pixel electrode 111G, and the pixel electrode 111B, the pixel electrode described in Embodiment 1 as an example can be used.

The protective layer 131, the insulating layer 132, and the protective layer 133 are provided in a region positioned between the light-emitting element 110R and the light-emitting element 110G and over the insulating layer 214 and in a region positioned between the light-emitting element 110G and the light-emitting element 110B and over the insulating layer 214. The structure described in Embodiment 1 as an example can be employed for the protective layer 131, the insulating layer 132, and the protective layer 133.

The display device 100A is a top-emission display device. Accordingly, light emitted from the light-emitting element 110 is emitted toward the substrate 452 side. For the substrate 452, a material having a high transmitting property with respect to visible light is preferably used.

The transistor 201 and the transistor 205 are formed over the substrate 451. These transistors can be manufactured using the same materials in the same processes.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, and the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Accordingly, the organic insulating film preferably has an opening in the vicinity of an end portion of the display device 100A. This can inhibit entry of impurities from the end portion of the display device 100A through the organic insulating film. Alternatively, the organic insulating film may be formed so that its end portion is positioned on the inner side than the end portion of the display device 100A, to prevent the organic insulating film from being exposed at the end portion of the display device 100A.

An organic insulating film is preferably used for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 22A, an opening is formed in the insulating layer 214, the protective layer 131 over the insulating layer 214, the insulating layer 132 over the protective layer 131, and the protective layer 133 over the insulating layer 132. The protective layer 121 is formed so as to cover the opening. Using an inorganic layer as the protective layer 121 can inhibit entry of impurities into the display portion 462 from the outside through the insulating layer 214 even when an organic insulating film is used as the insulating layer 214. Thus, the reliability of the display device 100A can be increased.

Each of the transistor 201 and the transistor 205 includes a conductive layer 221 functioning as a gate, the insulating layer 211 functioning as a gate insulating layer, a conductive layer 222*a* functioning as one of a source and a drain, the conductive layer 222*b* functioning as the other of the source and the drain, a semiconductor layer 231, the insulating layer 213 functioning as a gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structures of the transistors included in the display device of this embodiment. For example, a planar transistor, a staggered transistor, an inverted staggered transistor, or the like can be used. In addition, the transistor structure may be either a top-gate structure or a bottom-gate structure. Alternatively, gates may be provided above and below a semiconductor layer in which a channel is formed.

The structure in which the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment. Alternatively, the semiconductor layer of the transistor may contain silicon. Examples of silicon include amorphous silicon and crystalline silicon (e.g., low-temperature polysilicon and single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, an oxide containing indium (In), aluminum (Al), and zinc (Zn) (also referred to as IAZO) may be used for the semiconductor layer. Alternatively, an oxide (IAGZO), which contains indium (In), aluminum (Al), gallium (Ga), and zinc (Zn), may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 468, a conductive layer 461, and a connection layer 242. For the conductive layer 468, a conductive layer obtained by processing the same conductive film as the conductive layer 418 can be used. As the conductive layer 461, a conductive layer obtained by processing the same conductive film as the pixel electrode 111 or a conductive layer obtained by processing a stacked film in which a conductive film that is the same as the pixel electrode 111 and a conductive film that is the same as the optical adjustment layer can be used. On the top surface of the connection portion 204, the conductive layer 461 is exposed. Thus, the connection portion 204 and the FPC 472 can be electrically connected to each other through the connection layer 242. Note that the insulating layer 414 may be provided in a portion between the conductive layer 468 and the conductive layer 461. Specifically, the insulating layer 414 can be provided in an opening portion provided in the insulating layer 214, the insulating layer 215, and the insulating layer 213.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorption layer, or the like may be provided on the outside of the substrate 452.

Providing the protective layer 121 covering the light-emitting elements 110 inhibits entry of impurities such as water into the light-emitting elements 110, leading to an increase in the reliability of the light-emitting elements 110.

In the region 228 in the vicinity of the end portion of the display device 100A, the insulating layer 215 and the protective layer 121 are preferably in contact with each other through the opening in the insulating layer 214. In particular, the inorganic insulating film included in the insulating layer 215 and the inorganic insulating film included in the protective layer 121 are preferably in contact with each other. This can inhibit entry of impurities into the display portion 462 from the outside through the organic insulating film. Thus, the reliability of the display device 100A can be increased.

For each of the substrate 451 and the substrate 452, glass, quartz, ceramic, sapphire, a resin, a metal, an alloy, a semiconductor, or the like can be used. The substrate on the side where light from the light-emitting element 110 is extracted is formed using a material that transmits the light. When a flexible material is used for the substrate 451 and the substrate 452, the flexibility of the display device can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate can be said to have a low birefringence (a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used as the substrate and the film absorbs water, the shape of the display panel might be changed, e.g., wrinkles are generated. Thus, for the substrate, a film with a low water absorption rate is preferably used. For example, the water absorption rate of the film is preferably 1% or lower, further preferably 0.1% or lower, still further preferably 0.01% or lower.

For the adhesive layer 442, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-liquid-mixture-type resin may be used. An adhesive sheet may be used, for example.

As the connection layer 242, an anisotropic conductive film (ACF), an anisotropic conductive paste (ACP), or the like can be used.

As materials that can be used for conductive layers such as a variety of wirings and electrodes that constitute a display device, in addition to a gate, a source, and a drain of a transistor, metals such as aluminum, titanium, chromium, nickel, copper, yttrium, zirconium, molybdenum, silver, tantalum, or tungsten, an alloy containing the metal as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Alternatively, a nitride of the metal material (e.g., titanium nitride) or the like may be used. Note that in the case of using the metal material or the alloy material (or the nitride thereof), the thickness is preferably set small enough to transmit light. Furthermore, a stacked-layer film of the above materials can be used for a conductive layer. For example, a stacked-layer film of indium tin oxide and an alloy of silver and magnesium is preferably used because it can increase the conductivity. These materials can also be used for the conductive layers such as a variety of wirings and electrodes included in a display device, and conductive layers (conductive layers functioning as a pixel electrode or a common electrode) included in the light-emitting element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

FIG. 22B is a cross-sectional view illustrating a structure example of a transistor 209, and FIG. 22C is a cross-sectional view illustrating a structure example of a transistor 210. Each of the transistor 209 and the transistor 210 can be used as the transistor 201 and the transistors 205 illustrated in FIG. 22A, for example.

The transistor 209 and the transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of the low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*. An insulating layer 218 may be provided so as to cover the transistor 209 or the transistor 210.

The conductive layer 222*a* and the conductive layer 222*b* are connected to the corresponding low-resistance regions 231*n* through openings provided in the insulating layer 215 and the insulating layer 225. One of the conductive layer 222*a* and the conductive layer 222*b* functions as a source, and the other functions as a drain.

FIG. 22B illustrates an example in which the insulating layer 225 covers the top surface and side surface of the semiconductor layer 231. The conductive layer 222*a* and the conductive layer 222*b* are connected to the corresponding low-resistance regions 231*n* through openings provided in the insulating layer 225 and the insulating layer 215.

Meanwhile, in the transistor 210 illustrated in FIG. 22C, the insulating layer 225 overlaps with the channel formation region 231*i* of the semiconductor layer 231 and does not overlap with the low-resistance regions 231*n*. The structure illustrated in FIG. 22C can be manufactured by processing the insulating layer 225 with the conductive layer 223 as a mask, for example. In FIG. 22C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

In addition, transistors containing silicon in their semiconductor layers where channels are formed (hereinafter, also referred to as Si transistors) may be used as all transistors included in the pixel circuit for driving the light-emitting element. As silicon, single crystal silicon, polycrystalline silicon, amorphous silicon, and the like can be given. In particular, transistors containing low-temperature polysilicon (LTPS) in their semiconductor layers (hereinafter, also referred to as LTPS transistors) can be suitably used as Si transistors. The LTPS transistors have high field-effect mobility and favorable frequency characteristics.

With the use of transistors using silicon, such as LTPS transistors, a circuit required to be driven at a high frequency (e.g., a source driver circuit) can be formed on the same substrate as the display portion. Thus, external circuits mounted on the display device can be simplified, and costs of parts and mounting costs can be reduced.

It is preferable to use a transistor containing a metal oxide in a semiconductor where a channel is formed as at least one of the transistors included in the pixel circuit. An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be held for a long period. Furthermore, power consumption of the display device can be reduced with an OS transistor.

The off-state current value per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

When an LTPS transistor is used as some of the transistors included in the pixel circuit and an OS transistor is used as the rest, a display device with low power consumption and high driving capability can be achieved. Furthermore, a structure in which an LTPS transistor and an OS transistor are combined is referred to as LTPO in some cases. Note that for a further suitable example, the structure can be given where an OS transistor is used as a transistor functioning as a switch for controlling conduction and non-conduction between wirings and a LTPS transistor is used as a transistor for controlling current.

For example, one of the transistors included in the pixel circuit functions as a transistor for controlling current flowing through the light-emitting element and can be also referred to as a driving transistor. One of a source and a drain of the driving transistor is electrically connected to a pixel electrode of the light-emitting element. An LTPS transistor is preferably used as the driving transistor. With this structure, the amount of current flowing through the light-emitting element can be increased in the pixel circuit.

On the other hand, another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. With this structure, the grayscale of the pixel can be maintained even with an extremely low frame frequency (e.g., 1 fps or lower); thus, power consumption can be reduced by stopping the driver in displaying a still image.

As described above, the display device of one embodiment of the present invention can have all of a high aperture ratio, high resolution, high display quality, and low power consumption.

Note that the display device of one embodiment of the present invention has a structure including the OS transistor and the light-emitting element having a metal maskless (MML) structure. With this structure, the leakage current that might flow through the transistor and the leakage current that might flow between adjacent light-emitting elements (also referred to as a lateral leakage current, a side leakage current, or the like) can become extremely low. With the structure, a viewer can notice any one or more of the image crispness, the image sharpness, and a high contrast ratio in an image displayed on the display device. With the structure where the leakage current that might flow through the transistor and the lateral leakage current between light-emitting elements are extremely low, display with little leakage of light at the time of black display (such display is also referred to as deep black display) can be achieved, for example.

[Display Device 100B]

Figure 23:
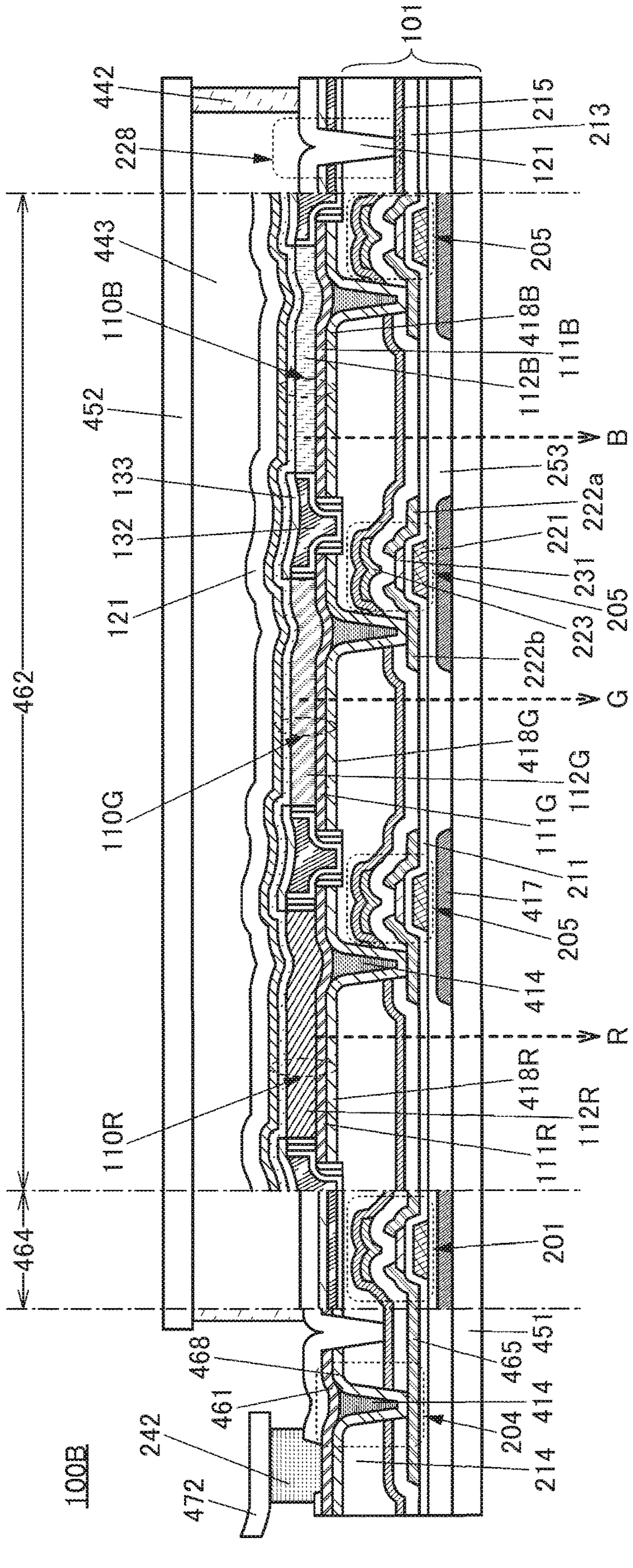
FIG. 23 is a cross-sectional view illustrating a structure example of a display device.

FIG. 23 is a cross-sectional view illustrating a structure example of the display device 100B. The display device 100B differs from the display device 100A mainly in having a bottom-emission structure. Note that the description of portions similar to those in the display device 100A is omitted.

In the display device 100B, light emitted from the light-emitting element 110 is emitted to the substrate 451 side. For the substrate 451, a material having a high transmitting property with respect to visible light is preferably used. By contrast, there is no limitation on the light-transmitting property of a material used for the substrate 452.

The light-blocking layer 417 is preferably provided between the substrate 451 and the transistor 201 and between the substrate 451 and the transistor 205. FIG. 23 illustrates an example in which the light-blocking layer 417 is provided over the substrate 451, an insulating layer 253 is provided so as to cover the light-blocking layer 417, and the transistor 201, the transistor 205, and the like are provided over the insulating layer 253. For the insulating layer 253, the same material as the material that can be used for the insulating layer 211, the insulating layer 213, and the insulating layer 215 can be used.

At least part of the structure examples, the drawings corresponding thereto, and the like illustrated in this embodiment can be combined with the other structure examples, the other drawings, and the like as appropriate.

Embodiment 3

In this embodiment, a structure example of a display device different from the above embodiment will be described.

The display device in this embodiment can be a high-resolution display device.

Accordingly, the display device in this embodiment can be used for display portions of information terminals (wearable devices) such as watch-type and bracelet-type information terminals and display portions of wearable devices capable of being worn on a head, such as a VR device like a head-mounted display and a glasses-type AR device

[Display Module_2]

Figure 24A:
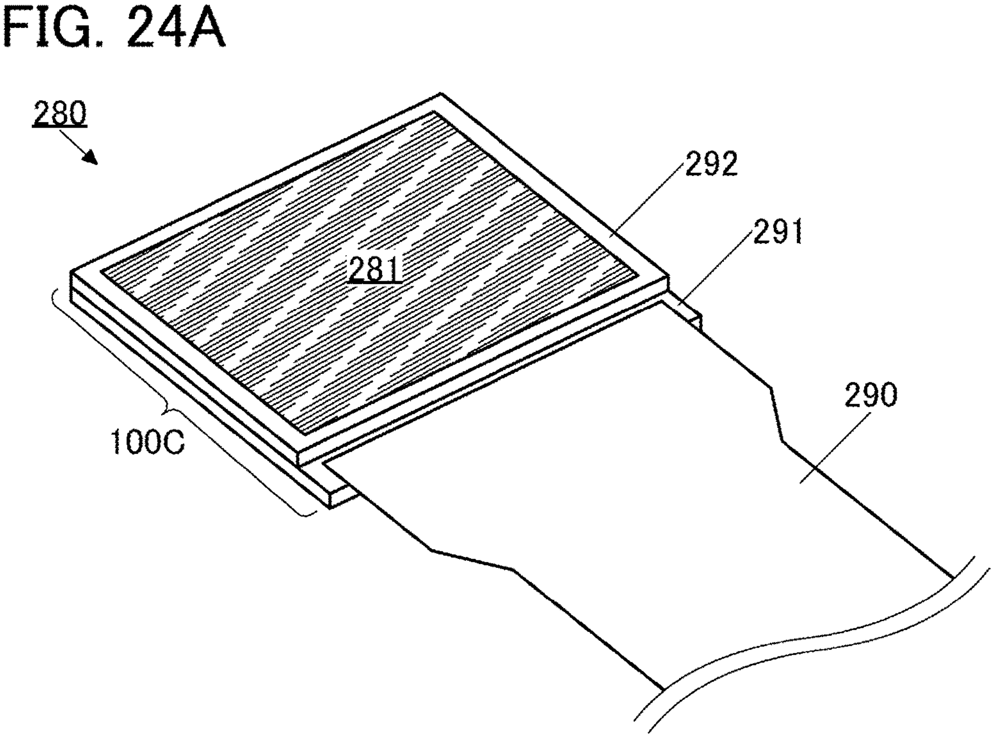
FIG. 24A and FIG. 24B are perspective views illustrating a structure example of a display module.

FIG. 24A illustrates a perspective view of a display module 280. The display module 280 includes a display device 100C and an FPC 290. Note that the display device included in the display module 280 is not limited to the display device 100C and may be a display device 100D, a display device 100E, or a display device 100F described later.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be perceived.

Figure 24B:
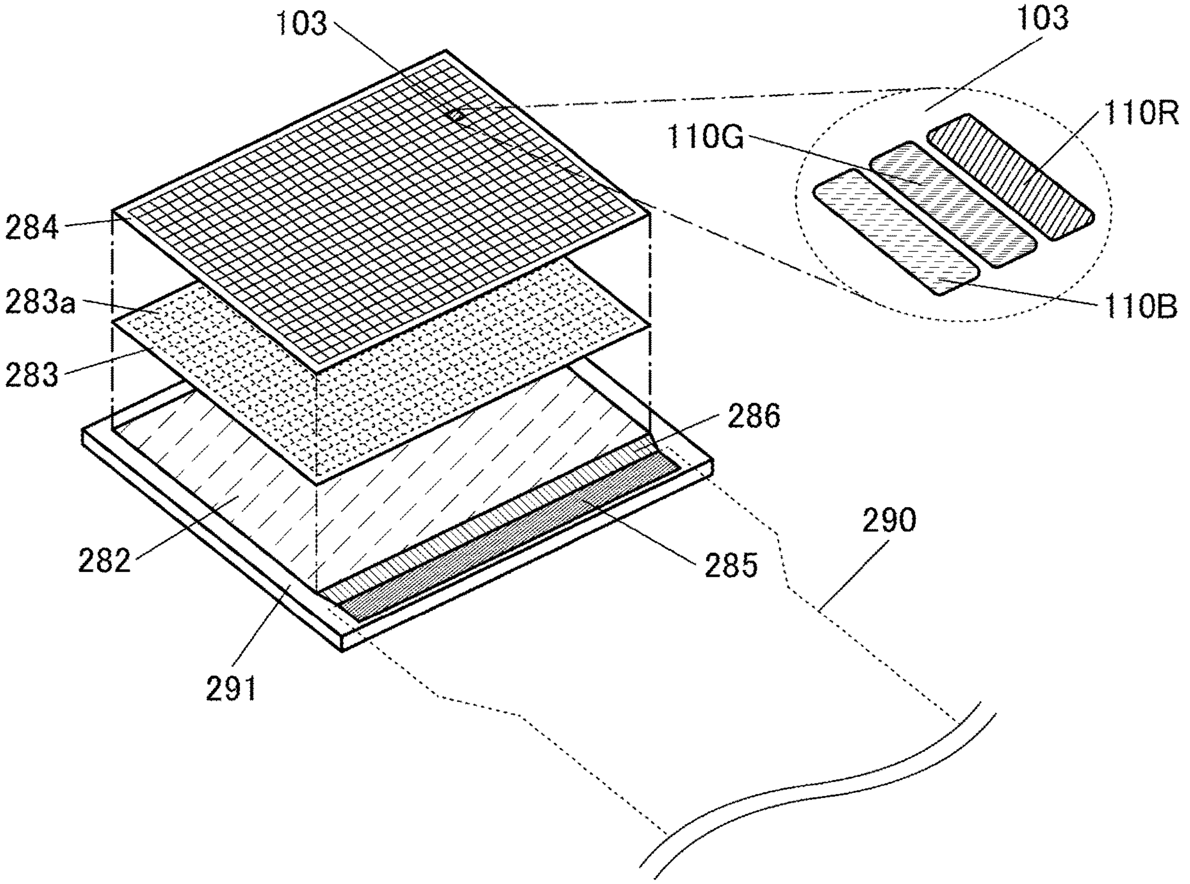

FIG. 24B illustrates a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 103 arranged periodically. An enlarged view of one pixel 103 is illustrated on the right side of FIG. 24B. The pixel 103 includes the light-emitting element 110R, the light-emitting element 110G, and the light-emitting element 110B whose emission colors are different from each other. The plurality of light-emitting elements 110 are preferably arranged in a stripe pattern as illustrated in FIG. 24B. With the stripe pattern that enables high-density arrangement of the light-emitting elements of one embodiment of the present invention, a high-resolution display device can be provided. Alternatively, a variety of arrangement methods, such as delta arrangement or PenTile arrangement, can be employed.

The pixel circuit portion 283 includes a plurality of pixel circuits 283*a* arranged periodically.

One pixel circuit 283*a* is a circuit that controls light emission of the three light-emitting elements 110 included in one pixel 103. One pixel circuit 283*a* may be provided with three circuits each of which controls light emission of one light-emitting element 110. For example, the pixel circuit 283*a* can include at least one selection transistor, one current control transistor (driving transistor), and a capacitor for one light-emitting element 110. In this case, a gate signal is input to a gate of the selection transistor, and a video signal is input to one of a source and a drain of the selection transistor. Thus, an active-matrix display device is achieved.

The circuit portion 282 includes a circuit for driving the pixel circuits 283*a* in the pixel circuit portion 283. For example, one or both of a scan line driver circuit and a signal line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 103 can be arranged extremely densely and thus the display portion 281 can have extremely high resolution. For example, the pixels 103 are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a wrist watch.

[Display Device 100C]

Figure 25:
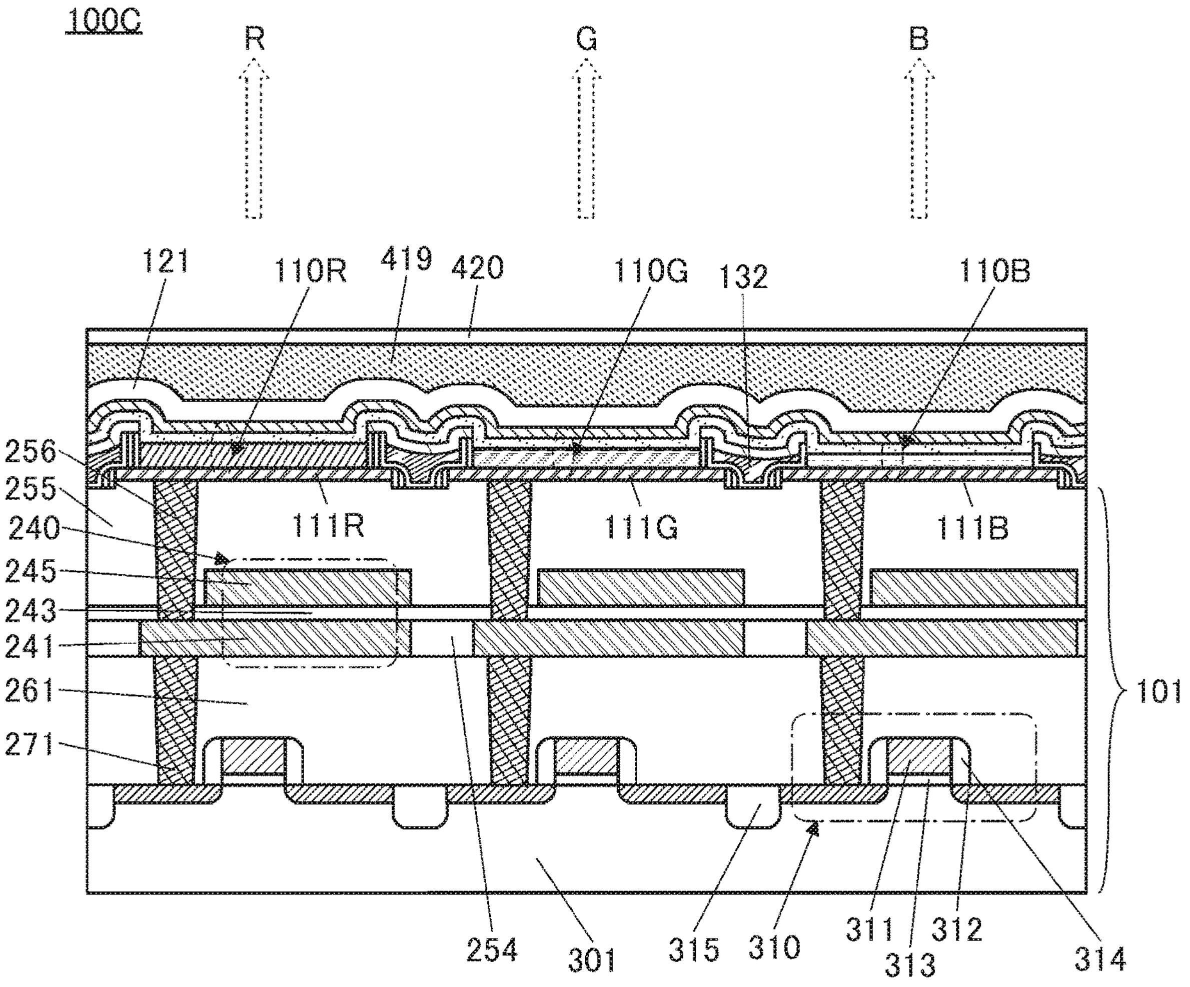
FIG. 25 is a cross-sectional view illustrating a structure example of a display device.

The display device 100C illustrated in FIG. 25 includes a substrate 301, the light-emitting element 110R, the light-emitting element 110G, the light-emitting element 110B, a capacitor 240, and a transistor 310.

The transistor 310 is a transistor that includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 so as to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 240, and the light-emitting element 110R, the light-emitting element 110G, the light-emitting element 110B, and the like are provided over the insulating layer 255. The protective layer 121 is provided over the light-emitting element 110R, the light-emitting element 110G, and the light-emitting element 110B, and a substrate 420 is attached to the top surface of the protective layer 121 with a resin layer 419.

The substrate 301 corresponds to the substrate 291 in FIG. 24A and FIG. 24B, and the substrate 420 corresponds to the substrate 292 in FIG. 24A. Furthermore, a stacked-layer structure including the substrate 301 and components thereover up to the insulating layer 255 corresponds to the layer 101 including transistors in Embodiment 1.

The pixel electrode 111 of the light-emitting element 110 is electrically connected to one of the source and the drain of the transistor 310 through a plug 256 embedded in the insulating layer 255 and the insulating layer 243, the conductive layer 241 embedded in the insulating layer 254, and the plug 271 embedded in the insulating layer 261.

[Display Device 100D]

Figure 26:
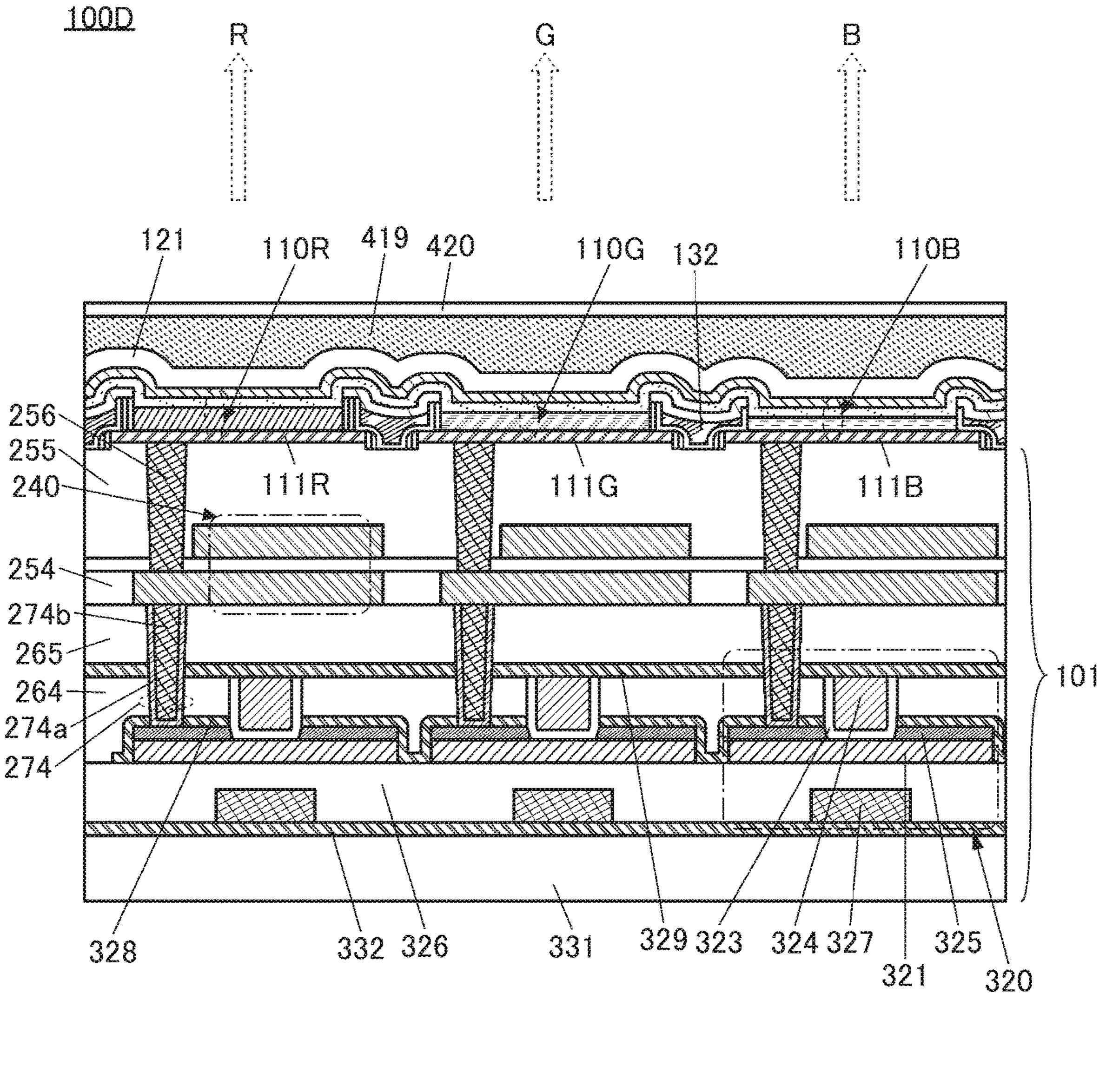
FIG. 26 is a cross-sectional view illustrating a structure example of a display device.

The display device 100D illustrated in FIG. 26 differs from the display device 100C mainly in a transistor structure. Note that the description of portions similar to those in the display device 100C is omitted in some cases.

A transistor 320 is a transistor that contains a metal oxide in a semiconductor layer where a channel is formed The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 24A and FIG. 24B. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. For the insulating layer 332, for example, a film in which hydrogen or oxygen is less likely to diffuse than in a silicon oxide film, such as an aluminum oxide film, a hafnium oxide film, or a silicon nitride film, can be used The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used for at least part of the insulating layer 326 that is in contact with the semiconductor layer 321. The top surface of the insulating layer 326 is preferably planarized The semiconductor layer 321 is provided over the insulating layer 326. A metal oxide film having semiconductor characteristics is preferably used as the semiconductor layer 321.

The pair of conductive layers 325 are provided over and in contact with the semiconductor layer 321 and function as a source electrode and a drain electrode.

An insulating layer 328 is provided to cover the top surface and side surface of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. For the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially aligned with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, the insulating layer 264, and the insulating layer 328. Here, the plug 274 preferably includes a conductive layer 274*a* that covers the side surface of an opening formed in the insulating layer 265, the insulating layer 329, the insulating layer 264, and the insulating layer 328 and part of the top surface of the conductive layer 325, and a conductive layer 274*b* in contact with the top surface of the conductive layer 274*a*. At this time, a conductive material in which hydrogen and oxygen are less likely to diffuse is preferably used for the conductive layer 274*a*.

The structures of the insulating layer 254 and components thereover up to the substrate 420 in the display device 100D are similar to those in the display device 100C. A stacked-layer structure including the substrate 331 and the components thereover up to the insulating layer 255 in the display device 100D corresponds to the layer 101 including transistors in Embodiment 1.

[Display Device 100E]

Figure 27:
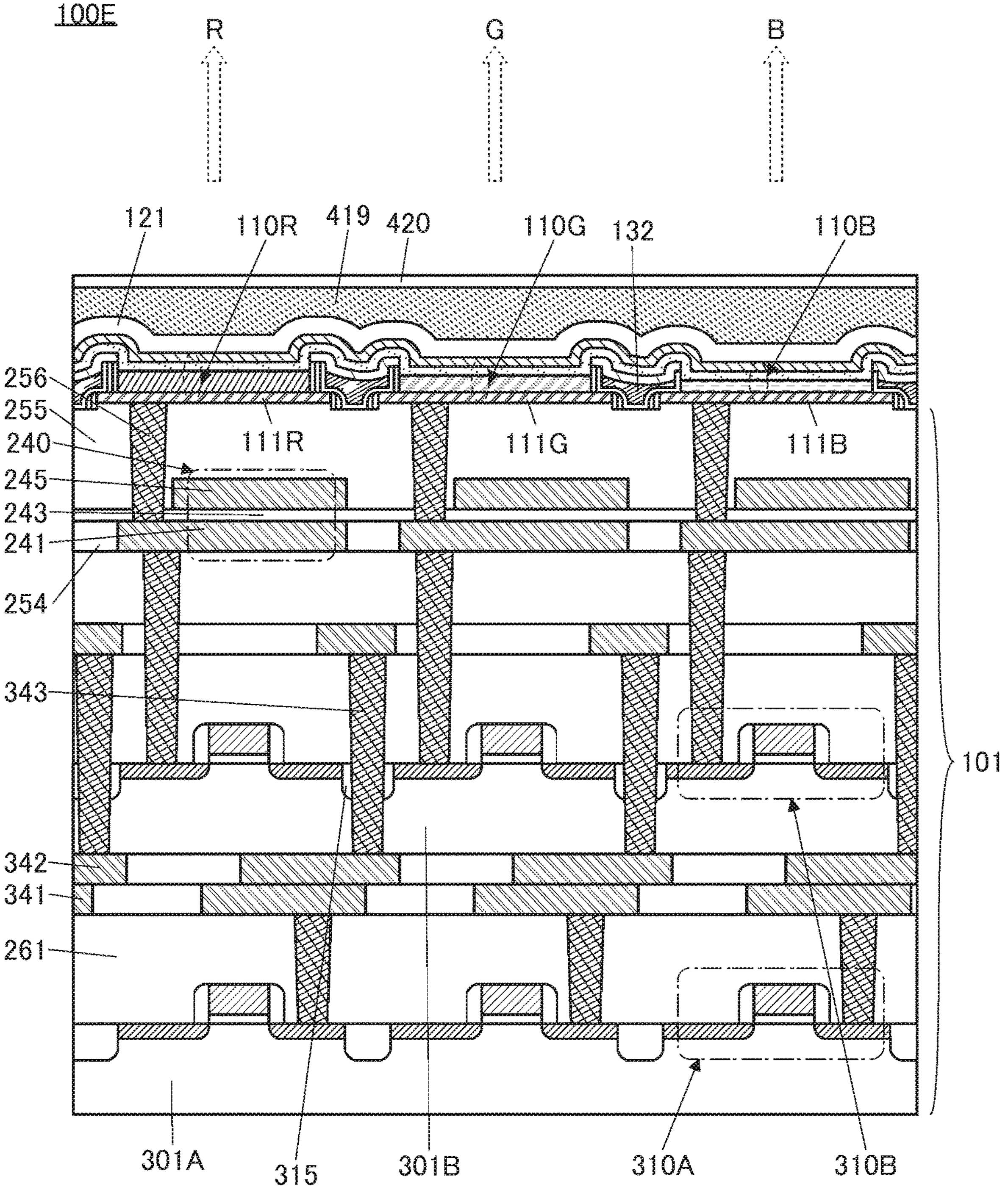
FIG. 27 is a cross-sectional view illustrating a structure example of a display device.

In the display device 100E illustrated in FIG. 27, a transistor 310A and a transistor 310B in each of which a channel is formed in a semiconductor substrate are stacked.

In the display device 100E, a substrate 301B provided with the transistor 310B, the capacitor 240, and light-emitting elements 110 is bonded to a substrate 301A provided with the transistor 310A.

In the display device 100E, the substrate 301A corresponds to the substrate 291 in FIG. 24A and FIG. 24B, and the substrate 420 corresponds to the substrate 292 in FIG. 24A. Furthermore, a stacked-layer structure including the substrate 301A and components thereover up to the insulating layer 255 corresponds to the layer 101 including transistors in Embodiment 1.

A plug 343 that penetrates the substrate 301B is provided in the display device 100E. The plug 343 is electrically connected to a conductive layer 342 provided on the rear surface of the substrate 301B (the surface on the substrate 301A side). On the other hand, over the substrate 301A, a conductive layer 341 is provided over the insulating layer 261.

The conductive layer 341 and the conductive layer 342 are bonded to each other, whereby the substrate 301A and the substrate 301B are electrically connected to each other.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ a copper-to-copper (Cu-to-Cu) direct bonding technique (a technique for achieving electrical continuity by connecting copper (Cu) pads to each other). Note that the conductive layer 341 and the conductive layer 342 may be bonded to each other with a bump therebetween.

[Display Device 100F]

Figure 28:
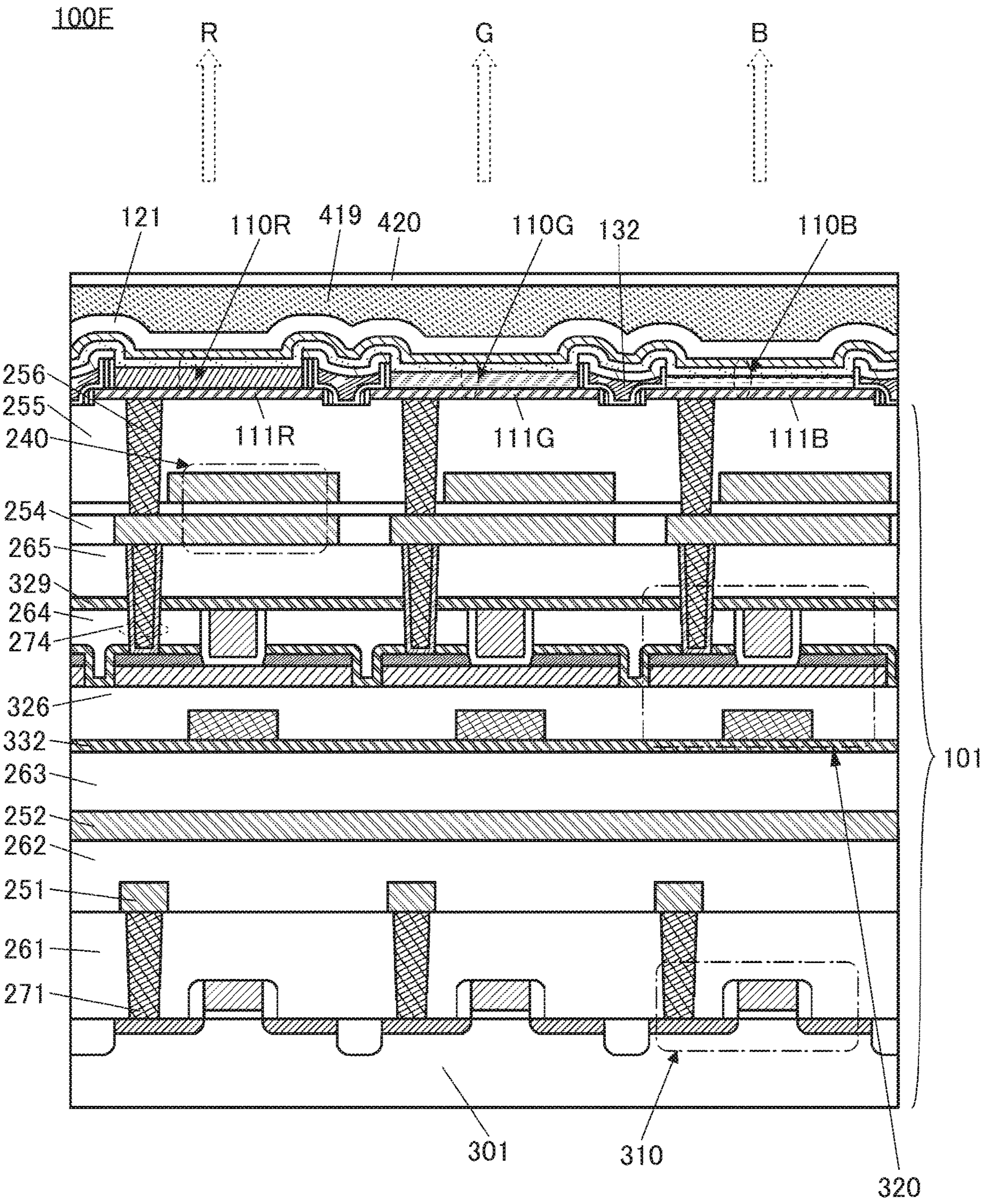
FIG. 28 is a cross-sectional view illustrating a structure example of a display device.

The display device 100F illustrated in FIG. 28 has a structure in which the transistor 310 having a channel formed in the substrate 301 and the transistor 320 including a metal oxide in a semiconductor layer where a channel is formed are stacked.

In the display device 100F, the substrate 301 corresponds to the substrate 291 in FIG. 24A and FIG. 24B, and the substrate 420 corresponds to the substrate 292 in FIG. 24A.

Furthermore, a stacked-layer structure including the substrate 301 and components thereover up to the insulating layer 255 corresponds to the layer 101 including transistors in Embodiment 1.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. In addition, the transistor 310 can be used as a transistor included in a pixel circuit or a transistor included in a driver circuit for driving the pixel circuit (a scan line driver circuit or a signal line driver circuit). Furthermore, the transistor 310 and the transistor 320 can be used as transistors included in a variety of circuits such as an arithmetic circuit and a memory circuit.

With such a structure, not only the pixel circuit but also, for example, the driver circuit can be formed directly under the light-emitting element; thus, the display device can be downsized as compared with the case where the driver circuit is provided around a display region.

At least part of the structure examples, the drawings corresponding thereto, and the like illustrated in this embodiment can be combined with the other structure examples, the other drawings, and the like as appropriate.

Embodiment 4

In this embodiment, light-emitting elements that can be used in a display device of one embodiment of the present invention will be described.

<Structure Example of Light-Emitting Element>

Figure 29A:
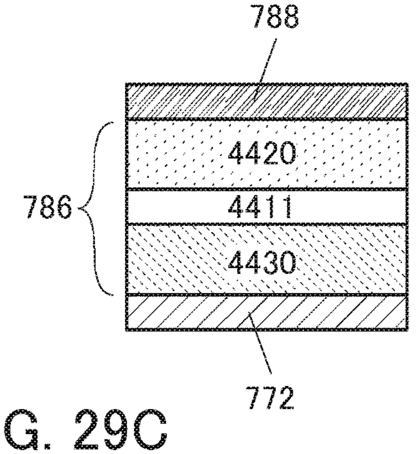
FIG. 29A to FIG. 29F are diagrams each illustrating a structure example of a light-emitting element.

As illustrated in FIG. 29A, a light-emitting element includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance having a high electron-injection property (an electron-injection layer) and a layer containing a substance having a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can serve as a single light-emitting unit, and the structure in FIG. 29A is referred to as a single structure in this specification and the like.

Figure 29B:
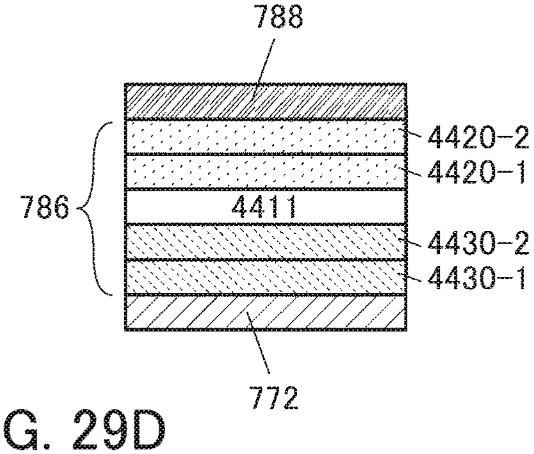

FIG. 29B illustrates a modification example of the EL layer 786 included in the light-emitting element illustrated in FIG. 29A. Specifically, the light-emitting element illustrated in FIG. 29B includes a layer 4430-1 over the lower electrode 772, a layer 4430-2 over the layer 4430-1, the light-emitting layer 4411 over the layer 4430-2, a layer 4420-1 over the light-emitting layer 4411, a layer 4420-2 over the layer 4420-1, and the upper electrode 788 over the layer 4420-2. For example, when the lower electrode 772 functions as an anode and the upper electrode 788 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 772 functions as a cathode and the upper electrode 788 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layered structure, carriers can be efficiently injected to the light-emitting layer 4411, and the efficiency of the recombination of carriers in the light-emitting layer 4411 can be enhanced.

Figure 29C:
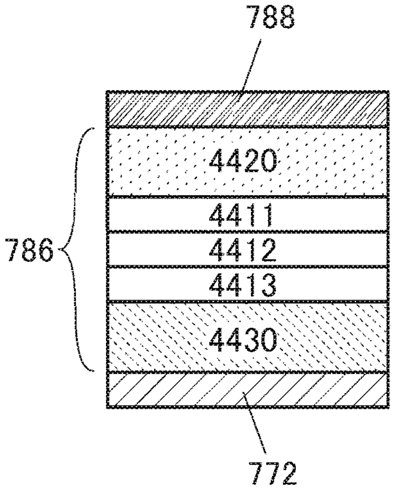
Figure 29D:
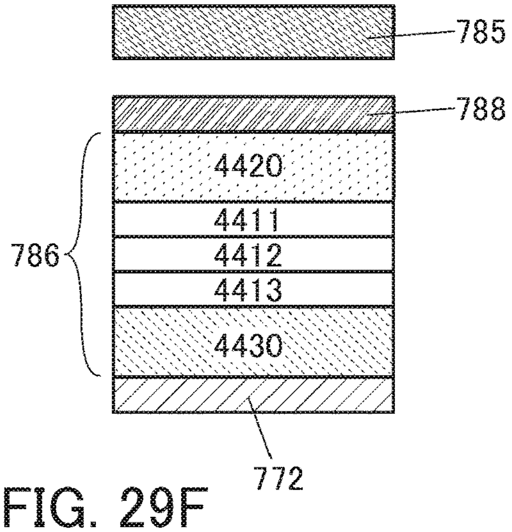

Note that the structure in which a plurality of light-emitting layers (the light-emitting layer 4411, a light-emitting layer 4412, and a light-emitting layer 4413) are provided between the layer 4420 and the layer 4430 as illustrated in FIG. 29C and FIG. 29D is a variation of the single structure.

Figure 29E:
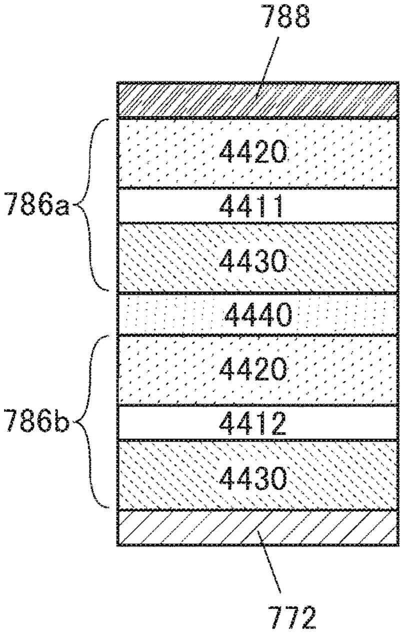
Figure 29F:
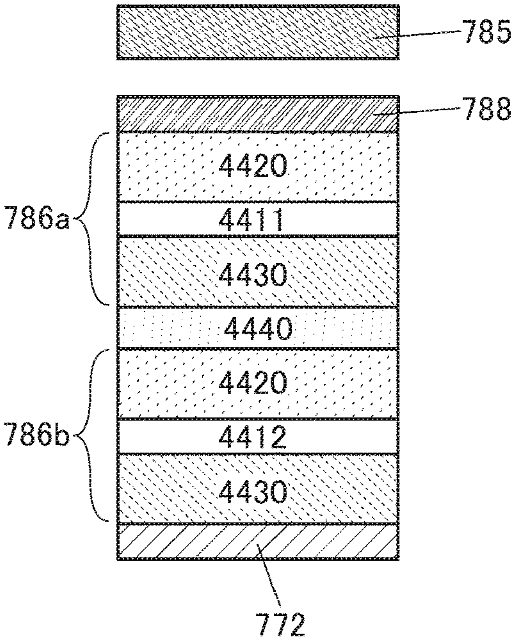

A structure in which a plurality of light-emitting units (an EL layer 786*a* and an EL layer 786*b*) are connected in series with an intermediate layer (a charge-generation layer) 4440 therebetween as illustrated in FIG. 29E and FIG. 29F is referred to as a tandem structure in this specification and the like. In this specification and the like, the structure illustrated in FIG. 29E and FIG. 29F is referred to as a tandem structure; however, without being limited to this, a tandem structure may be referred to as a stack structure, for example. Note that the tandem structure enables a light-emitting element to emit light at high luminance.

In FIG. 29C and FIG. 29D, light-emitting substances that emit light of the same color, or moreover, the same substance may be used for the light-emitting layer 4411, the light-emitting layer 4412, and the light-emitting layer 4413. For example, a light-emitting substance that emits blue light may be used for the light-emitting layer 4411, the light-emitting layer 4412, and the light-emitting layer 4413. A color conversion layer may be provided as a layer 785 illustrated in FIG. 29D.

Alternatively, light-emitting substances that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 29D. When white light passes through a color filter, light of a desired color can be obtained.

In FIG. 29E and FIG. 29F, light-emitting substances that emit light of the same color, or moreover, the same light-emitting substance may be used for the light-emitting layer 4411 and the light-emitting layer 4412. Alternatively, light-emitting substances that emit light of different colors may be used for the light-emitting layer 4411 and the light-emitting layer 4412. White light can be obtained when the light-emitting layer 4411 and the light-emitting layer 4412 emit light of complementary colors. FIG. 29F illustrates an example in which the coloring layer 785 is further provided. One or both of a color conversion layer and a color filter (coloring layer) can be used as the layer 785.

In FIG. 29C, FIG. 29D, FIG. 29E, and FIG. 29F, the layer 4420 and the layer 4430 may each have a stacked-layer structure of two or more layers as in FIG. 29B.

A structure in which light-emitting elements that emit light of different colors (e.g., blue (B), green (G), and red (R)) are separately formed is referred to as an SBS (Side By Side) structure in some cases.

The emission color of the light-emitting element can be red, green, blue, cyan, magenta, yellow, white, or the like depending on the material that constitutes the EL layer 786. Furthermore, the color purity can be further increased when the light-emitting element has a microcavity structure.

The light-emitting element that emits white light preferably contains two or more kinds of light-emitting substances in the light-emitting layer. To obtain white light emission, two or more light-emitting substances are selected such that their emission colors are complementary colors. For example, when the emission color of a first light-emitting layer and the emission color of a second light-emitting layer have a relationship of complementary colors, it is possible to obtain a light-emitting element which emits white light as a whole. The same applies to a light-emitting element including three or more light-emitting layers.

The light-emitting layer preferably contains two or more kinds of light-emitting substances that emit light of R (red), G (green), B (blue), Y (yellow), O (orange), and the like.

This embodiment can be combined with the other embodiments as appropriate.

Embodiment 5

In this embodiment, a metal oxide that can be used in the OS transistor described in the above embodiment is described.

A metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

In addition, the metal oxide can be formed by a sputtering method, a CVD method such as an MOCVD method, an ALD method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that the crystal structure of a film or a substrate can be evaluated with an X-ray diffraction (XRD) spectrum. For example, evaluation is possible using an XRD spectrum that is obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The bilaterally asymmetrical peak of the XRD spectrum clearly shows the existence of crystal in the film or the substrate. In other words, the crystal structure of the film or the substrate cannot be regarded as an amorphous state unless it has a bilaterally symmetrical peak in the XRD spectrum.

In addition, the crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductor include a polycrystalline oxide semiconductor, an amorphous-like oxide semiconductor (a-like OS), an amorphous oxide semiconductor, and the like.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having a periodic atomic arrangement. Note that when an atomic arrangement is regarded as a lattice arrangement, the crystal region also refers to a region with a uniform lattice arrangement. Furthermore, the CAAC-OS has a region where a plurality of crystal regions are connected in an a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In addition, in an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter an In layer) and a layer containing the element M, zinc (Zn), and oxygen (hereinafter an (M,Zn) layer) are stacked. Note that indium and the element M can be replaced with each other. Therefore, indium is sometimes contained in the (M,Zn) layer. Furthermore, the element M is sometimes contained in the In layer. Note that Zn is sometimes contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 20 of 31° or around 31°. Note that the position of the peak indicating c-axis alignment (the value of 20) might fluctuate depending on the kind, composition, and the like of the metal element contained in the CAAC-OS.

In addition, for example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear crystal grain boundary (also referred to as grain boundary) cannot be observed even in the vicinity of the distortion in the CAAC-OS. That is, it is found that formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, it can be said that a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor with some analysis methods in some cases. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be rephrased as a region containing In as its main component. Furthermore, the second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Furthermore, in the case where the CAC-OS is formed by a sputtering method, any one or more selected from an inert gas (typically, argon), an oxygen gas, and a nitrogen gas is used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide as a cloud, high field-effect mobility (u) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

In addition, a transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor. In addition, a highly purified intrinsic or substantially highly purified intrinsic oxide semiconductor film has a low density of defect states and accordingly has a low density of trap states in some cases In addition, electric charge captured by the trap states in an oxide semiconductor takes a long time to disappear and might behave like fixed electric charge. Thus, a transistor whose channel formation region is formed in an oxide semiconductor having a high density of trap states has unstable electrical characteristics in some cases.

Accordingly, in order to obtain stable electrical characteristics of a transistor, reducing impurity concentration in an oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.

<Impurities>

Here, the influence of each impurity in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen is bonded to oxygen bonded to a metal atom and generates an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

At least part of this embodiment can be implemented in combination with the other embodiments described in this specification as appropriate.

Embodiment 6

In this embodiment, electronic devices of one embodiment of the present invention is described.

An electronic device in this embodiment includes the display device of one embodiment of the present invention. For the display device of one embodiment of the present invention, increases in resolution, definition, and sizes are easily achieved. Thus, the display device of one embodiment of the present invention can be used for display portions of a variety of electronic devices.

The display device of one embodiment of the present invention can be manufactured at low cost, which leads to a reduction in manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer, digital signage, and a large game machine such as a pachinko machine.

In particular, the display device of one embodiment of the present invention can have a high resolution, and thus can be suitably used for an electronic device having a relatively small display portion. Examples of such an electronic device include information terminals (wearable devices) such as watch-type and bracelet-type information terminals and wearable devices capable of being worn on a head, such as a VR device like a head-mounted display and a glasses-type AR device. Examples of wearable devices include a device for SR and a device for MR.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680× 4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high resolution and high definition, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes the antenna and a secondary battery, the antenna may be used for contactless power transmission The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 30A:
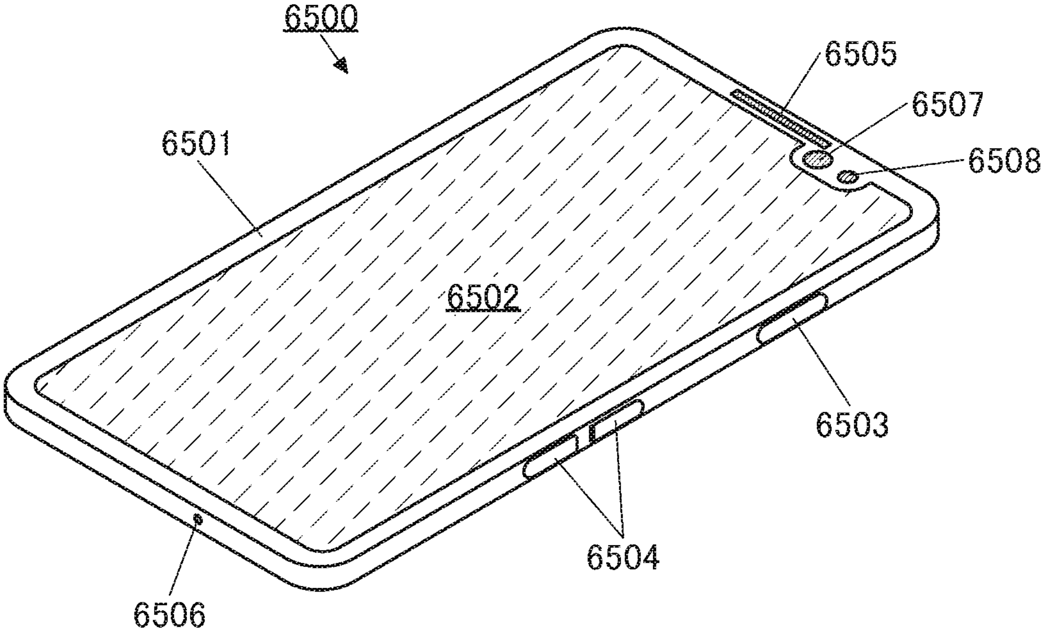
FIG. 30A and FIG. 30B are diagrams illustrating an example of an electronic device.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 30B:
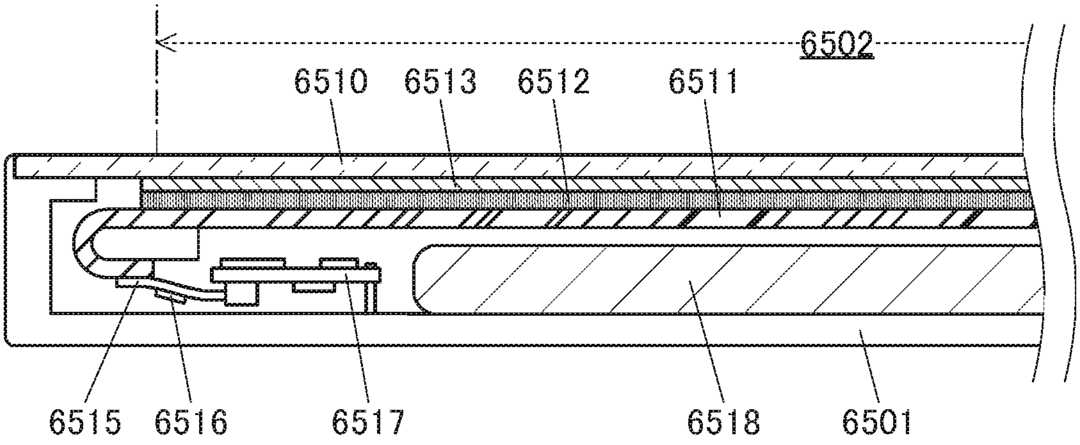

FIG. 30B is a cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display device having flexibility) of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. An electronic device with a narrow frame can be obtained when part of the display panel 6511 is folded back so that the portion connected to the FPC 6515 is positioned on the rear side of a pixel portion.

Figure 31A:
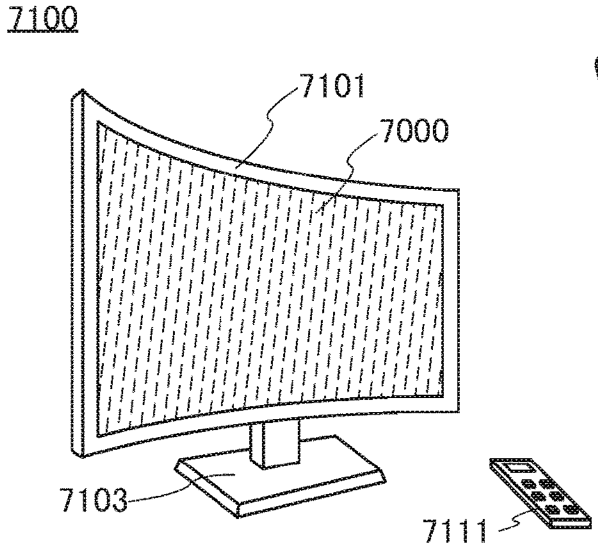
FIG. 31A to FIG. 31D are diagrams each illustrating an example of an electronic device.

FIG. 31A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 31A can be performed with an operation switch provided in the housing 7101 and a separate remote controller 7111. Alternatively, the display portion 7000 may include a touch sensor, and the television device 7100 may be operated by a touch on the display portion 7000 with a finger, for example. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 31B:
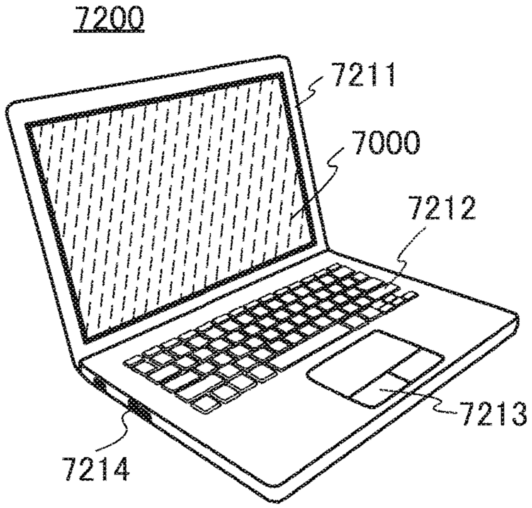

FIG. 31B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 31C:
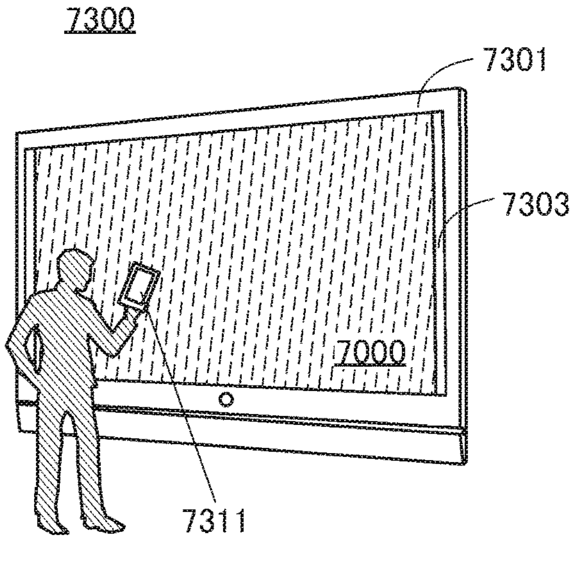
Figure 31D:
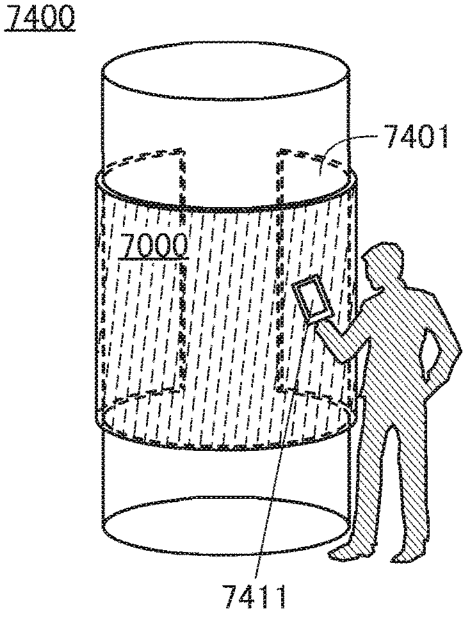

FIG. 31C and FIG. 31D illustrate examples of digital signage.

Digital signage 7300 illustrated in FIG. 31C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 31D illustrates digital signage 7400 mounted on a cylindrical pillar 7401. The digital signage 7400 includes the display portion 7000 provided along a curved surface of the pillar 7401.

The display device of one embodiment of the present invention can be used in the display portion 7000 in each of FIG. 31C and FIG. 31D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 31C and FIG. 31D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 32A:
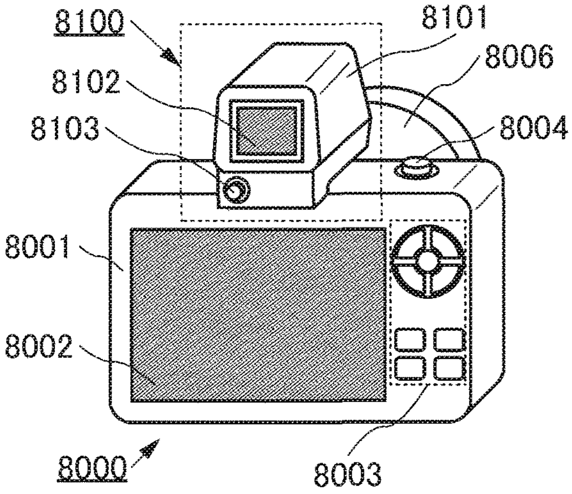
FIG. 32A to FIG. 32F are diagrams each illustrating an example of an electronic device.

FIG. 32A is an external view of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 functions as a power button, for example.

The display device of one embodiment of the present invention can be used in the display portion 8002 of the camera 8000 and the display portion 8102 of the finder 8100. Note that a finder may be incorporated in the camera 8000.

Figure 32B:
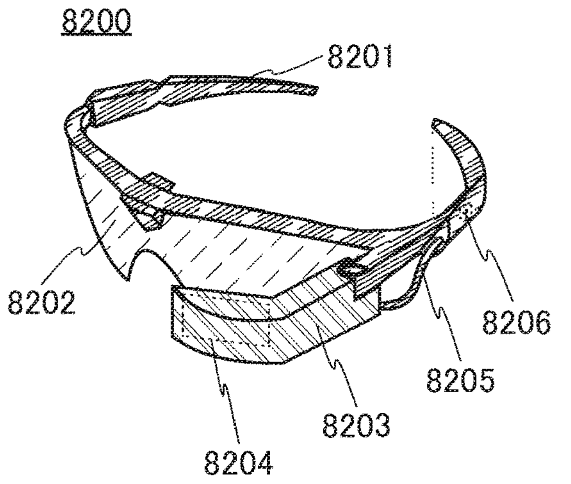

FIG. 32B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and information on the movement of the user's eyeball and eyelid can be used as an input means.

The mounting portion 8201 can be provided with a plurality of electrodes capable of sensing current flowing in response to the movement of the user's eyeball in a position in contact with the user. Thus, the head-mounted display 8200 can have a function of recognizing the user's sight line. The head-mounted display 8200 may have a function of monitoring the user's pulse using a current flowing through the electrodes. In addition, the mounting portion 8201 may be provided with a variety of sensors such as a temperature sensor, a pressure sensor, an acceleration sensor, or the like. Moreover, the head-mounted display 8200 may have a function of displaying the user's biological information on the display portion 8204, a function of changing a moving image displayed on the display portion 8204 in accordance with the movement of the user's head, or the like.

The display device of one embodiment of the present invention can be used in the display portion 8204.

Figure 32C:
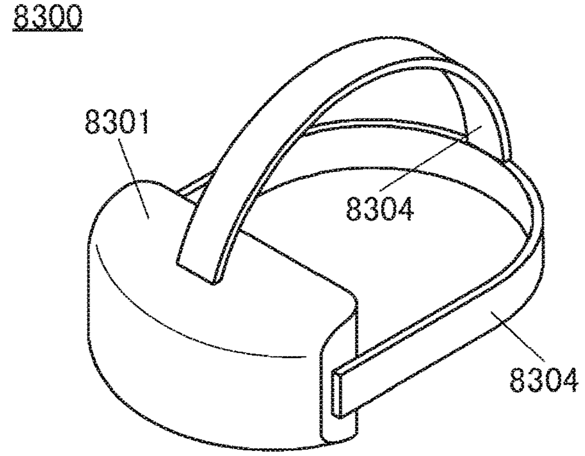
Figure 32D:
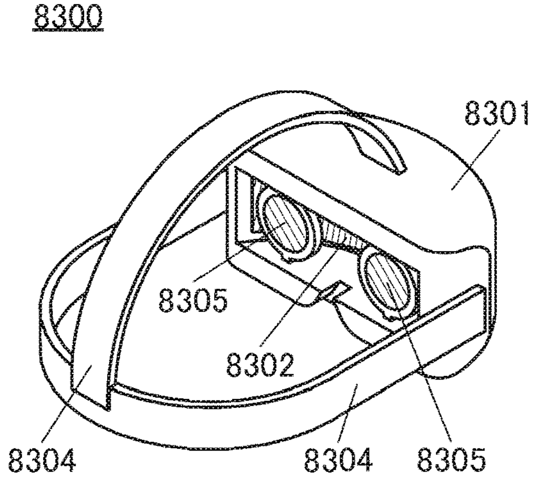
Figure 32E:
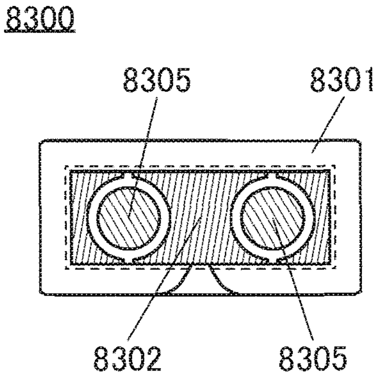

FIG. 32C to FIG. 32E are external views of a head-mounted display 8300. The head-mounted display 8300 includes a housing 8301, a display portion 8302, a band-like fixing member 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the structure is not limited to the structure in which one display portion 8302 is provided; two display portions 8302 may be provided and one display portion may be provided per eye of the user The display device of one embodiment of the present invention can be used for the display portion 8302. The display device of one embodiment of the present invention can achieve extremely high resolution. For example, a pixel is not easily seen by the user even when the user sees display that is magnified by the use of the lenses 8305 as illustrated in FIG. 32E. In other words, a video with a strong sense of reality can be seen by the user with use of the display portion 8302.

Figure 32F:
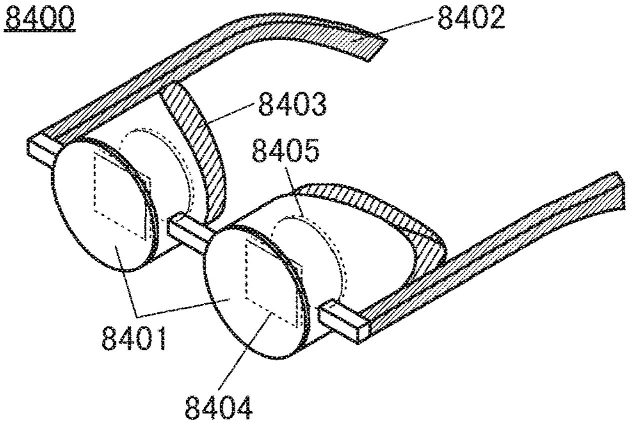

FIG. 32F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The members in contact with user's skin, such as the cushion 8403 and the mounting portion 8402, are preferably detachable because cleaning or replacement can be easily performed.

The electronic devices illustrated in FIG. 33A to FIG. 33F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 33A to FIG. 33F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, and the like.

The display device of one embodiment of the present invention can be used in the display portion 9001.

The electronic devices illustrated in FIG. 33A to FIG. 33F will be described in detail below.

Figure 33A:
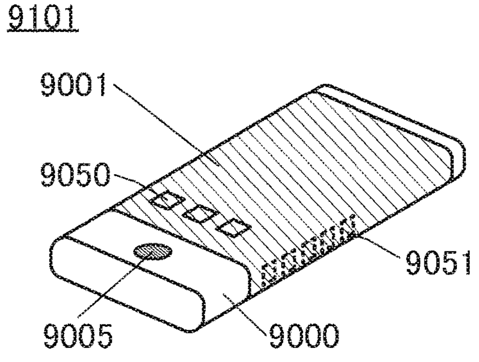
FIG. 33A to FIG. 33F are diagrams illustrating examples of electronic devices.

FIG. 33A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display characters and image information on its plurality of surfaces. FIG. 33A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, for example, the icon 9050 may be displayed at the position where the information 9051 is displayed.

Figure 33B:
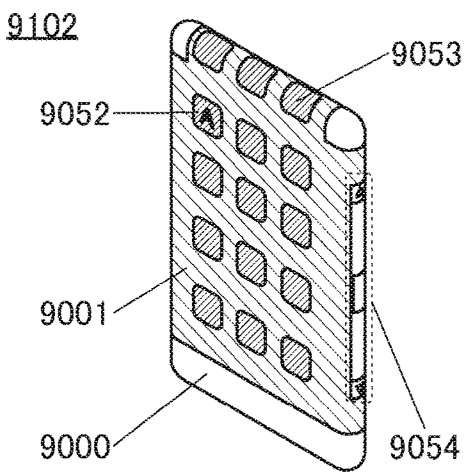

FIG. 33B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

Figure 33C:
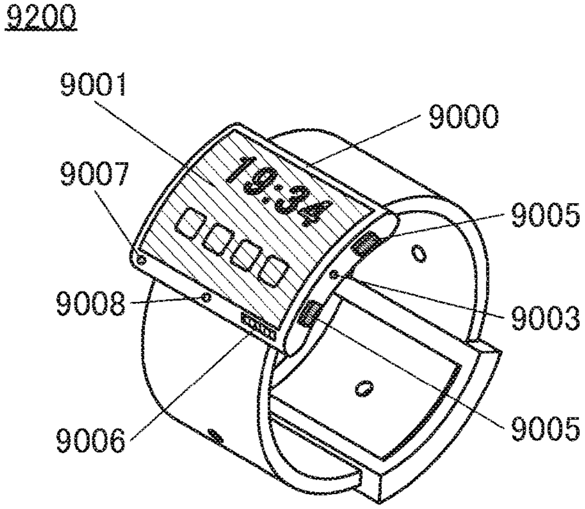

FIG. 33C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 33D:
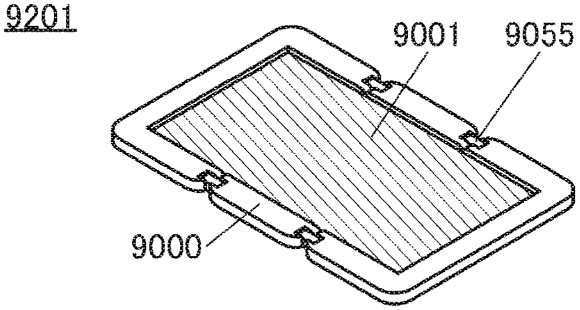
Figure 33E:
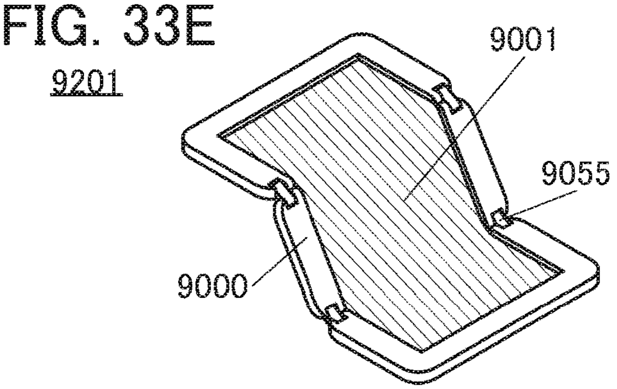
Figure 33F:
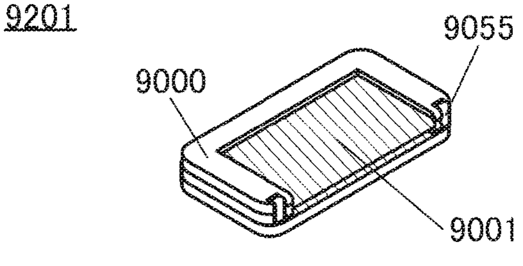

FIG. 33D to FIG. 33F are perspective views illustrating a foldable portable information terminal 9201. FIG. 33D is a perspective view of an opened state of the portable information terminal 9201, FIG. 33F is a perspective view of a folded state thereof, and FIG. 33E is a perspective view of a state in the middle of change from one of FIG. 33D and FIG. 33F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like illustrated in this embodiment can be combined with the other structure examples, the other drawings, and the like as appropriate.

Example

In this example, evaluation results of fabricated samples including light-emitting elements will be described.

Figure 34A:
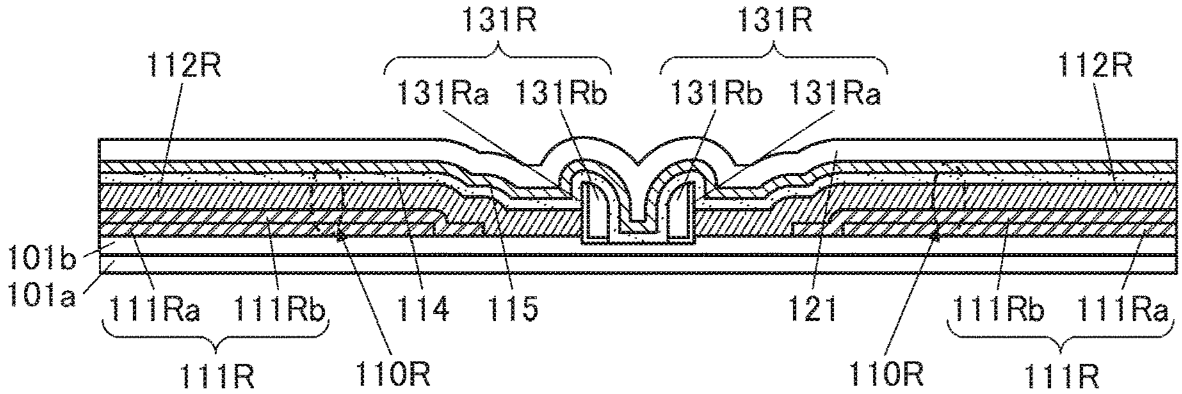
FIG. 34A to FIG. 34C are cross-sectional views illustrating structures of samples of an example.
Figure 34B:
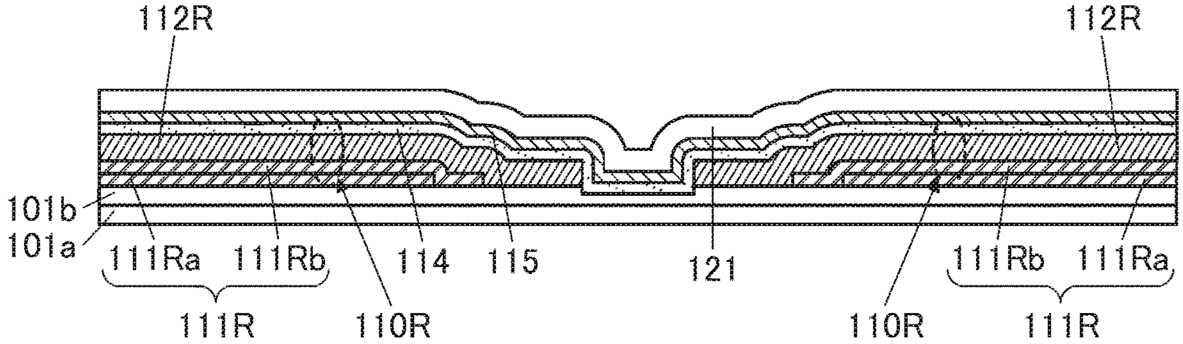
Figure 34C:
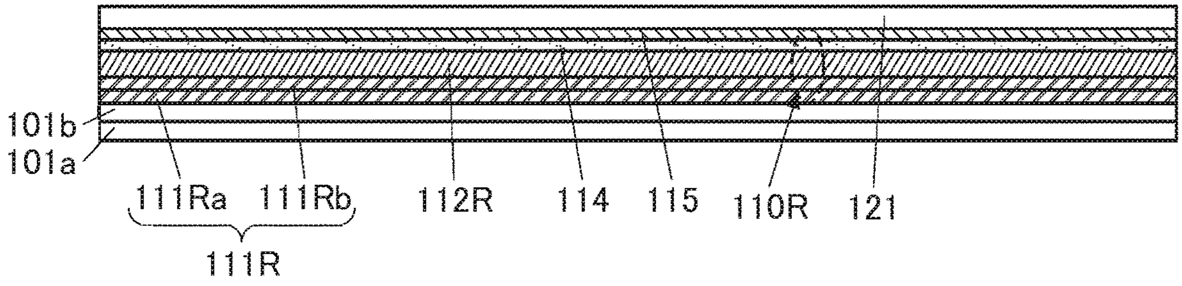

FIG. 34A, FIG. 34B, and FIG. 34C are cross-sectional views illustrating the structures of the samples fabricated in this example. A sample 200A illustrated in FIG. 34A includes an insulating layer 101*a*, an insulating layer 101*b* over the insulating layer 101*a*, the light-emitting element 110R over the insulating layer 101*b*, and the protective layer 121 over the light-emitting element 110R.

The light-emitting element 110R includes a pixel electrode 111Ra over the insulating layer 101*b*, a pixel electrode 111Rb over the pixel electrode 111Ra and over the insulating layer 101*b*, and the EL layer 112R over the pixel electrode 111Rb and over the insulating layer 101*b*. In addition, the sample 200A includes the protective layer 131Ra that includes a region in contact with the side surface of the EL layer 112R and is over the insulating layer 101*b*, and the protective layer 131Rb over the protective layer 131Ra. Furthermore, the sample 200A includes the common layer 114 over the EL layer 112R, over the protective layer 131Ra, over the protective layer 131Rb, and over the insulating layer 101*b*, and the common electrode 115 over the common layer 114. The protective layer 121 is provided over the common electrode 115. Here, the pixel electrode 111R described in Embodiment 1 and the like is formed of the pixel electrode 111Ra and the pixel electrode 111Rb, and the protective layer 131R described in Embodiment 1 and the like is formed of the protective layer 131Ra and the protective layer 131Rb.

A sample 200B illustrated in FIG. 34B differs from the sample 200A in not including the protective layer 131Ra or the protective layer 131Rb. In the sample 200B, the side surface of the EL layer 112R is in contact with the common layer 114.

A sample 200C illustrated in FIG. 34C includes the insulating layer 101*a*, the insulating layer 101*b* over the insulating layer 101*a*, the pixel electrode 111Ra over the insulating layer 101*b*, the pixel electrode 111Rb over the pixel electrode 111Ra, the EL layer 112R over the pixel electrode 111Rb, the common layer 114 over the EL layer 112R, the common electrode 115 over the common layer 114, and the protective layer 121 over the common electrode 115. The sample 200C differs from the sample 200B in that patterning is not performed.

Figure 34D:
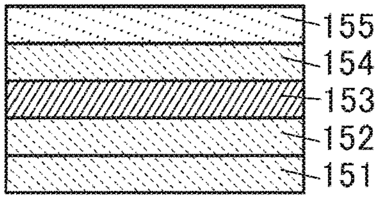
FIG. 34D is a diagram illustrating the structure of an EL layer.

FIG. 34D is a diagram illustrating the structure of the EL layer 112R. The EL layer 112 includes a hole-injection layer 151, a hole-transport layer 152 over the hole-injection layer 151, a light-emitting layer 153 over the hole-transport layer 152, a hole-blocking layer 154 over the light-emitting layer 153, and an electron-transport layer 155 over the hole-blocking layer 154. Here, the light-emitting layer 153 has a function of emitting red light.

FIG. 35A to FIG. 35E and FIG. 36A to FIG. 36D are cross-sectional views in processes of a method for fabricating the sample 200A in this example.

For fabrication of the sample 200A, first, a resin layer was formed as the insulating layer 101*a* over a substrate (not illustrated) by a spin coating method. Next, a silicon nitride layer was formed as the insulating layer 101*b* over the insulating layer 101*a* by a CVD method.

Then, an alloy film of silver, palladium, and copper was deposited as a conductive film to be the pixel electrode

111Ra later over the insulating layer 101*b* so as to have a thickness of 100 nm by a sputtering method. After that, a part of the conductive film was removed by wet etching, whereby the pixel electrode 111Ra was formed.

Figure 35A:
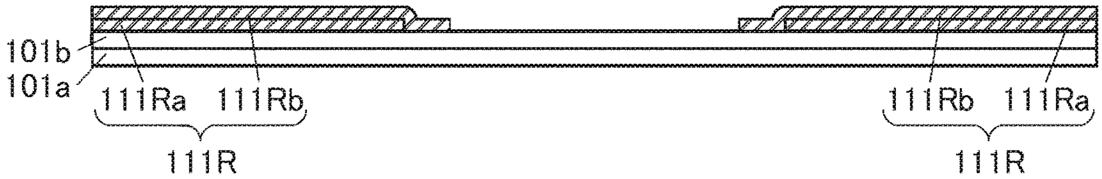
FIG. 35A to FIG. 35E are cross-sectional views illustrating a method for fabricating a sample of an example.

Then, an indium tin oxide film containing silicon was deposited as a conductive film to be the pixel electrode 111Rb later over the pixel electrode 111Ra and over the insulating layer 101*b* by a sputtering method so as to have a thickness of 100 nm. After that, a part of the conductive film was removed by wet etching, whereby the pixel electrode 111Rb was formed (FIG. 35A).

Subsequently, the EL film 112Rf to be the EL layer 112R later was formed over the pixel electrode 111Rb and over the insulating layer 101*b* by an evaporation method. Here, the structure of the EL film 112Rf is as illustrated in FIG. 34D; the EL film 112Rf was formed such that the thickness of the hole-injection layer 151 was 11.4 nm, the thickness of the hole-transport layer 152 was 57.5 nm, the thickness of the light-emitting layer 153 was 74.4 nm, the thickness of the hole-blocking layer 154 was 10 nm, and the thickness of the electron-transport layer 155 was nm.

Then, an aluminum oxide film was deposited as the sacrificial film 144Ra to be the sacrificial layer 145Ra later over the EL film 112Rf by an ALD method so as to have a thickness of 30 nm. After that, an indium tin oxide film was deposited as the sacrificial film 144Rb to be the sacrificial layer 145Rb later over the sacrificial film 144Ra by a sputtering method so as to have a thickness of 50 nm.

Figure 35B:
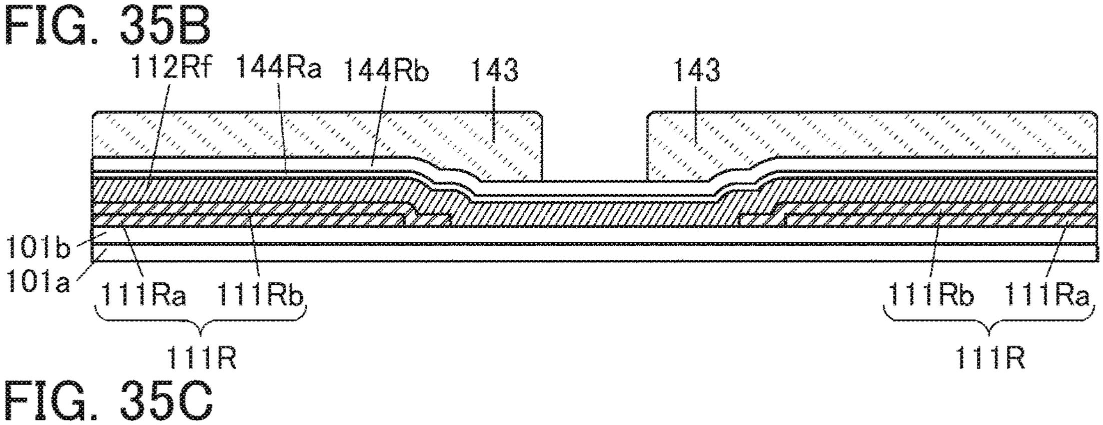

Next, a resist was applied over the sacrificial film 144Rb, and light exposure and development were performed, whereby a resist mask 143 was formed (FIG. 35B).

Figure 35C:
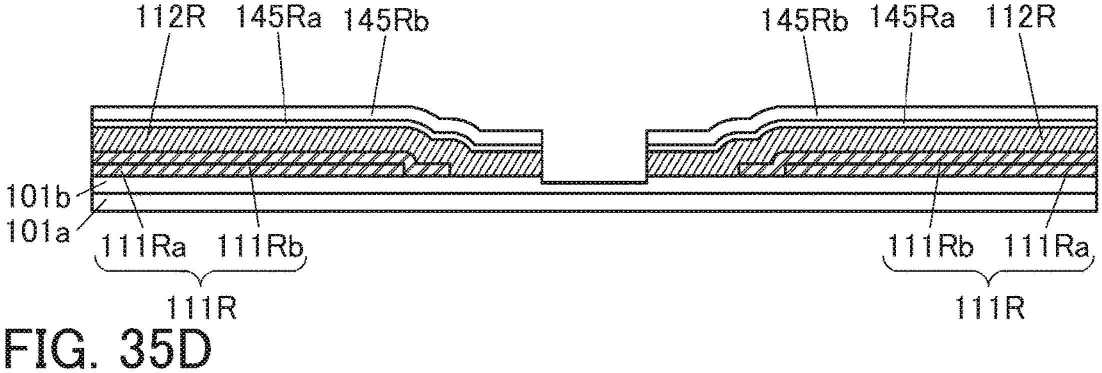

Then, parts of the sacrificial film 144Rb, the sacrificial film 144Ra, and the EL film 112Rf, which were not covered with the resist mask 143, were removed by dry etching, whereby the sacrificial layer 145Rb, the sacrificial layer 145Ra, and the EL layer 112R were formed. In addition, the resist mask 143 was removed (FIG. 35C).

Figure 35D:
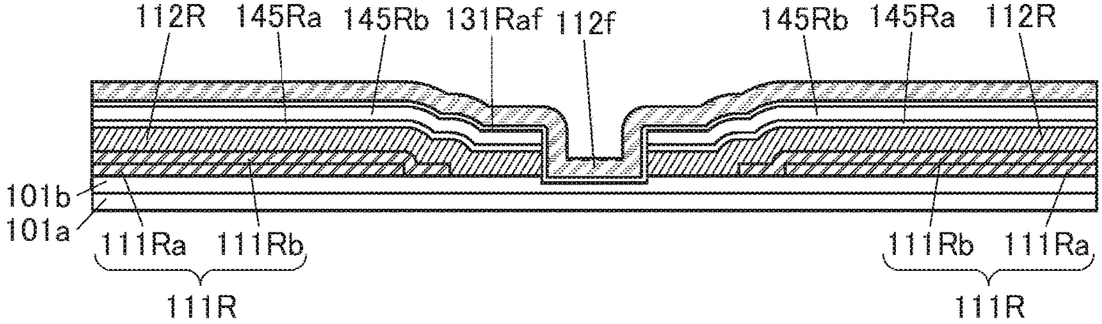

Then, an aluminum oxide film was deposited as the protective film 131Raf to be the protective layer 131Ra later over the sacrificial layer 145Rb and over the insulating layer 101*b* by an ALD method so as to have a thickness of 15 nm. After that, an EL film 112*f* was formed over the protective film 131Raf by an evaporation method (FIG. 35D).

Figure 35E:
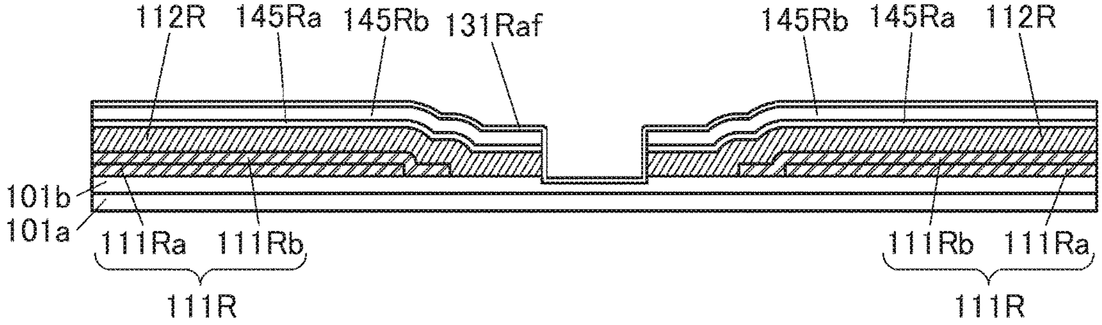
Figure 36A:
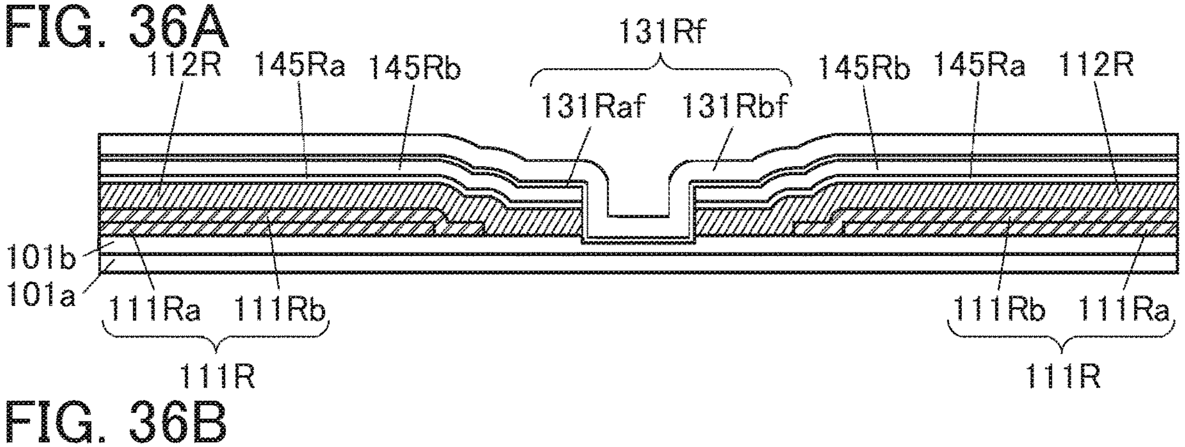
FIG. 36A to FIG. 36D are cross-sectional views illustrating a method for fabricating a sample of an example.

Subsequently, the EL film 112*f* was removed by dry etching (FIG. 35E). After that, a silicon nitride film was formed as the protective film 131Rbf to be the protective layer 131Rb later over the protective film 131Raf by a sputtering method so as to have a thickness of 90 nm (FIG. 36A).

Figure 36B:
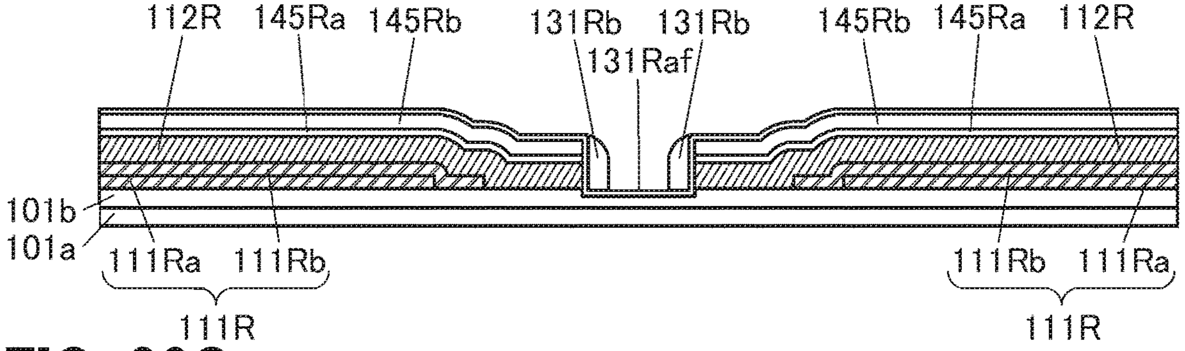
Figure 36C:
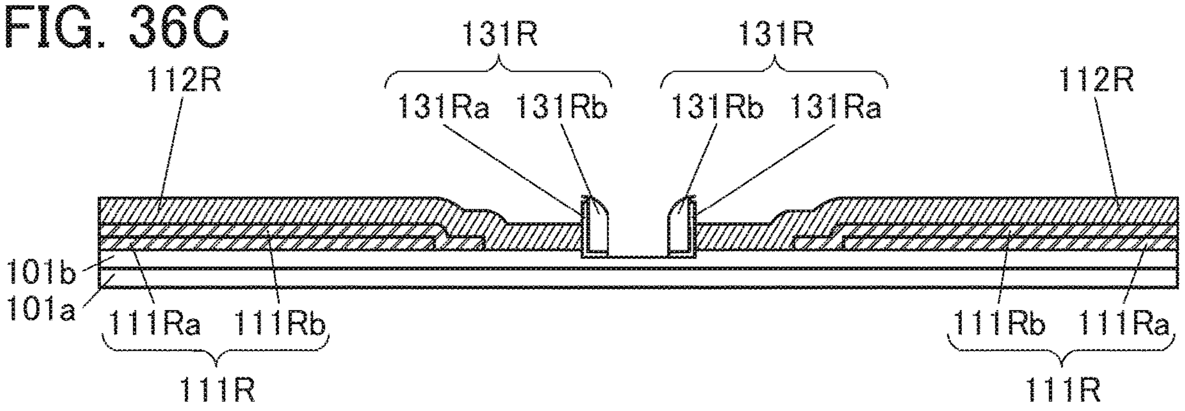

Then, the protective film 131Rbf was processed by dry etching to form the protective layer 131Rb (FIG. 36B). Next, the protective film 131Raf was processed by dry etching to form the protective layer 131Ra. After that, the sacrificial layer 145Rb and the sacrificial layer 145Ra were removed by wet etching (FIG. 36C).

Next, a lithium fluoride film was formed as the common layer 114 over the EL layer 112R, over the protective layer 131Ra, over the protective layer 131Rb, and over the insulating layer 101*b* by an evaporation method so as to have a thickness of 1 nm, and then a ytterbium film was formed over the lithium fluoride film by an evaporation method so as to have a thickness of 1 nm. In other words, the common layer 114 was made to have a stacked-layer structure of the lithium fluoride film and the ytterbium film.

Then, an alloy film with a ratio of silver to magnesium being 10:1 was formed as the common electrode 115 over the common layer 114 by an evaporation method so as to have a thickness of 15 nm. In that manner, the light-emitting element 110R was formed.

Figure 36D:
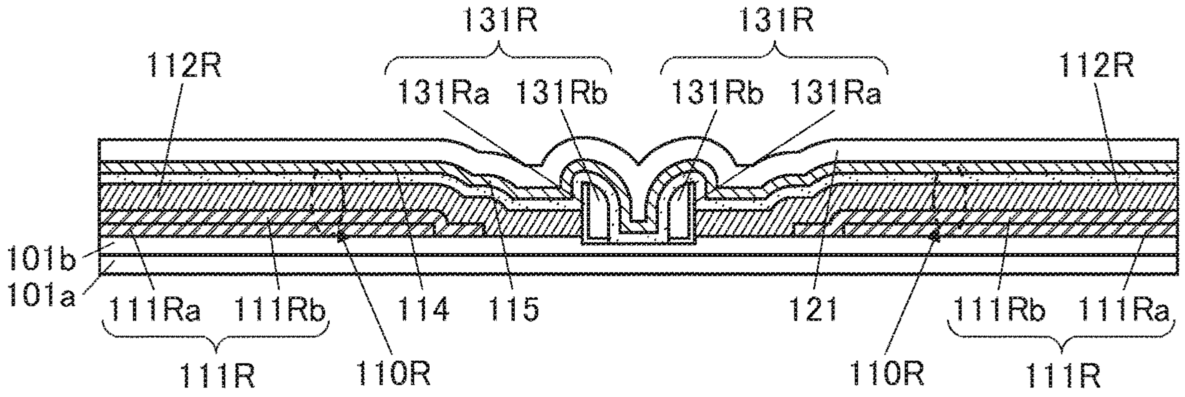

Subsequently, an indium gallium zinc oxide film was formed as the protective layer 121 over the common electrode 115 by a sputtering method so as to have a thickness of 70 nm (FIG. 36D). By the above-described method, the sample 200A was fabricated.

FIG. 37A to FIG. 37E are cross-sectional views in processes of a method for fabricating the sample 200B in this example.

Figure 37A:
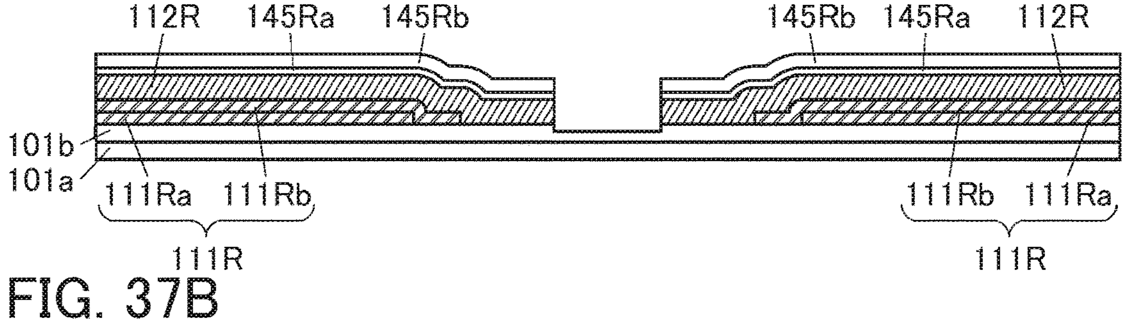
FIG. 37A to FIG. 37E are cross-sectional views illustrating a method for fabricating a sample of an example.
Figure 37B:
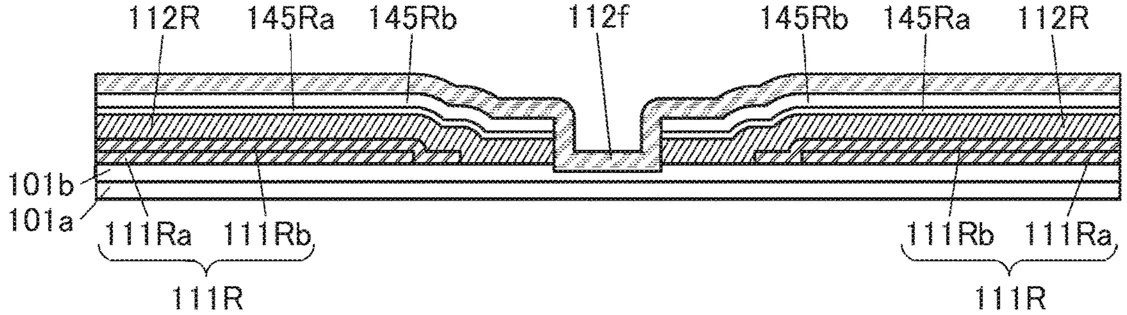

For fabrication of the sample 200B, first, the same processes as the processes illustrated in FIG. 35A, FIG. 35B, and FIG. 35C in the fabrication of the sample 200A were performed (FIG. 37A). Next, the EL film 112*f* was formed over the sacrificial layer 145Rb and over the insulating layer 101*b* by an evaporation method (see FIG. 37B). That is, unlike in the sample 200A, formation of the protective film 131Raf was not performed.

Figure 37C:
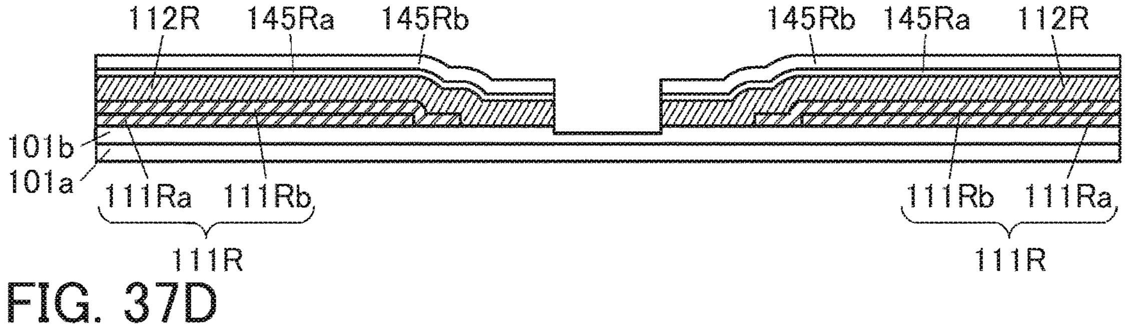
Figure 37D:
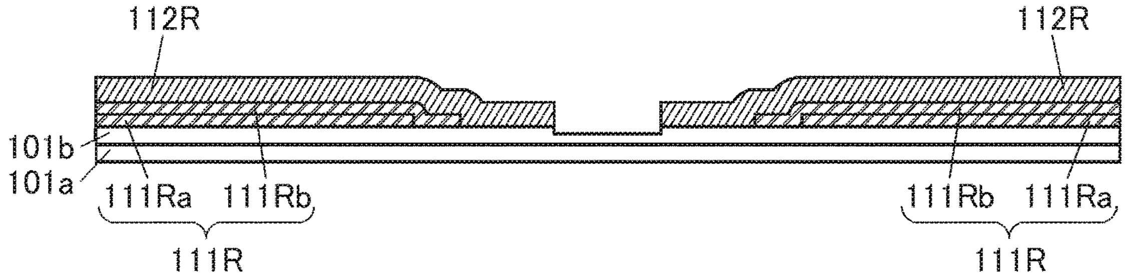

Then, the EL film 112*f* was removed by dry etching (FIG. 37C). After that, the sacrificial layer 145Rb and the sacrificial layer 145Ra were removed (FIG. 37D). That is, unlike in the sample 200A, formation of the protective film 131Rbf was not performed.

Figure 37E:
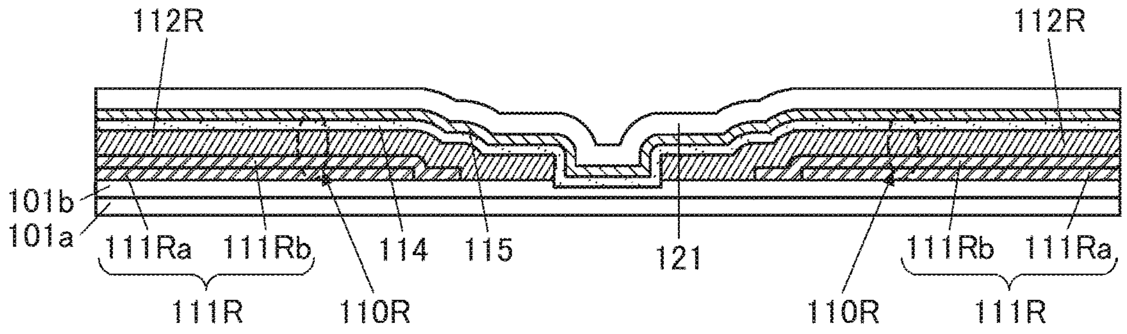

After that, as in the sample 200A, the common layer 114, the common electrode 115, and the protective layer 121 were formed (FIG. 37E). By the above-described method, the sample 200B was fabricated.

For fabrication of the sample 200C, first, a resin layer was formed as the insulating layer 101*a* over a substrate (not illustrated) by a spin coating method. Next, a silicon nitride layer was formed as the insulating layer 101*b* over the insulating layer 101*a* by a CVD method.

Then, an alloy film of silver, palladium, and copper was deposited as the pixel electrode 111Ra over the insulating layer 101*b* so as to have a thickness of 100 nm. After that, an indium tin oxide film containing silicon was deposited as the pixel electrode 111Rb over the pixel electrode 111Ra by a sputtering method so as to have a thickness of 100 nm.

Subsequently, the EL layer 112R was formed over the pixel electrode 111Rb by an evaporation method. The structure of the EL layer 112R is as illustrated in FIG. 34D; the thicknesses of the hole-injection layer 151, the hole-transport layer 152, the light-emitting layer 153, the hole-blocking layer 154, and the electron-transport layer 155 were the same as those of the sample 200A and the sample 200B.

After that, as in the sample 200A and the sample 200B, the common layer 114, the common electrode 115, and the protective layer 121 were formed. By the above-described method, the sample 200C was fabricated. As described above, formation of sacrificial layers and patterning of an EL film by an etching method were not performed in the fabrication of the sample 200C. That is, the fabrication of the sample 200C was performed consistently in vacuum.

Figure 38:
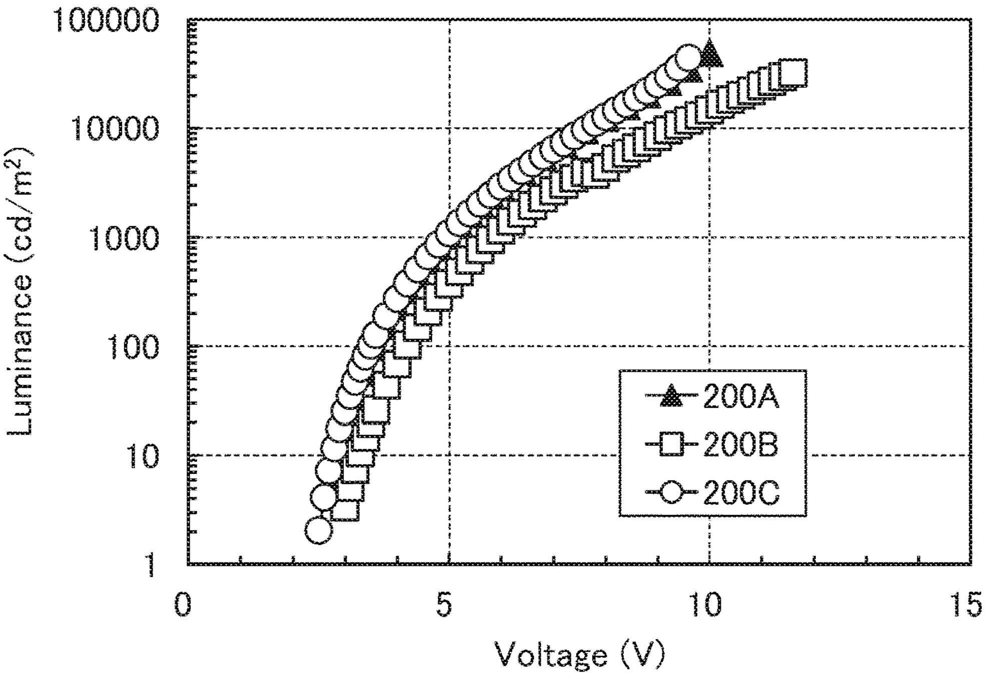
FIG. 38 is a graph showing luminance-voltage characteristics of samples of an example.
Figure 39:
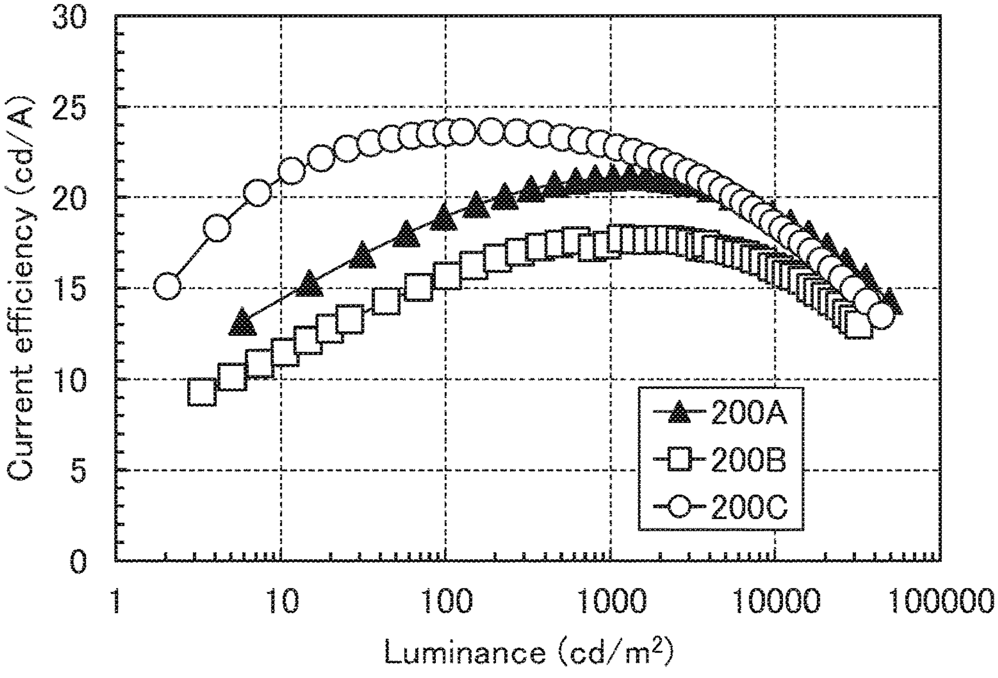
FIG. 39 is a graph showing current efficiency-luminance characteristics of samples of an example.

FIG. 38 is a graph showing luminance-voltage characteristics of the sample 200A, the sample 200B, and the sample 200C. FIG. 39 is a graph showing current efficiency-luminance characteristics of the sample 200A, the sample 200B, and the sample 200C. Table 1 shows characteristics of the light-emitting elements 110R of the case where the emission luminances in the sample 200A, the sample 200B, and the sample 200C are each around 1000 $cd/m^2$.

TABLE 1

| Sample | Voltage (V) | Current density ($mA/cm^2$) | Chromaticity (x, y) | Current efficiency (cd/A) |
|---|---|---|---|---|
| 200A | 5 | 4.9 | (0.70, 0.30) | 21 |
| 200B | 5.8 | 5.5 | (0.70, 0.30) | 17 |
| 200C | 5 | 4.8 | (0.70, 0.30) | 23 |

As shown in the results of FIG. 38, the sample 200B needed a higher voltage than the sample 200A and the sample 200C in order to obtain the same luminance. Meanwhile, there was little difference between the luminance-voltage characteristics of the sample 200A and the luminance-voltage characteristics of the sample 200C. In other words, although the processing of the EL film 112Rf by dry etching was performed in the sample 200A, the luminance-voltage characteristics of the sample 200A were equivalent to those of the sample 200C fabricated consistently in vacuum.

Furthermore, as shown in FIG. 39, the sample 200A and the sample 200B, in which processing of the EL film 112Rf by dry etching was performed, had lower current efficiency on a low luminance side than the sample 200C fabricated consistently in vacuum. However, it was found that a reduction in the current efficiency was inhibited in the sample 200A as compared with that in the sample 200B.

Here, the sample 200A differs from the sample 200B in that, for example, the protective film 131Raf covering the side surface of the EL layer 112R is provided as illustrated in FIG. 35C before the deposition of the EL film 112*f* and the removal by dry etching illustrated in FIG. 35D and FIG. 35E. It is suggested that a reduction in characteristics of the light-emitting element 110R due to the deposition of the EL film 112*f* and the removal by dry etching can be inhibited by providing the protective film 131Raf.

Figure 40:
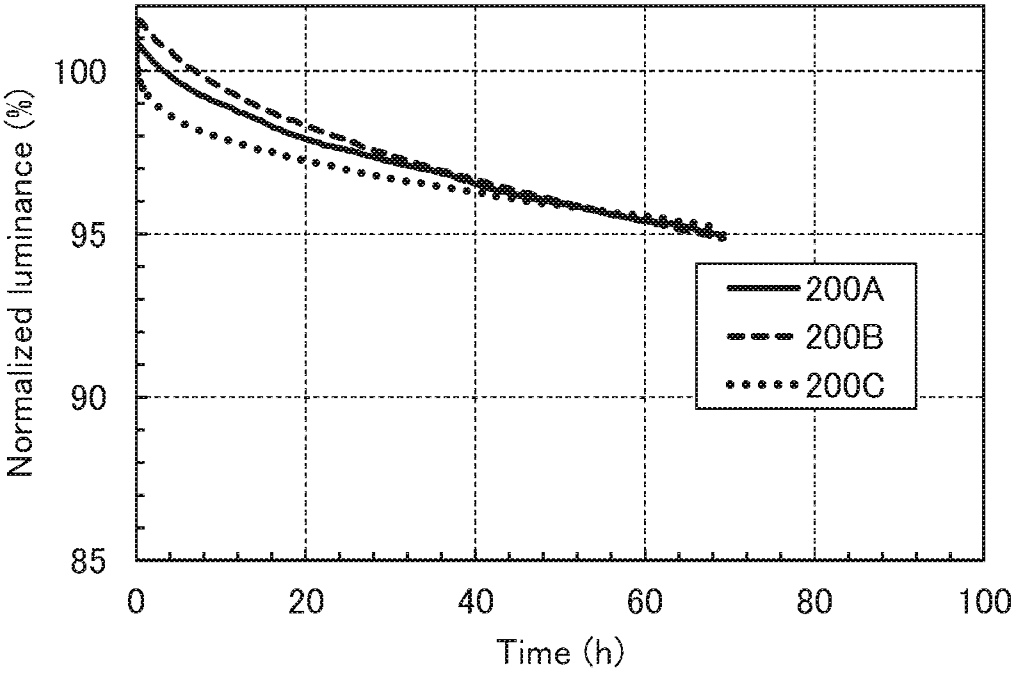
FIG. 40 is a graph showing changes over time in normalized luminances of samples of an example.

FIG. 40 is a graph showing changes over time in normalized luminances of the sample 200A, the sample 200B, and the sample 200C. In FIG. 40, the normalized luminances are relative luminances with reference to the luminance of the light-emitting element 110R at a time 0, i.e., the start of luminance measurement. The normalized luminances shown in FIG. 40 were obtained by constant current measurement at room temperature, in which the intrinsic luminance of the light-emitting element 110R was set to 7900 $cd/m^2$. Here, a graph showing a change over time in normalized luminance is referred to as a reliability curve.

As shown in FIG. 40, there was found to be no big difference among the slope of the reliability curve of the sample 200A, the slope of the reliability curve of the sample 200B, and the slope of the reliability curve of the sample 200C. Accordingly, it was confirmed that there was no big difference among the reliability of the sample 200A, the reliability of the sample 200B, and the reliability of the sample 200C.

As described above, even with the processing of the EL film by dry etching, the provision of the protective layer 131Ra and the protective layer 131Rb made it possible to fabricate a light-emitting element that had a driving voltage and reliability equivalent to those of a light-emitting device fabricated consistently in vacuum and exhibited a small reduction in current efficiency, as compared with the case of not providing the protective layer 131Ra or the protective layer 131Rb.

REFERENCE NUMERALS

100: display device, 100A: display device, 100B: display device, 100C: display device, 100D: display device, 100E: display device, 100F: display device, 101: layer, 101*a*: insulating layer, 101*b*: insulating layer, 103: pixel, 103*a*: subpixel, 103*b*: subpixel, 103*c*: subpixel, 110: light-emitting element, 110B: light-emitting element, 110G: light-emitting element, 110R: light-emitting element, 111: pixel electrode, 111B: pixel electrode, 111C: connection electrode, 111G: pixel electrode, 111R: pixel electrode, 111Ra: pixel electrode, 111Rb: pixel electrode, 112: EL layer, 112B: EL layer, 112Bf: EL film, 112*f*: EL film, 112G: EL layer, 112Gf: EL film, 112R: EL layer, 112Rf: EL film, 114: common layer, 115: common electrode, 121: protective layer, 124*a*: pixel, 124*b*: pixel, 130: region, 131: protective layer, 131*a*: protective layer, 131*b*: protective layer, 131B: protective layer, 131Ba: protective layer, 131Baf: protective film, 131Bb: protective layer, 131Bbf: protective film, 131Bf: protective film, 131G: protective layer, 131Ga: protective layer, 131Gaf: protective film, 131Gb: protective layer, 131Gbf: protective film, 131Gf: protective film, 131R: protective layer, 131Ra: protective layer, 131Raf: protective film, 131Rb: protective layer, 131Rbf: protective film, 131Rf: protective film, 132: insulating layer, 132*f*: insulating film, 133: protective layer, 133*f*: protective film, 143: resist mask, 143*a*: resist mask, 143*b*: resist mask, 143*c*: resist mask, 144Ba: sacrificial film, 144Bb: sacrificial film, 144Ga: sacrificial film, 144Gb: sacrificial film, 144Ra: sacrificial film, 144Rb: sacrificial film, 145: sacrificial layer, 145*a*: sacrificial layer, 145*b*: sacrificial layer, 145Ba: sacrificial layer, 145Bb: sacrificial layer, 145G: sacrificial layer, 145Ga: sacrificial layer, 145Gb: sacrificial layer, 145R: sacrificial layer, 145Ra: sacrificial layer, 145Rb: sacrificial layer, 151: hole-injection layer, 152: hole-transport layer, 153: light-emitting layer, 154: hole-blocking layer, 155: electron-transport layer, 160*a*: region, 160*b*: region, 200A: sample, 200B: sample, 200C: sample, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 231*n*: low-resistance region, 240: capacitor, 241: conductive layer, 242: connection layer, 243: insulating layer, 245: conductive layer, 251: conductive layer, 252: conductive layer, 253: insulating layer, 254: insulating layer, 255: insulating layer, 256: plug, 261: insulating layer, 262: insulating layer, 263: insulating layer, 264: insulating layer, 265: insulating layer, 271: plug, 274: plug, 274*a*: conductive layer, 274*b*: conductive layer, 280: display module, 281: display portion, 282: circuit portion, 283: pixel circuit portion, 283*a*: pixel circuit, 284: pixel portion, 285: terminal portion, 286: wiring portion, 290: FPC, 291: substrate, 292: substrate, 301: substrate, 301A: substrate, 301B: substrate, 310: transistor, 310A: transistor, 310B: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 341: conductive layer, 342: conductive layer, 343: plug, 414: insulating layer, 417: light-blocking layer, 418: conductive layer, 418B: conductive layer, 418G: conductive layer, 418R: conductive layer, 419: resin layer, 420: substrate, 442: adhesive layer, 443: space, 451: substrate, 452: substrate, 461: conductive layer, 462: display portion, 464: circuit, 465: wiring, 468: conductive layer, 472: FPC, 473: IC, 772: lower electrode, 785: layer, 786: EL layer, 786*a*: EL layer,

786*b*: EL layer, 788: upper electrode, 4411: light-emitting layer, 4412: light-emitting layer, 4413: light-emitting layer, 4420: layer, 4420-1: layer, 4420-2: layer, 4430: layer, 4430-1: layer, 4430-2: layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminals

The invention claimed is:

1. A display device comprising:

a first light-emitting element, a second light-emitting element positioned to be adjacent to the first light-emitting element, a first protective layer, a second protective layer, a third protective layer, and an insulating layer, wherein the first light-emitting element comprises a first pixel electrode, a first EL layer, and a common electrode, wherein the second light-emitting element comprises a second pixel electrode, a second EL layer, and the common electrode, wherein the first EL layer is provided over the first pixel electrode, wherein the second EL layer is provided over the second pixel electrode, wherein the first protective layer comprises a region overlapping with a side surface of the first pixel electrode, a side surface of the second pixel electrode, a side surface of the first EL layer, and a side surface of the second EL layer, wherein the insulating layer is provided over the first protective layer, wherein the second protective layer is provided over the insulating layer, wherein the common electrode is provided over the first EL layer, over the second EL layer, and over the second protective layer, and wherein the third protective layer comprises a region in contact with a side surface and a bottom surface of the first protective layer.

2. The display device according to claim 1, wherein the insulating layer is provided between the first EL layer and the second EL layer.

3. The display device according to claim 1, wherein the first to third protective layers each comprise an inorganic material.

4. The display device according to claim 1, wherein the first protective layer comprises a region in contact with a side surface and a bottom surface of the insulating layer, wherein the second protective layer comprises a region in contact with a top surface of the insulating layer, and wherein the first protective layer and the second protective layer each comprise nitride.

5. The display device according to claim 1, wherein the first protective layer and the second protective layer each comprise at least one of silicon nitride, aluminum nitride, and hafnium nitride.

6. The display device according to claim 1, wherein the insulating layer comprises an organic material.

7. The display device according to claim 1, wherein a common layer is provided between the first EL layer, the second EL layer, and the second protective layer, and the common electrode, and wherein the common layer comprises at least one of a hole-injection layer, a hole-transport layer, a hole-blocking layer, an electron-blocking layer, an electron-transport layer, and an electron-injection layer.

8. The display device according to claim 1, wherein a space between the side surface of the first EL layer and the side surface of the second EL layer comprises a region of 1 μm or smaller.

9. The display device according to claim 8, wherein the space between the side surface of the first EL layer and the side surface of the second EL layer comprises a region of 100 nm or smaller.

10. A display module comprising:

the display device according to claim 1; and at least one of a connector or an integrated circuit.

11. An electronic device comprising:

the display module according to claim 10; and at least one of a battery, a camera, a speaker, and a microphone.

12. A method for manufacturing a display device, comprising:

forming a first pixel electrode and a second pixel electrode over an insulating surface;

forming a first EL film and a first sacrificial film in sequence over the first pixel electrode and over the second pixel electrode;

processing the first sacrificial film and the first EL film to form a first sacrificial layer and a first EL layer, respectively, which include a region overlapping with the first pixel electrode;

forming a first protective film covering at least a side surface of the first EL layer and a side surface and a top surface of the first sacrificial layer;

processing the first protective film to form a first protective layer comprising a region overlapping with the side surface of the first EL layer;

forming a second EL film and a second sacrificial film in sequence over the first sacrificial layer and over the second pixel electrode;

processing the second sacrificial film and the second EL film to form a second sacrificial layer and a second EL layer, respectively, which include a region overlapping with the second pixel electrode;

forming a second protective film covering at least a top surface of the first sacrificial layer, a top surface and a side surface of the second sacrificial layer, a side surface of the first protective layer, and a side surface of the second EL layer;

forming an insulating film over the second protective film;

processing the insulating film to form an insulating layer between the first EL layer and the second EL layer;

processing the second protective film to form a second protective layer between the first protective layer and the insulating layer and between the second EL layer and the insulating layer;

forming a third protective film over the first sacrificial layer, over the second sacrificial layer, and over the insulating layer;

processing the third protective film to form a third protective layer over the insulating layer;

removing the first sacrificial layer and the second sacrificial layer; and forming a common electrode over the first EL layer, over the second EL layer, and over the third protective layer.

13. The method for manufacturing a display device, according to claim 12, wherein a fourth protective film is formed after the formation of the first protective film so as to comprise a region in contact with the first protective film, and wherein a fifth protective film is formed after the formation of the second protective film so as to comprise a region in contact with the second protective film.

14. The method for manufacturing a display device, according to claim 13, wherein the first protective film and the second protective film are each formed by an ALD method, and wherein the third to fifth protective films are each formed by a sputtering method or a CVD method.

15. The method for manufacturing a display device, according to claim 13, wherein the first protective film, the second protective film, the fourth protective film, and the fifth protective film are each processed by a dry etching method.

16. The method for manufacturing a display device, according to claim 12, wherein the insulating film is formed by a spin coating method, a spraying method, a screen printing method, or a painting method.

17. The method for manufacturing a display device, according to claim 12, wherein the insulating film is processed by a photolithography method.

18. The method for manufacturing a display device, according to claim 12, wherein before the formation of the common electrode, at least one of a hole-injection layer, a hole-transport layer, a hole-blocking layer, an electron-blocking layer, an electron-transport layer, and an electron-injection layer is formed as a common layer over the first EL layer, over the second EL layer, and over the insulating layer.

* * * * *